(12) United States Patent
Harvard

(10) Patent No.: US 9,934,848 B2
(45) Date of Patent: Apr. 3, 2018

(54) METHODS FOR DETERMINING THE RESISTIVE STATES OF RESISTIVE CHANGE ELEMENTS

(71) Applicant: Nantero, Inc., Woburn, MA (US)

(72) Inventor: Qawi Harvard, Hayward, CA (US)

(73) Assignee: Nantero, Inc., Woburn, MA (US)

( * ) Notice: Subject to any disclaimer, the term of this patent is extended or adjusted under 35 U.S.C. 154(b) by 0 days.

(21) Appl. No.: 15/175,234

(22) Filed: Jun. 7, 2016

(65) Prior Publication Data
US 2017/0352415 A1 Dec. 7, 2017

(51) Int. Cl.
*G11C 13/00* (2006.01)
*H01L 51/05* (2006.01)

(52) U.S. Cl.
CPC ........ *G11C 13/0023* (2013.01); *G11C 13/004* (2013.01); *G11C 13/0007* (2013.01); *G11C 13/0069* (2013.01); *G11C 13/0097* (2013.01); *H01L 51/0558* (2013.01)

(58) Field of Classification Search
CPC .................. G11C 13/0007; G11C 13/0023
USPC ......................................................... 365/148
See application file for complete search history.

(56) References Cited

U.S. PATENT DOCUMENTS

| | | | |
|---|---|---|---|
| 6,057,637 A | 5/2000 | Zettl | |
| 6,128,214 A | 10/2000 | Kuekes et al. | |
| 6,256,767 B1 | 7/2001 | Kuekes et al. | |
| 6,277,318 B1 | 8/2001 | Bower | |
| 6,314,019 B1 | 11/2001 | Kuekes et al. | |
| 6,342,276 B1 | 1/2002 | You | |
| 6,409,567 B1 | 6/2002 | Amey, Jr. et al. | |
| 6,423,583 B1 | 7/2002 | Avouris et al. | |
| 6,445,006 B1 | 9/2002 | Brandes et al. | |

(Continued)

FOREIGN PATENT DOCUMENTS

| GB | 2364933 | 2/2002 |
|---|---|---|
| JP | 2000203821 | 7/2000 |

(Continued)

OTHER PUBLICATIONS

Ago, et al., "Workfunction of Purified and Oxidized Carbon Nanotubes," Synthetic Metals, vol. 103, 1999, pp. 2494-2495.

(Continued)

*Primary Examiner* — Huan Hoang
*Assistant Examiner* — Muna A Techane
(74) *Attorney, Agent, or Firm* — Nantero, Inc.

(57) ABSTRACT

Devices and methods for determining resistive states of resistive change elements in resistive change element arrays are disclosed. According to some aspects of the present disclosure the devices and methods for determining resistive states of resistive change elements can determine resistive states of resistive change elements by sensing current flow. According to some aspects of the present disclosure the devices and methods for determining resistive states of resistive change elements can determine resistive states of resistive change elements without the need for in situ selection devices or other current controlling devices. According to some aspects of the present disclosure the devices and methods for determining resistive states of resistive change elements can reduce the impact of sneak current when determining resistive states of resistive change elements.

20 Claims, 22 Drawing Sheets

(56) References Cited

U.S. PATENT DOCUMENTS

| | | |
|---|---|---|
| 6,495,116 B1 | 12/2002 | Herman |
| 6,495,258 B1 | 12/2002 | Chen et al. |
| 6,515,339 B2 | 2/2003 | Shin et al. |
| 6,528,020 B1 | 3/2003 | Dai et al. |
| 6,548,841 B2 | 4/2003 | Frazier et al. |
| 6,630,772 B1 | 10/2003 | Bower et al. |
| 6,645,628 B2 | 11/2003 | Shiffler, Jr. et al. |
| 6,706,402 B2 | 3/2004 | Rueckes et al. |
| 6,707,098 B2 | 3/2004 | Hofmann et al. |
| 6,759,693 B2 | 7/2004 | Vogeli et al. |
| 6,803,840 B2 | 10/2004 | Hunt et al. |
| 6,808,746 B1 | 10/2004 | Dai et al. |
| 6,809,465 B2 | 10/2004 | Jin |
| 6,833,558 B2 | 12/2004 | Lee et al. |
| 6,835,591 B2 | 12/2004 | Rueckes et al. |
| 6,858,197 B1 | 2/2005 | Delzeit |
| 6,863,942 B2 | 3/2005 | Ren et al. |
| 6,888,773 B2 | 5/2005 | Morimoto |
| 6,890,780 B2 | 5/2005 | Lee |
| 6,899,945 B2 | 5/2005 | Smalley et al. |
| 6,905,892 B2 | 6/2005 | Esmark |
| 6,918,284 B2 | 7/2005 | Snow et al. |
| 6,919,592 B2 | 7/2005 | Segal et al. |
| 6,919,740 B2 | 7/2005 | Snider |
| 6,921,575 B2 | 7/2005 | Horiuchi et al. |
| 6,924,538 B2 | 8/2005 | Jaiprakash et al. |
| 6,946,410 B2 | 9/2005 | French et al. |
| 6,990,009 B2 | 1/2006 | Bertin et al. |
| 7,015,500 B2 | 3/2006 | Choi et al. |
| 7,057,402 B2 | 6/2006 | Cole et al. |
| 7,115,901 B2 | 10/2006 | Bertin et al. |
| 7,115,960 B2 | 10/2006 | Bertin et al. |
| 7,161,403 B2 | 1/2007 | Bertin |
| 7,324,370 B2 | 1/2008 | Smith |
| 7,335,395 B2 | 2/2008 | Ward et al. |
| 7,365,632 B2 | 4/2008 | Bertin et al. |
| 7,479,654 B2 | 1/2009 | Bertin et al. |
| 7,781,862 B2 | 8/2010 | Bertin et al. |
| 7,835,170 B2 | 11/2010 | Bertin et al. |
| 8,000,127 B2 | 8/2011 | Hamilton et al. |
| 8,217,490 B2 | 7/2012 | Bertin et al. |
| 8,319,205 B2 | 11/2012 | Bertin et al. |
| 8,351,239 B2 | 1/2013 | Kim et al. |
| 8,605,517 B2 | 12/2013 | Choi |
| 8,619,450 B2 | 12/2013 | Hamilton |
| 8,737,120 B2 | 5/2014 | Guo |
| 9,019,746 B2 | 4/2015 | Yim et al. |
| 9,299,430 B1 | 3/2016 | Bertin et al. |
| 2001/0004979 A1 | 6/2001 | Han et al. |
| 2001/0023986 A1 | 9/2001 | Mancevski |
| 2002/0160111 A1 | 10/2002 | Sun et al. |
| 2002/0175390 A1 | 11/2002 | Goldstein et al. |
| 2003/0004058 A1 | 1/2003 | Li et al. |
| 2003/0039162 A1 | 2/2003 | Baker |
| 2003/0067797 A1 | 4/2003 | Baker |
| 2003/0122111 A1 | 7/2003 | Glatkowski |
| 2003/0177450 A1 | 9/2003 | Nugent |
| 2003/0200521 A1 | 10/2003 | DeHon et al. |
| 2004/0005723 A1 | 1/2004 | Empedocles et al. |
| 2004/0007528 A1 | 1/2004 | Bakajin et al. |
| 2004/0023253 A1 | 2/2004 | Kunwar et al. |
| 2004/0031975 A1 | 2/2004 | Kern et al. |
| 2004/0041154 A1 | 3/2004 | Watanabe et al. |
| 2004/0043527 A1 | 3/2004 | Bradley et al. |
| 2004/0071949 A1 | 4/2004 | Glatkowski et al. |
| 2004/0099438 A1 | 5/2004 | Arthur et al. |
| 2004/0104129 A1 | 6/2004 | Gu et al. |
| 2004/0132070 A1 | 7/2004 | Star et al. |
| 2004/0181630 A1 | 9/2004 | Jaiprakash et al. |
| 2004/0238887 A1 | 12/2004 | Nihey et al. |
| 2004/0253167 A1 | 12/2004 | Silva et al. |
| 2004/0265550 A1 | 12/2004 | Glatkowski et al. |
| 2004/0266106 A1 | 12/2004 | Lee |
| 2005/0053525 A1 | 3/2005 | Segal et al. |
| 2005/0056825 A1 | 3/2005 | Bertin et al. |
| 2005/0056877 A1 | 3/2005 | Rueckes et al. |
| 2005/0079659 A1 | 4/2005 | Duan et al. |
| 2005/0095938 A1 | 5/2005 | Rosenberger et al. |
| 2005/0212014 A1 | 9/2005 | Horibe et al. |
| 2006/0237537 A1 | 10/2006 | Empedocles |
| 2007/0004191 A1 | 1/2007 | Gu et al. |
| 2008/0159053 A1* | 7/2008 | Yan .......................... G11C 8/08 365/230.06 |
| 2008/0224178 A1 | 9/2008 | Pacha et al. |
| 2008/0284929 A1 | 11/2008 | Kimura |
| 2008/0310213 A1 | 12/2008 | Chen et al. |
| 2008/0310221 A1 | 12/2008 | Baker |
| 2009/0059686 A1 | 3/2009 | Sung |
| 2010/0074034 A1* | 3/2010 | Cazzaniga ............. G11C 16/30 365/189.09 |
| 2011/0038195 A1 | 2/2011 | Hamilton et al. |
| 2011/0261637 A1* | 10/2011 | Harvard ............... G11C 7/1048 365/207 |
| 2013/0077383 A1 | 3/2013 | Huang et al. |
| 2013/0148405 A1 | 6/2013 | Kang et al. |
| 2013/0215669 A1 | 8/2013 | Haukness |
| 2013/0235649 A1 | 9/2013 | Lindstadt et al. |
| 2014/0166959 A1 | 6/2014 | Bertin et al. |
| 2015/0248931 A1 | 9/2015 | Nazarian |

FOREIGN PATENT DOCUMENTS

| | | |
|---|---|---|
| JP | 2001035362 | 2/2001 |
| JP | 2004090209 | 3/2004 |
| WO | WO-98/39250 | 9/1998 |
| WO | WO-99/65821 | 12/1999 |
| WO | WO-01/03208 | 1/2001 |
| WO | WO-02/45113 | 6/2002 |
| WO | WO-02/48701 | 6/2002 |
| WO | WO-03/016901 | 2/2003 |
| WO | WO-03/034142 | 4/2003 |

OTHER PUBLICATIONS

Ajayan, et al., "Applications of Carbon Nanotubes," Topics Appl. Phys., vol. 80, 2001, pp. 391-425.

Amblard, G., "Development and characterization of carbon nanotube processes for NRAM technology," Proc. of SPIE 2011, vol. 7970, pp. 797017-1-797017-7.

Avouris, P., "Carbon Nanotube Electronics," Chemical Physics, 2002, vol. 281, pp. 429-445.

Awano, Y., "Graphene for VLSI: FET and Interconnect Applications," IEDM 2009 Technical Digest, pp. 10.1.1-10.1.4.

Banerjee, et al., "Functionalization of Carbon Nanotubes with a Metal-Containing Molecular Complex," Nano Letters, vol. 2, No. 1, 2002, pp. 49-53.

Bachtold, et al., "Logic Circuits Based on Carbon Nanotubes," Physica E 16, 2003, pp. 42-46.

Berhan, et al., "Mechanical Properties of Nanotube Sheets: Alterations in Joint Morphology and Achievable Moduli in Manufacturable Materials," J. Appl. Phys., vol. 95, No. 8, Apr. 2004, pp. 4335-4345.

Bonard, et al., "Monodisperse Multiwall Carbon Nanotubes Obtained with Ferritin as Catalyst," Nano Letters, vol. 2, No. 6, 2002, pp. 665-667.

Brock, et al., "Carbon Nanotube Memories and Fabrics in a Radiation Hard Semiconductor Foundry," 2005 IEEE Conference, 9 pgs.

Brown, K. M., "System in package "The Rebirth of SIP"," 2004 IEEE Custom Integrated Circuits, May 2004, 6 pgs.

Cassell, et al., "Large Scale CVD Synthesis of Single-Walled Carbon Nanotubes," J. Phys. Chem. B, vol. 103, 1999, pp. 6484-6492.

Chen, et al., "Heterogeneous Single-Walled Carbon Nanotube Catalyst Discovery and Optimization," Chem. Mater., vol. 14, 2002, pp. 1891-1896.

Chen, et al., "Self-Aligned Carbon Nanotube Transistors with Charge Transfer Doping," Appl. Phys. Ltrs., 2005, No. 86, pp. 123108-1-123108-3.

(56) References Cited

OTHER PUBLICATIONS

Cheng, H.M., "Large-Scale and Low-Cost Synthesis of Single-Walled Carbon Nanotubes by the Catalytic Pyrolysis of Hydrocarbons," Appl. Phys. Ltrs., vol. 72, No. 25, Jun. 1998, pp. 3282-3284.
Chiang, et al., "Purification and Characterization of Single-Wall Carbon Nanotubes (SWNTs) Obtained from the Gas-Phase Decomposition of CO (HiPco Process)," J. Phys. Chem. B, vol. 105, 2001, pp. 8297-8301.
Chiu, Y., "CMOS Active-Cascode Gain Stage," EECT 7326 Fall 2013 Handout, 2013, pp. 1-12.
Crippa, et al., "Chapter 2 Nonvolatile Memories: NOR vs. NAND Architectures," in "Memories in Wireless Systems," 2008, Sections 2.2.1-2.2.2, pp. 30-37, Micheloni et al. eds., Springer-Verlag Berlin Heidelberg.
Crowley, et al., "512 Mb PROM with 8 layers of antifuse/Diode cells," IEEE International Solid-State Circuits Conference, vol. XLVI, Feb. 2003, pp. 284-285.
Cui, et al., "Carbon Nanotube Memory Devices of High Charge Storage Stability," Applied Phys. Ltrs., vol. 81, No. 17, Oct. 2002, pp. 3260-3262.
Dai, et al., "Controlled Chemical Routes to Nanotube Architectures, Physics, and Devices," J. Phys. Chem. B, vol. 103, 1999, pp. 11246-11255.
Delzeit, et al., "Multilayered Metal Catalysts for Controlling the Density of Single-Walled Carbon Nanotube Growth," Chem. Phys. Ltrs., vol. 348, 2001, pp. 368-374.
Derycke, et al., "Carbon Nanotube Inter- and Intramolecular Logic Gates," Nano Letters, 2001, vol. 1, No. 9, 4 pgs.
Desai, et al., "Freestanding Carbon Nanotube Specimen Fabrication," Proceeding 2005 5$^{th}$ IEEE Conference on Nanotechnology, Nagoya, Japan, Jul. 2005, 4 pgs.
Duan, et al., "Nonvolatile Memory and Programmable Logic from Molecule-Gated Nanowires," Nano Letters, 2002, XXXX, vol. 0, No. 0, A-D, 4 pgs.
Engel, et al., "Thin Film Nanotube Transistors Based on Self-Assembled, Aligned, Semiconducting Carbon Nanotube Arrays," ACS Nano, 2008, vol. 2, No. 12, pp. 2445-2452.
Franklin, et al., "An Enhanced CVD Approach to Extensive Nanotube Networks with Directionality," Adv. Mater., vol. 12, No. 12, 2000, pp. 890-894.
Fuhrer, et al., "High-Mobility Nanotube Transistor Memory," Nano Letters, vol. 2, No. 7, 2002, pp. 755-759.
Haddon, et al., "Purification and Separation of Carbon Nanotubes," MRS Bulletin, Apr. 2004, pp. 252-259 (www.mrs.org/publications/bulletins).
Hafner, et al., "Catalytic Growth of Single-Wall Carbon Nanotubes from Metal Particles," Chem. Phys. Ltrs., vol. 296, 1998, pp. 195-202.
Heinze, et al., "Carbon Nanotube as Schottky Barrier Transistors," Phys. Rev. Ltrs., 2002, vol. 89, No. 10, pp. 106801-1-106801-4.
Homma, et al., "Single-Walled Carbon Nanotube Growth on Silicon Substrates Using Nanoparticle Catalysts," JPN, J. Appl. Phys., vol. 41, 2002, pp. L89-L91.
Huai, Y., "Spin-Transfet Torque MRAM (STT-MTAM): Challenges and Prospects," AAPS Bulletin, vol. 18, No. 6, Dec. 2008, pp. 33-40.
Huang, et al., "Logic Gates and Computation from Assembled Nanowire Building Blocks," Science, 2001, vol. 294, pp. 1313-1317.
International Search Report, International Patent Application No. PCT/US05/18467 dated Oct. 1, 2007, 5 pgs.
International Search Report, International Patent Application No. PCT/US05/18539 dated Sep. 18, 2006, 4 pgs.
International Search Report, International Patent Application No. PCT/US05/45316 dated Sep. 6, 2005, 2 pgs.
Javey, et al., "Carbon Nanotube Transistor Arrays for Multistage Complementary Logic and Ring Oscillators," Nano Letters, 2002, XXXX, vol. 0, No. 0, A-D, 4 pgs.

Javey, et al., "High-κ Dielectrics for Advanced Carbon-Nanotube Transistors and Logic Gates," Nature Materials, 2002, vol. 1, pp. 241-246.
Jeong, et al., "A Purification Method of Single-Wall Carbon Nanotubes Using H2S and 02 Mixture Gas," Chem. Phys. Ltrs., vol. 344, Aug. 2001, pp. 18-22.
Jiang, et al., "Performance Breakthrough in 8nm Gate-All-Around Length Gate-All Around Nanowire Transistors using Metallic Nanowire Contacts," 2008 Symposium on VLSI Technology Digest of Technical Papers, pp. 34-35.
Joselevich, et al., "Vectorial Growth of Metallic and Semiconducting Single-Wall Carbon Nanotubes," Nano Letters, vol. 0, No. 0, A-E, 2002.
Kahn, et al., "Solubilization of Oxidized Single-Walled Carbon Nanotube in Organic and Aqueous Solvents through Organic Derivatization," Nano Letters, vol. 2, No. 11, 2002, pp. 1215-1218.
Kianian, et al., "A 3D Stackable Carbon Nanotube-based Nonvolatile Memory (NRAM)," ESSDERC, Nantero, Inc., Jun. 14, 2010, 4 pgs.
Kong, et al., "Chemical Vapor Deposition of Methane for Single-Walled Carbon Nanotubes," Chem. Phys. Ltrs., vol. 292, Aug. 1998, pp. 567-574.
Kong, et al., "Nanotube Molecular Wires as Chemical Sensors," Science, vol. 287, Jan. 2000, pp. 622-625.
Leslie, et al., "Noise-Shaping Sense Amplifier for MRAM Cross Point Arrays," IEEE Jrl. of Solid-State Circuits, vol. 41, No. 3, Mar. 2006, pp. 699-704.
Li, et al., "Carbon Nanotube Nanoelectrode Array for Ultrasensitive DNA Detection," Nano Letters, vol. 3, No. 5, 2003, pp. 597-602.
Li, et al., "Growth of Single-Walled Carbon Nanotubes from Discrete Catalytic Nanoparticles of Various Sizes," J. Phys. Chem. B, vol. 105, 2001, pp. 11424-11431.
Li, et al., "Preparation of Monodispersed Fe—Mo Nanoparticles as the Catalyst for CVD Synthesis of Carbon Nanotubes," Chem. Mater., vol. 13, 2001, pp. 1008-1014.
Lin, et al., "Novel Carbon Nanotube FEET Design with Tunable Polarity," IEDM 04-687, 2004, pp. 29.2.1-29.2.4.
Martel, et al., "Carbon Nanotube Field-Effect Transistors and Logic Circuits," DAC 2002, New Orleans, Louisiana, 5 pgs.
Micheloni, et al., "2 NAND overview: from memory to systems," in Micheloni, et al. "Inside NAND Flash Memories," 2010, Section 2.2.2, pp. 22-26, Springer Netherlands.
Nerushev, et al., "Carbon Nanotube Films Obtained by Thermal Chemical Vapour Deposition," J. Mater. Chem., vol. 11, 2001, pp. 1122-1132.
Niu, et al., "High Power Electrochemical Capacitors Based on Carbon Nanotube Electrodes," Appl. Phys. Ltrs., vol. 70, No. 11, Mar. 1997, pp. 1480-1482.
Novak, et al., "Nerve Agent Using Networks of Single-Walled Carbon Nanotubes," Appl. Phys. Ltr, vol. 83, No. 19, Nov. 2003, pp. 4026-4028.
Onoa, et al., "Bulk Production of Singly Dispersed Carbon Nanotubes with Prescribed Lengths," Nanotechnology, vol. 16, 2005, pp. 2799-2803.
Parikh, et al., "Flexible Vapour Sensors Using Single Walled Carbon Nanotubes," Sensors and Actuators B, vol. 113, 2006, pp. 55-63.
Peigney, et al., "A Study of the Formation of Single- and Double-Walled Carbon Nanotubes by a CVD Method," J. Phys. Chem. B, vol. 105, 2001, pp. 9699-9710.
Qi, et al., "Toward Large Arrays of Multiplex Functionalized Carbon Nanotube Sensors for Highly Sensitive and Selective Molecular Detection," Nano Letters, vol. 3, No. 3, 2003, pp. 347-351.
Radosavijevic, et al., "Nonvolatile Molecular Memory Elements Based on Ambipolar Nanotube Field Effect Transistors," Nano Letters, 2002, vol. 2, No. 7, pp. 761-764.
Rosendale, et al., "A 4 Megabit Carbon Nanotube-based Nonvolatile Memory (NRAM)," ESSCIRC 2010 Proceedings, pp. 478-481.
Rueckes, et al., "Carbon Nanotube-Based Nonvolatile Random Access Memory for Molecular Computing," Science, 2000, vol. 289, pp. 94-97.
Servalli, G., "A 45nm Generation Phase Change Memory Technology," IEDM 2009 Technical Digest, pp. 5.7.1-5.7.4.

(56) References Cited

OTHER PUBLICATIONS

Shelimov, et al., "Purification of Single-Wall Carbon Nanotubes by Electronically Assisted Filtration," Chem. Phys. Ltrs., vol. 282, 1998, pp. 429-434.
Smith, et al., "Contamination Control and Pilot Manufacturing of Commercial Grade Carbon Nanotube Colloidal Formulations," 2013 SEMI Advanced Semiconductor Manufacturing Conference (ASMC 2013), 5 pages.
Snow, et al., "Random Networks of Carbon Nanotubes as an Electronic Material," App. Phys. Ltrs., vol. 82, No. 13, Mar. 2003, pp. 2145-2147.
Sotiropoulou, et al., "Carbon Nanotube Array-Based Biosensor," Anal Bioanal Chem, vol. 375, 2003, pp. 103-105.
Star, et al., "Nanoelectronic Carbon Dioxide Sensors," Adv. Mater., vol. 16, No. 22, 2004, pp. 2049-2052.
Star, et al., "Nanotube Optoelectronic Memory Devices," Nano Letters, vol. 4, No. 9, 2004, pp. 1587-1591.
Valentini, et al., "Sensors for sub-ppm NO2 Gas Detection Based on Carbon Nanotube Thin Films," Appl. Phys. Ltrs., vol. 82, No. 6, Feb. 2003, pp. 961-963.
Ward, et al., "A Non-Volatile Nanoelectromechanical Memory Element Utilizing a Fabric of Carbon Nanotubes," IEEE 2004, pp. 34-38.
Wind, et al., "Fabrication and Electrical Characterization of Top Gate Single-Wall Carbon Nanotube Field-Effect Transistors," IBM T.J. Watson Research Ctr., 6A1:1-9 plus figures 1-5, May 2002.
Wind, et al., "Vertical Scaling of Carbon Nanotube Field-Effect Transistors using Top Gate Electrodes," Appl. Phys. Ltrs., 2002, vol. 80, No. 20, pp. 3817-3819.
Zhang, et al., "Metal Coating on Suspended Carbon Nanotubes and its Implications to Metal-tube Interaction," Chem. Phys. Ltrs., vol. 331, 2000, pp. 35-41.
Zhang, et al., "Select Pathways to Carbon Nanotube Film Growth," Adv. Mater., vol. 13, No. 23, Dec. 2001, pp. 1767-1770.
Zhang, et al., "Formation of Metal Nanowires on Suspended Single-Walled Carbon Nanotubes," Appl. Phys. Ltrs., vol. 77, No. 19, Nov. 2000, pp. 3015-3017.
Zhao, et al., "Frequency-Dependent Electrical Transport in Carbon Nanotubes," Phys. Review B, vol. 64, 2001, pp. 201402-1-201402-4.
Zhou, et al., "p-Channel, n-Channel Thin Film Transistors and p-n Diodes Based on Single Wall Carbon Nanotube Networks," Nano Letters, vol. 4, No. 10, 2004, pp. 2031-2035.
U.S. Appl. No. 15/175,201, filed Jun. 7, 2016, Harvard, Qawi.
U.S. Appl. No. 15/175,346, filed Jun. 7, 2016, Harvard Qawi.
Reply to Office Action for U.S. Appl. No. 15/175,201, dated Feb. 23, 2017, pp. 1-6.
Reply to Office Action for U.S. Appl. No. 15/175,346, dated Feb. 23, 2017, pp. 1-10.
Reply to Office Action for U.S. Appl. No. 15/175,201, dated Jul. 12, 2017, pp. 1-9.
International Search Report for PCT/US2017/036400, dated Aug. 31, 2017, 3 pages.
Written Opinion for PCT/US2017/036400, dated Aug. 31, 2017, 5 pages.

\* cited by examiner

700

702 — Selecting a resistive change element from a plurality of resistive change elements in a resistive change element array, where each resistive change element is electrically connected to a bit line of a plurality of bit lines in the resistive change element array and a word line of a plurality of word lines in the resistive change element array

704 — Setting a potential amount of current permitted to be supplied for determining a resistive state of the resistive change element

706 — Supplying an amount of current for determining the resistive state of the resistive change element, where the amount of current is limited to a set amount of current

708 — Determining the resistive state of the resistive change element based on the potential amount of current permitted to be supplied and the set amount of current

```
┌─────────────────────────────────────────────────────────────┐
│ Selecting a resistive change element from a plurality of     │
│ resistive change elements in a resistive change element      │
│ array, where each resistive change element is electrically   │──── 1002
│ connected to a bit line of a plurality of bit lines in the   │
│ resistive change element array and a word line of a          │
│ plurality of word lines in the resistive change element array│
└─────────────────────────────────────────────────────────────┘
                              │
                              ▼
┌─────────────────────────────────────────────────────────────┐
│ Setting a potential amount of current permitted to be        │──── 1004
│ supplied for determining a resistive state of the resistive  │
│ change element                                               │
└─────────────────────────────────────────────────────────────┘
                              │
                              ▼
┌─────────────────────────────────────────────────────────────┐
│ Supplying an amount of current for determining the resistive │
│ state of the resistive change element, where the amount of   │──── 1006
│ current is limited to a set amount of current                │
└─────────────────────────────────────────────────────────────┘
                              │
                              ▼
┌─────────────────────────────────────────────────────────────┐
│ Determining the resistive state of the resistive change      │
│ element based on an amount of current flowing through the    │
│ resistive change element and the amount of current for       │──── 1008
│ determining the resistive state of the resistive change      │
│ element                                                      │
└─────────────────────────────────────────────────────────────┘
```

FIG. 10

METHODS FOR DETERMINING THE RESISTIVE STATES OF RESISTIVE CHANGE ELEMENTS

CROSS-REFERENCE OF RELATED CASES

This application is related to the following U.S. Patents, which are assigned to the assignee of the present application, and are hereby incorporated by reference in their entirety:
- U.S. Pat. No. 6,835,591, filed on Apr. 23, 2002, entitled Methods of Nanotube Films and Articles;
- U.S. Pat. No. 7,335,395, filed on Jan. 13, 2003, entitled Methods of Using Pre-Formed Nanotubes to Make Carbon Nanotube Films, Layers, Fabrics, Ribbons, Elements, and Articles;
- U.S. Pat. No. 6,706,402, filed on Mar. 16, 2004, entitled Nanotube Films and Articles;
- U.S. Pat. No. 7,115,901, filed on Jun. 9, 2004, entitled Non-Volatile Electromechanical Field Effect Devices and Circuits Using Same and Methods of Forming Same;
- U.S. Pat. No. 7,365,632, filed on Sep. 20, 2005, entitled Resistive Elements Using Carbon Nanotubes;
- U.S. Pat. No. 7,781,862, filed on Nov. 15, 2005, entitled Two-Terminal Nanotube Devices and Systems and Methods of Making Same;
- U.S. Pat. No. 7,479,654, filed on Nov. 15, 2005, entitled Memory Arrays Using Nanotube Articles with Reprogrammable Resistance;
- U.S. Pat. No. 8,217,490, filed on Aug. 8, 2007, entitled Nonvolatile Nanotube Diodes and Nonvolatile Nanotube Blocks and Systems Using Same and Methods of Making Same;
- U.S. Pat. No. 7,835,170, filed on Aug. 8, 2007, entitled Nonvolatile Nanotube Diodes and Nonvolatile Nanotube Blocks and Systems Using Same and Methods of Making Same;
- U.S. Pat. No. 8,319,205, filed on Aug. 6, 2009, entitled Nonvolatile Nanotube Programmable Logic Devices and a Nonvolatile Nanotube Field Programmable Gate Array Using Same;
- U.S. Pat. No. 8,351,239, filed on Oct. 23, 2009, entitled Dynamic Sense Current Supply Circuit and Associated Method for Reading and Characterizing a Resistive Memory Array; and
- U.S. Pat. No. 8,000,127, filed on Nov. 13, 2009, entitled Method for Resetting a Resistive Change Memory Element;
- U.S. Pat. No. 8,619,450, filed on Sep. 1, 2010, entitled A Method for Adjusting a Resistive Change Element Using a Reference; and
- U.S. Pat. No. 9,299,430, filed on Jan. 22, 2015, entitled 1-R Resistive Change Element Arrays Using Resistive Reference Elements.

This application is related to the following U.S. Patent Applications, which are assigned to the assignee of the application, and are hereby incorporated by reference in their entirety:
- U.S. patent Ser. No. 13/716,453 filed on Dec. 12, 2012, entitled Carbon Based Nonvolatile Cross Point Memory Incorporating Carbon Based Diode Select Devices And MOSFET Select Devices For Memory And Logic Applications; and
- U.S. patent Ser. No. 15/135,414, filed on Apr. 22, 2016, entitled Methods for Enhanced State Retention within a Resistive Change Cell.

BACKGROUND

Technical Field

The present disclosure generally relates to arrays of resistive change elements and generally relates to devices and methods for determining resistive states of resistive change elements in such arrays.

Discussion of Related Art

Any discussion of the related art throughout this specification should in no way be considered as an admission that such art is widely known or forms part of the common general knowledge in the field.

Resistive change devices and arrays, often referred to as resistance RAMs by those skilled in the art, are well known in the semiconductor industry. Such devices and arrays, for example, include, but are not limited to, phase change memory, solid electrolyte memory, metal oxide resistance memory, and carbon nanotube memory such as NRAM™.

Resistive change devices and arrays store information by adjusting a resistive change element, typically comprising some material that can be adjusted between a number of non-volatile resistive states in response to some applied stimuli, within each individual array cell between two or more resistive states. For example, each resistive state within a resistive change element cell can correspond to a data value which can be programmed and read back by supporting circuitry within the device or array.

For example, a resistive change element might be arranged to switch between two resistive states: a low resistive state (which might correspond to a logic 1) and a high resistive state (which might correspond to a logic 0). In this way, a resistive change element can be used to store one binary digit (bit) of data.

Or, as another example, a resistive change element might be arranged to switch between four resistive states, so as to store two bits of data. Or a resistive change element might be arranged to switch between eight resistive states, so as to store three bits of data. Or a resistive change element might be arranged to switch between $2^n$ resistive states, so as to store n bits of data.

Within the current state of the art, there is an increasing need to scale and increase the cell density of resistive change element arrays. However, as technology is developed within the state of the art to provide increasingly smaller resistive change elements, the physical dimensions of individual array cells within a resistive change element array becomes, in certain applications, limited by the physical dimensions of in situ selection devices used within traditional resistive change element array cells. When data is read from an array of traditional resistive change element array cells an in situ selection device within each traditional resistive change element array cell is used to select the traditional resistive change element array cell that data is read from.

SUMMARY

The present disclosure provides devices and methods for determining resistive states of resistive change elements. The devices and methods of the present disclosure can determine resistive states of resistive change elements by sensing current flow. The devices and methods of the present disclosure can determine resistive states of resistive change elements in resistive change element cells without in situ selection devices or other current controlling devices within each resistive change element cell. The devices and methods of the present disclosure can reduce the impact of sneak current, also referred to as leakage current, when determining the resistive states of resistive change elements.

The present disclosure provides a circuit for determining a resistive state of a resistive change element. The circuit includes a current source having an output terminal and a sense circuit. The sense circuit includes a field effect transistor dimensioned for determining a resistive state of a resistive change element, the field effect transistor having a gate terminal, a source terminal, and a drain terminal, where the drain terminal of the field effect transistor is electrically connected to the output terminal of the current source. The sense circuit also includes a differential amplifier having a non-inverting input terminal, an inverting input terminal, and an output terminal, where the inverting input terminal is electrically connected to the source terminal of the field effect transistor and the output terminal is electrically connected to the gate terminal of the field effect transistor.

According to another aspect of the present disclosure the field effect transistor is a metal oxide semiconductor field effect transistor.

According to another aspect of the present disclosure the metal oxide semiconductor field effect transistor is an n-channel metal oxide semiconductor field effect transistor.

According to another aspect of the present disclosure the field effect transistor is a carbon nanotube field effect transistor.

According to another aspect of the present disclosure the field effect transistor is a multiple gate field effect transistor.

According to another aspect of the present disclosure the differential amplifier is an operational amplifier.

According to another aspect of the present disclosure the circuit also includes a sense amplifier having an input terminal, where the input terminal of the sense amplifier is electrically connected to the drain terminal of the field effect transistor.

According to another aspect of the present disclosure the circuit also includes a sense amplifier having an input terminal, where the input terminal of the sense amplifier is electrically connected to the output terminal of the differential amplifier.

The present disclosure provides a circuit for determining a resistive state of a resistive change element. The circuit includes a current source having an output terminal and a sense circuit. The sense circuit includes a field effect transistor dimensioned for determining a resistive state of a resistive change element, the field effect transistor having a gate terminal, a source terminal, and a drain terminal, where the source terminal of the field effect transistor is electrically connected to the output terminal of the current source. The sense circuit also includes a differential amplifier having a non-inverting input terminal, an inverting input terminal, and an output terminal, where the non-inverting input terminal is electrically connected to the drain terminal of the field effect transistor and the output terminal is electrically connected to the gate terminal of the field effect transistor.

According to another aspect of the present disclosure the field effect transistor is a metal oxide semiconductor field effect transistor.

According to another aspect of the present disclosure the metal oxide semiconductor field effect transistor is a p-channel metal oxide semiconductor field effect transistor.

According to another aspect of the present disclosure the field effect transistor is a carbon nanotube field effect transistor.

According to another aspect of the present disclosure the field effect transistor is a multiple gate field effect transistor.

According to another aspect of the present disclosure the differential amplifier is an operational amplifier.

According to another aspect of the present disclosure the circuit also includes a sense amplifier having an input terminal, where the input terminal of the sense amplifier is electrically connected to the source terminal of the field effect transistor.

According to another aspect of the present disclosure the circuit also includes a sense amplifier having an input terminal, where the input terminal of the sense amplifier is electrically connected to the output terminal of the differential amplifier.

The present disclosure provides a method for determining a resistive state of a resistive change element in a resistive change element array. The method includes selecting a resistive change element from a plurality of resistive change elements in a resistive change element array, where each resistive change element is electrically connected to a bit line of a plurality of bit lines in the resistive change element array and a word line of a plurality of word lines in the resistive change element array, setting a potential amount of current permitted to be supplied for determining a resistive state of the resistive change element, supplying an amount of current for determining the resistive state of the resistive change element, where the amount of current is limited to a set amount of current, and determining the resistive state of the resistive change element based on the potential amount of current permitted to be supplied and the set amount of current.

According to another aspect of the present disclosure the resistive state of the resistive change element is determined to be a low resistive state when the potential amount of current permitted to be supplied is greater than the set amount of current and the low resistive state corresponds to a logic 1.

According to another aspect of the present disclosure the resistive state of the resistive change element is determined to be a high resistive state when the potential amount of current permitted to be supplied is less than the set amount of current and the high resistive state corresponds to a logic 0.

According to another aspect of the present disclosure the resistive change element array includes a plurality of resistive change element cells, and wherein each resistive change element cell includes one resistive change element of the plurality of resistive change elements and each resistive change element cell in the plurality of resistive change element cells does not include an in situ selection device.

According to another aspect of the present disclosure each resistive change element in the plurality of resistive change elements is connected to a bit line of the plurality of bit lines and a word line of the plurality of word lines without any intervening devices.

According to another aspect of the present disclosure the set amount of current is set based on an amount of current flowing through the resistive change element when the resistive change element has a high resistive state and an amount of current flowing through the resistive change element when the resistive change element has a low resistive state.

According to another aspect of the present disclosure the set amount of current is an average of the amount of current flowing through the resistive change element when the resistive change element has a high resistive state and the amount of current flowing through the resistive change element when the resistive change element has a low resistive state.

The present disclosure provides a method for determining a resistive state of a resistive change element in a resistive change element array. The method includes selecting a resistive change element from a plurality of resistive change elements in a resistive change element array, where each resistive change element is electrically connected to a bit line of a plurality of bit lines in the resistive change element array and a word line of a plurality of word lines in the resistive change element array, setting a potential amount of current permitted to be supplied for determining a resistive state of the resistive change element, supplying an amount of current for determining the resistive state of the resistive change element, where the amount of current is limited to a set amount of current, and determining the resistive state of the resistive change element based on an amount of current flowing through the resistive change element and the amount of current for determining the resistive state of the resistive change element.

According to another aspect of the present disclosure the resistive state of the resistive change element is determined to be a low resistive state when the amount of current flowing through the resistive change element is greater than the amount of current for determining the resistive state of the resistive change element and the low resistive state corresponds to a logic 1.

According to another aspect of the present disclosure the resistive state of the resistive change element is determined to be a high resistive state when the amount of current flowing through the resistive change is less than or equal to the amount of current for determining the resistive state of the resistive change element and the high resistive state corresponds to a logic 0.

According to another aspect of the present disclosure the resistive change element array includes a plurality of resistive change element cells, and wherein each resistive change element cell includes one resistive change element of the plurality of resistive change elements and each resistive change element cell in said plurality of resistive change element cells does not include an in situ selection device.

According to another aspect of the present disclosure each resistive change element in the plurality of resistive change elements is connected to a bit line of the plurality of bit lines and a word line of the plurality of word lines without any intervening devices.

According to another aspect of the present disclosure the set amount of current is set based on an amount of current flowing through the resistive change element when the resistive change element has a high resistive state and an amount of current flowing through the resistive change element when the resistive change element has a low resistive state.

According to another aspect of the present disclosure the set amount of current is an average of the amount of current flowing through the resistive change element when the resistive change element has a high resistive state and the amount of current flowing through the resistive change element when the resistive change element has a low resistive state.

The present disclosure provides a device including a resistive change element array, where the resistive change element array has a plurality of word lines, a plurality of bit lines, and a plurality of resistive change elements, where each resistive change element has a first terminal and a second terminal and where the first terminal of each resistive change element is electrically connected to a word line of the plurality of word lines and the second terminal of each resistive change element is electrically connected to a bit line of the plurality of bit lines. The device also includes a plurality of sense circuits, where each sense circuit has a field effect transistor having a gate terminal, a drain terminal, and a source terminal, where the source terminal of the field effect transistor is electrically connected to a bit line of the plurality of bit lines; and a differential amplifier having a non-inverting input terminal, an inverting input terminal, and an output terminal, where the inverting input terminal is electrically connected to the source terminal of the field effect transistor, and where the output terminal is electrically connected to the gate terminal of the field effect transistor.

According to another aspect of the present disclosure the resistive change elements are two-terminal nanotube switching elements including a nanotube fabric.

According to another aspect of the present disclosure the resistive change elements are metal oxide memory elements.

According to another aspect of the present disclosure the resistive change elements are phase change memory elements.

According to another aspect of the present disclosure the resistive change element array is a memory array.

According to another aspect of the present disclosure the field effect transistor is a n-channel metal oxide semiconductor field effect transistor.

According to another aspect of the present disclosure the resistive change element array includes a plurality of resistive change element cells, and wherein each resistive change element cell includes one resistive change element of the plurality of resistive change elements and each resistive change element cell in said plurality of resistive change element cells does not include an in situ selection device.

According to another aspect of the present disclosure each resistive change element in the plurality of resistive change elements is connected to a bit line of the plurality of bit lines and a word line of the plurality of word lines without any intervening devices.

The present disclosure provides a device including a resistive change element array, where the resistive change element array has a plurality of word lines, a plurality of bit lines, and a plurality of resistive change elements, where each resistive change element has a first terminal and a second terminal and where the first terminal of each resistive change element is electrically connected to a word line of the plurality of word lines and the second terminal of each resistive change element is electrically connected to a bit line of the plurality of bit lines. The device also includes a plurality of sense circuits, where each sense circuit has a field effect transistor having a gate terminal, a drain terminal, and a source terminal, where the drain terminal of the field effect transistor is electrically connected to a bit line of the plurality of bit lines; and a differential amplifier having a non-inverting input terminal, an inverting input terminal, and an output terminal, wherein the non-inverting input terminal is electrically connected to the drain terminal of the field effect transistor, and where the output terminal is electrically connected to the gate terminal of the field effect transistor.

According to another aspect of the present disclosure the resistive change elements are two-terminal nanotube switching elements including a nanotube fabric.

According to another aspect of the present disclosure the resistive change elements are metal oxide memory elements.

According to another aspect of the present disclosure the resistive change elements are phase change memory elements.

According to another aspect of the present disclosure the resistive change element array is a memory array.

According to another aspect of the present disclosure the field effect transistor is a p-channel metal oxide semiconductor field effect transistor.

According to another aspect of the present disclosure the resistive change element array includes a plurality of resistive change element cells, and wherein each resistive change element cell includes one resistive change element of the plurality of resistive change elements and each resistive change element cell in said plurality of resistive change element cells does not include an in situ selection device.

According to another aspect of the present disclosure each resistive change element in the plurality of resistive change elements is connected to a bit line of the plurality of bit lines and a word line of the plurality of word lines without any intervening devices.

Other features and advantages of the present disclosure will become apparent from the following description of the invention, which is provided below in relation to the accompanying drawings.

BRIEF DESCRIPTION OF THE DRAWINGS

FIG. 7 illustrates a flow chart showing a first method according to the present disclosure for performing a read operation of a 1-R resistive change element cell by sensing current flow.

FIG. 10 illustrates a flow chart showing a second method according to the present disclosure for performing a read operation of a 1-R resistive change element cell by sensing current flow.

DETAILED DESCRIPTION

Figure 1A:
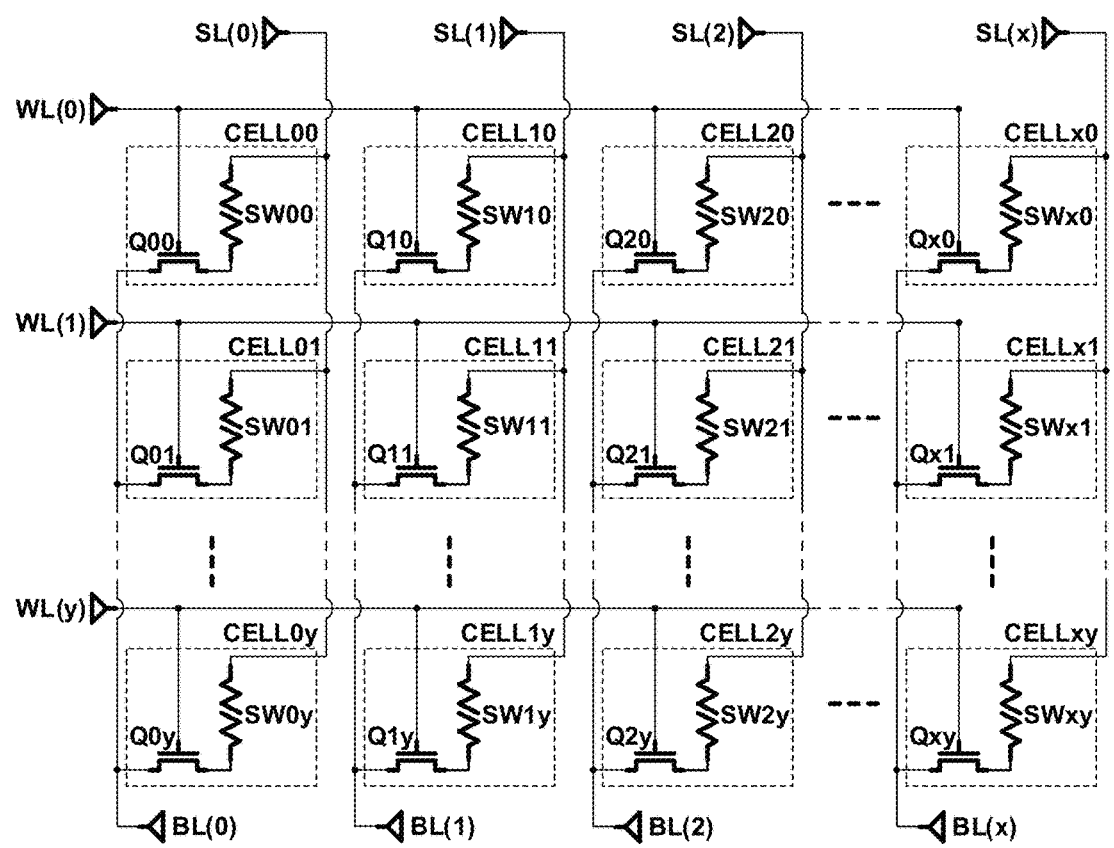
FIG. 1A illustrates a simplified schematic diagram of an exemplary architecture for an array of resistive change elements where in situ selection devices are included within the resistive change element cells of the array.

The present disclosure relates to devices and methods for determining resistive states of resistive change elements in resistive change element arrays by sensing current flow. The devices and methods of the present disclosure are well suited for use with arrays of 1-R resistive change elements cells, as discussed in detail below. These 1-R resistive change element arrays (examples of which are shown in FIGS. 3, 5, 6A-6C, 9A-9C, and discussed in detail below with respect to those figures) are characterized in that these cells include a two-terminal resistive change element and do not include an in situ selection device or other current limiting element. Additionally, as discussed in detail below, the devices and methods of the present disclosure can reduce the impact of sneak current when determining resistive states of resistive change elements. Further, as discussed in detail below, the devices and methods for reading the resistive states of the resistive change elements can determine a resistive state of a resistive change element of one or more cells in an array without the need for certain design and layout restrictions that are inherent with many conventional devices and methods.

Within certain embodiments of the present disclosure, arrays of resistive change elements are arranged such that a first terminal of each resistive change element is electrically coupled to a word line and a second terminal of each resistive change element is electrically coupled to a bit line. In this way, within such arrangements, each resistive change element is uniquely accessible via a particular word line and bit line combination. FIGS. 3, 5, 6A-6C, 9A-9C, (discussed in detail below) provide examples of such resistive change element arrays. Some aspects of the present disclosure provide devices and methods (again, as will be explained in detail below) for accessing (that is, performing READ operations) the resistive change elements within such an array without the need for in situ selection devices or current limiting devices.

To this end, the present disclosure provides devices and methods for performing READ operations on one or more cells within a resistive change element array. That is, an operation wherein one or more resistive change elements within a resistive change element array is accessed via associated word lines and bit lines to determine the resistive state stored within the element or elements. Additionally, a READ operation, as defined by the present disclosure, is used to describe an operation wherein the resistive state of a resistive change element is determined without significantly altering the stored resistive state. Further, during READ operations unselected resistive change elements in the array may provide sneak current paths, also referred to as leakage current paths, between the word lines that have not been selected and the selected bit line or between the bit lines that have not been selected and the selected word line. However, as will be explained in detail below, the disclosed devices and methods for reading the resistive states of resistive change elements in resistive change elements arrays can reduce the impact of sneak current.

The terms connected, coupled, electrically connected, electrically coupled, and in electrical communication are used interchangeably in this disclosure and the terms refer to a connection that allows electrical signals to flow either directly or indirectly from one component to another. The direct flow of electrical signals from one component to another does not preclude intervening passive devices that do not generate electric energy such as resistor, capacitors, and inductors. The indirect flow of electrical signals from one component to another does not preclude intervening active devices such as transistors or flow of electrical signals by electromagnetic induction. Additionally, the terms terminal, contact, and conductor are used interchangeably in this disclosure.

Resistive change element cells store information through the use of a resistive change element within the cell. Responsive to electrical stimulus, this resistive change element can be adjusted between at least two non-volatile resistive states. Typically, two resistive states are used: a low resistive state (corresponding, typically, to a logic 1, a SET state) and a high resistive state (corresponding, typically, to a logic 0, a RESET state). In this way, the resistance value of the resistive change element within the resistive change element cell can be used to a store a bit of information (functioning, for example, as a 1-bit memory element). According to other aspects of the present disclosure, more than two resistive states are used, allowing a single cell to store more than one bit of information. For example, a resistive change element cell might adjust its resistive change element between four non-volatile resistive states, allowing for the storage of two bits of information in a single cell.

Resistive change elements (and arrays thereof) are well suited for use as non-volatile memory devices for storing digital data (storing logic values as resistive states) within electronic devices (such as, but not limited to, cell phones, digital cameras, solid state hard drives, and computers). However, the use of resistive change elements is not limited to memory applications. Indeed, arrays of resistive change elements as well as the advanced architectures taught by the present disclosure could also be used within logic devices or within analog circuitry.

Typically, a resistive change element is adjusted (programmed) between different resistive states by applying electrical stimulus across the element. For example, one or more programming pulses of specific voltages, currents, and pulse widths (as required by the needs of a specific application) can be applied across a resistive change element to adjust the electrical resistance of a resistive change element from an initial resistance value to a new desired resistance value. A second programming pulse (or pulses) can be used to adjust the resistive change element back to the first initial resistive state or, depending on the specific application, a third resistive state.

Further, the state of a resistive change element can be determined, for example, by applying a DC test voltage across the resistive change element and measuring the current through the resistive change element. In some applications this current can be measured using a power supply with a current feedback output, for example, a programmable power supply or a sense amplifier. In other applications this current can be measured by inserting a current measuring device in series with the resistive change element. Alternatively, the state of a resistive change element can also be determined, for example, by driving a fixed DC current through the resistive change element and measuring the resulting voltage across the resistive change element. In both cases, the electrical stimulus applied to resistive change element is limited such as to not alter the resistive state of the resistive change element. In this way, a READ operation can determine the state of a resistive change element.

A resistive change element can be formed from a plurality of materials, such as, but not limited to, metal oxide, solid electrolyte, phase change material such as a chalcogenide glass, and carbon nanotube fabrics. For example, U.S. Pat. No. 7,781,862 to Bertin et al., incorporated herein by reference, discloses a two terminal nanotube switching device comprising first and second conductive terminals and a nanotube fabric article. Bertin teaches methods for adjusting the resistivity of the nanotube fabric article between a plurality of nonvolatile resistive states. In at least one embodiment, electrical stimulus is applied to at least one of the first and second conductive elements such as to pass an electric current through said nanotube fabric layer. By carefully controlling this electrical stimulus within a certain set of predetermined parameters (as described by Bertin in U.S. Pat. No. 7,781,862) the resistivity of the nanotube article can be repeatedly switched between a relatively high resistive state and relatively low resistive state. In certain embodiments, these high and low resistive states can be used to store a bit of information.

As described by the incorporated references, a nanotube fabric as referred to herein for the present disclosure comprises a layer of multiple, interconnected carbon nanotubes. A fabric of nanotubes (or nanofabric), in the present disclosure, e.g., a non-woven carbon nanotube (CNT) fabric, may, for example, have a structure of multiple entangled nanotubes that are irregularly arranged relative to one another. Alternatively, or in addition, for example, the fabric of nanotubes for the present disclosure may possess some degree of positional regularity of the nanotubes, e.g., some degree of parallelism along their long axes. Such positional regularity may be found, for example, on a relatively small scale wherein flat arrays of nanotubes are arranged together along their long axes in rafts on the order of one nanotube long and ten to twenty nanotubes wide. In other examples, such positional regularity maybe found on a larger scale, with regions of ordered nanotubes, in some cases, extended over substantially the entire fabric layer. Such larger scale positional regularity is of particular interest to the present disclosure.

While some examples of resistive change element cells and resistive change elements within the present disclosure specifically reference carbon nanotube based resistive change element cells and resistive change elements, the devices and methods of the present disclosure are not limited in this regard. Indeed, it will be clear to those skilled in the art that the devices and methods of the present disclosure are applicable to any type of resistive change element cell or resistive change element (such as, but not limited to, phase change and metal oxide).

Referring now to FIG. 1A, an exemplary architecture for a resistive change element array 100 is illustrated in a simplified schematic diagram. The resistive change element array 100 comprises a plurality of resistive change element cells CELL00-CELLxy, each resistive change element cell including a resistive change element SW00-SWxy and an in situ selection device Q00-Qxy.

The in situ selection devices Q00-Qxy are used within each resistive change element cell to provide a selectability function for that cell. That is, the in situ selection devices Q00-Qxy provide a means to access a desired resistive change element while isolating unselected elements. The in situ selection devices Q00-Qxy are field effect transistors (FETs) that permit current flow through the FET when the FET is turned on and prevent current flow through the FET when the FET is turned off. When the FETs are turned on current can flow from the source lines SL(0)-SL(x) into the bit lines BL(0)-BL(x) and from the bit lines BL(0)-BL(x) into the source lines SL(0)-SL(x) through the resistive change elements SW00-SWxy and the in situ selection devices Q00-Qxy. When the FETs are turned off current flow between the source lines SL(0)-SL(x) and the bit lines BL(0)-BL(x) through the resistive change elements SW00-SWxy and the in situ selection devices Q00-Qxy is prevented.

Each resistive change element SW00-SWxy has a first terminal and a second terminal. Each in situ selection device Q00-Qxy has a first terminal, a second terminal, and a gate terminal. A first terminal of each resistive change element SW00-SWxy is respectively electrically connected to a source line SL(0)-SL(x) and a second terminal of each resistive change element SW00-SWxy is respectively electrically connected to a first terminal of an in situ selection device Q00-Qxy. A second terminal of each in situ selection device Q00-Qxy is respectively electrically connected to a bit line BL(0)-BL(x) and a gate terminal of each in situ selection device Q00-Qxy is a respectively electrically connected to a word line WL(0)-WL(y).

The resistive change element cells CELL00-CELLxy within the resistive change element array 100 are selected for reading and programming operations using the source lines SL(0)-SL(x), the word lines WL(0)-WL(y), and the bit lines BL(0)-BL(x). Responsive to control signals applied to the word lines WL(0)-WL(y), the in situ selection devices Q00-Qxy within the individual array cells permit access or electrically isolate the resistive change elements SW00-SWxy. A specific individual cell (for example, CELL11) can be accessed by driving the associated word line (WL(1) for CELL11) with electrical stimuli sufficient to turn on the desired cell's in situ selection device (Q11 for CELL11). The electrical stimuli required to program (that is, SET or RESET) or READ the selected resistive change element (SW11 for CELL11) can then be applied across the source line (SL(1) for CELL11) and the bit line (BL(1) for CELL11) associated with the selected cell. When the in situ selection device (Q11 for CELL11) is turned on, current can flow from the source line (SL(1) for CELL11) into the bit line (BL(1) for CELL11) through the selected resistive change element (SW11 for CELL11) and the in situ selection device (Q11 for CELL11), and the provided programming or reading stimuli is driven across only the selected resistive change element. The in situ selection devices (Q10 for CELL10 and Q1y for CELL1y) are turned off for the other cells associated with the source line and the bit line being used for programming or reading because the in situ selection devices for the other cells are electrically connected to word lines (WL(0) for CELL10 and WL(y) for CELL1y) that are not driven with electrical stimuli sufficient to turn on the in situ selection devices for the other cells. In this way, the exemplary resistive change element array architecture 100 of FIG. 1A provides a means for individually accessing and addressing all of the cells within the array and directing applied electrical stimuli sufficient to program (that is, SET or RESET) or READ any of the cells within the array.

Figure 1B:
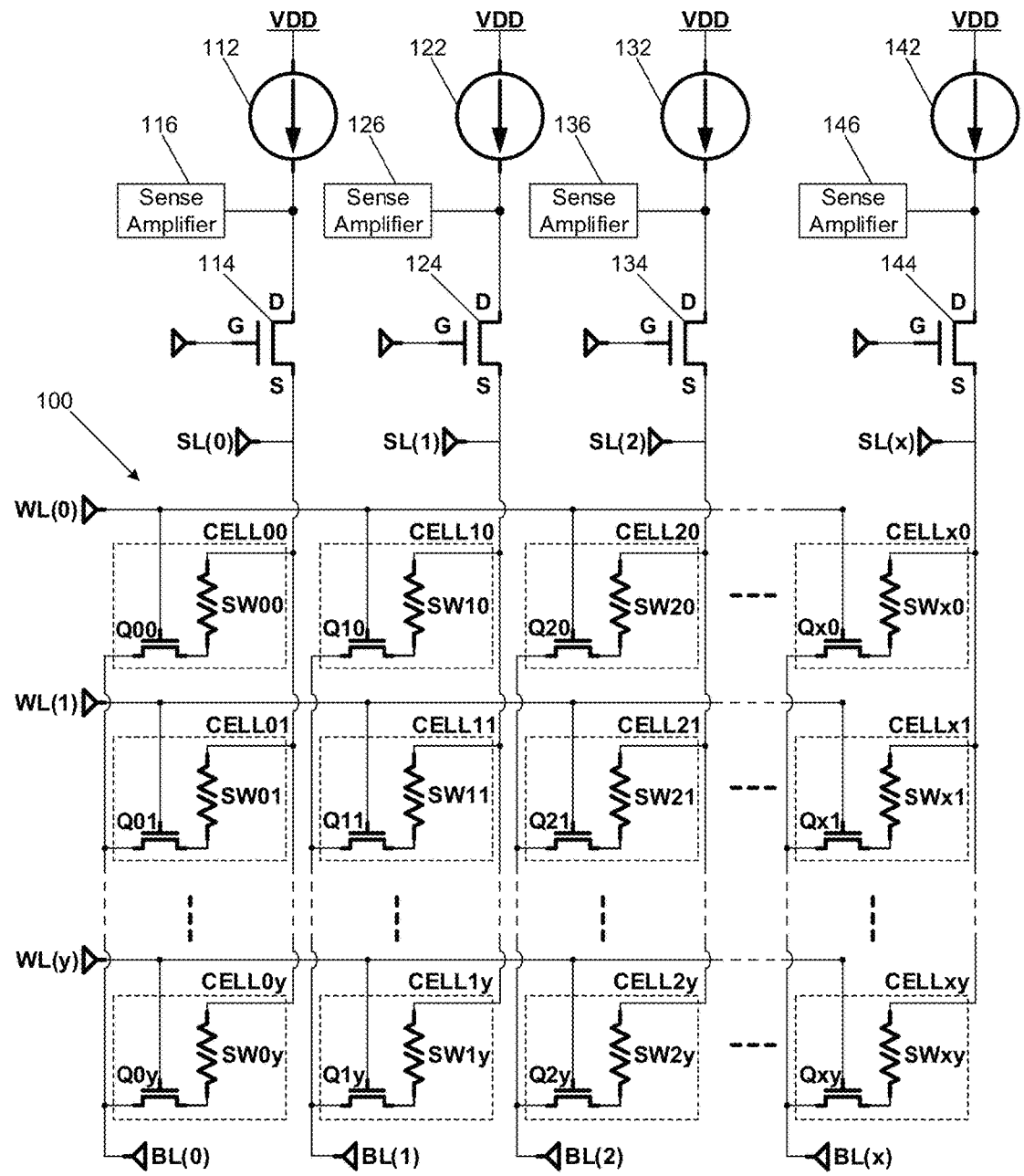
FIG. 1B illustrates a simplified schematic diagram of an exemplary architecture for determining resistive states of resistive change elements in an array of resistive change element cells where in situ selection devices are included within the resistive change element cells of the array.

Referring now to FIG. 1B, an exemplary architecture for determining resistive states of resistive change elements in the resistive change element array 100 by sensing current flow during READ operations is illustrated in a simplified schematic diagram. The resistive change element array 100 is electrically connected to n-channel metal oxide semiconductor field effect transistors (MOSFETs), 114, 124, 134, 144. Each n-channel MOSFET 114, 124, 134, 144, also referred to as an NMOS transistor, has a gate terminal, a source terminal, and a drain terminal. A gate terminal of each NMOS transistor 114, 124, 134, 144, can be respectively electrically connected to a voltage source or a driver circuit, a source terminal of each NMOS transistor 114, 124, 134, 144, is respectively electrically connected to a source line SL(0)-SL(x) of the resistive change element array 100, and a drain terminal of each NMOS transistor 114, 124, 134, 144, is respectively electrically connected to both an output terminal of a current source 112, 122, 132, 142, and an input terminal of sense amplifier 116, 126, 136, 146. The NMOS transistors 114, 124, 134, 144, have a threshold voltage VT greater than 0 volts. The threshold voltage VT refers to the gate to source voltage VGS required to turn on the NMOS transistors. The current sources 112, 122, 132, 142, supply an amount of current for determining a resistive state of a resistive change element. The sense amplifiers 116, 126, 136, 146, receive an input voltage and generate an output voltage that corresponds with a logic value.

Figure 1C:
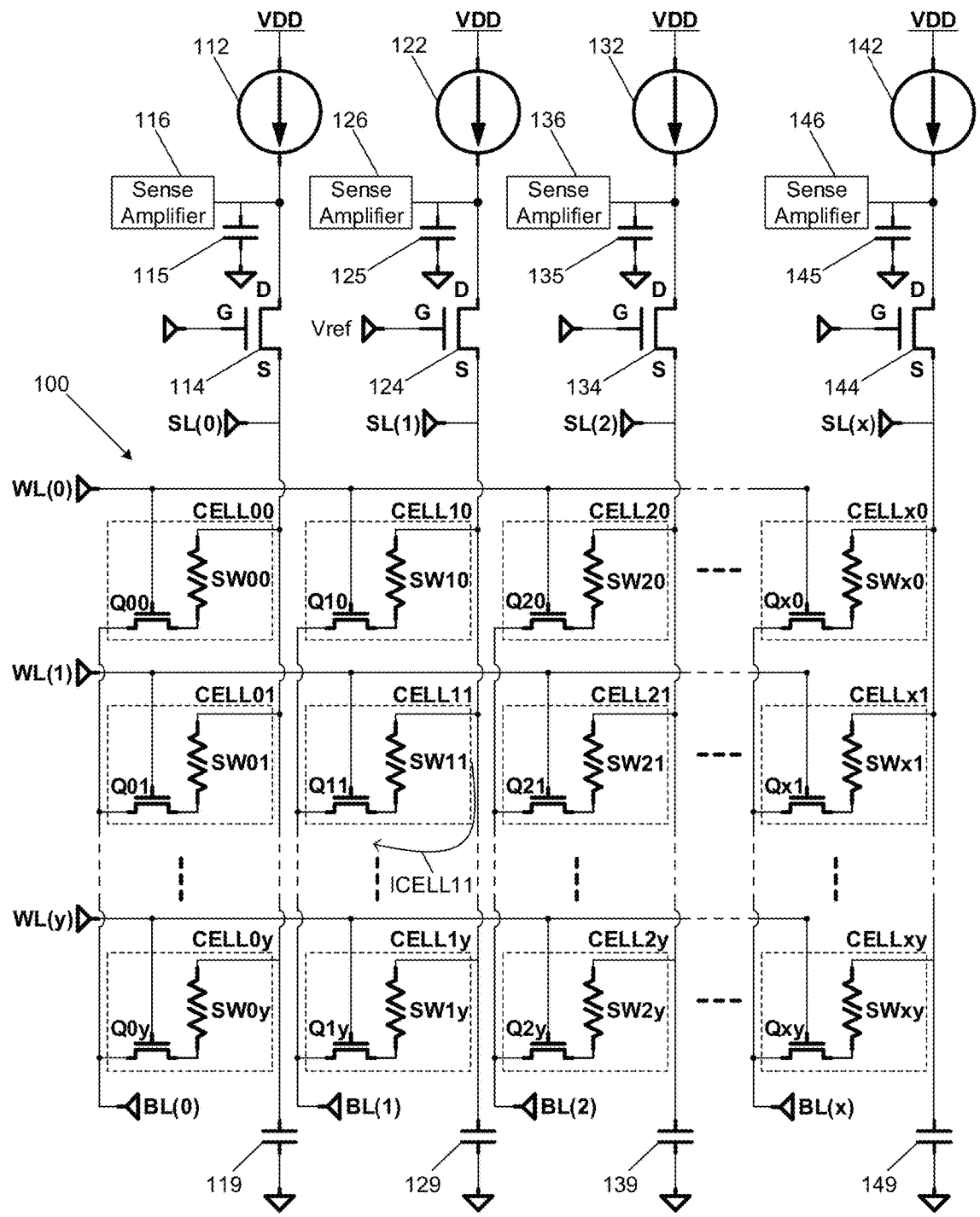
FIG. 1C illustrates a simplified schematic diagram showing current flow through a resistive change element cell during a read operation of the resistive change element cell in an exemplary architecture for determining resistive states of resistive change elements in an array of resistive change element cells where in situ selection devices are included within the resistive change element cells of the array.
Figure 1D:
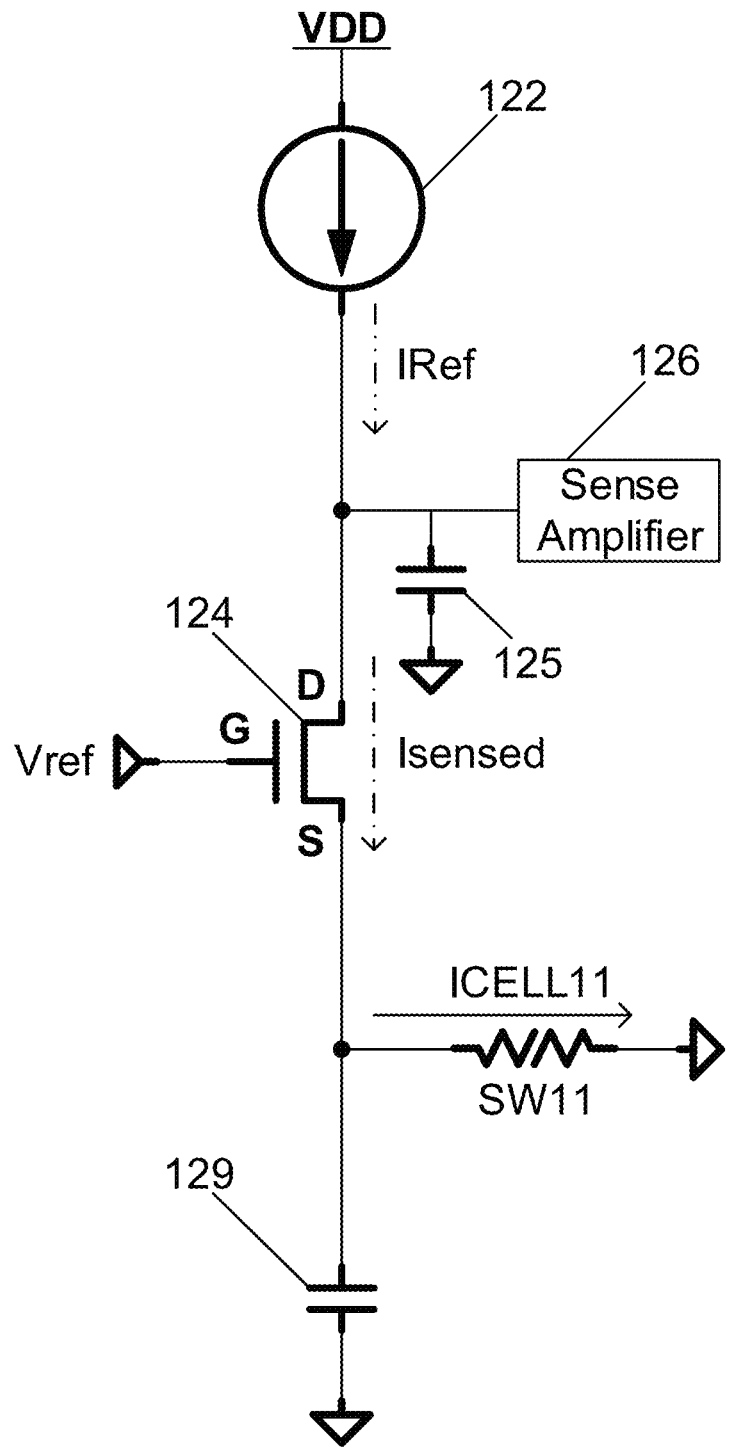
FIG. 1D illustrates a simplified schematic diagram showing current through an NMOS transistor and current flow on a source line during a read operation of a resistive change element cell in an exemplary architecture for determining resistive states of resistive change elements in an array of resistive change element cells where in situ selection devices are included within the resistive change element cells of the array.

FIG. 1C illustrates a simplified schematic diagram showing current flow through CELL11 during a READ operation of CELL11 in the exemplary architecture for determining resistive states of resistive change elements in the resistive change element array 100 by sensing current flow during READ operations. The READ operation of CELL11 will be explained in detail below, and READ operations of each cell in the resistive change element array 100 can be performed in a similar manner to the READ operation of CELL11. FIGS. 1C-1D additionally show parasitic capacitances that visually illustrate capacitances of other connections and components. FIG. 1C shows the parasitic capacitances 115, 125, 135, 145, of the lines electrically connecting the sense amplifier 116, 126, 136, 146, to the current sources 112, 122, 132, 142, and to the NMOS transistors 114, 124, 134, 144, and the parasitic capacitances 119, 129, 139, 149, of the source lines SL(0)-SL(x). The parasitic capacitances 115, 119, 125, 129, 135, 139, 145, 149, are not separate circuit components but rather the parasitic capacitances 115, 119, 125, 129, 135, 139, 145, 149, visually illustrate capacitances of other connections and components. It is noted that the parasitic capacitances 115, 119, 125, 129, 135, 139, 145, 149, are not shown in FIG. 1B and that the parasitic capacitances are shown in FIG. 1C-1D for the purpose of referring to the parasitic capacitances during the READ operation of CELL11.

The READ operation of CELL11 starts by selecting CELL11 from the plurality of resistive change element cells CELL00-CELLxy of the resistive change element array 100. Selecting CELL11 from the plurality of resistive change element cells CELL00-CELLxy begins by driving each of the word lines WL(0)-WL(y) to a voltage level sufficient to turn off the in situ selection devices Q00-Qxy and charging the source line SL(1) to a voltage level sufficient to turn off the NMOS transistor 124. The word lines WL(0)-WL(y) can be driven to the voltage level sufficient to turn off the in situ selection devices Q00-Qxy by driver circuits or voltage sources. The source line SL(1) can be charged to the voltage level sufficient to turn off the NMOS transistor 124 by driving the source line SL(1) with the current source 122, driver circuits, or voltage sources, and then, discontinuing driving the source line SL(1) when the voltage level sufficient to turn off the NMOS transistor 124 is reached. The source line SL(1) can be charged to the voltage level sufficient to turn off the NMOS transistor 124 due to the parasitic capacitance 129 of the source line SL(1). When each of the word lines WL(0)-WL(y) are driven to the voltage level sufficient to turn off the in situ selection devices Q00-Qxy, current flow from the source lines SL(0)-SL(x) into the bit lines BL(0)-BL(x) through the resistive change elements SW00-SWxy and the in situ selection devices Q00-Qxy is prevented because the in situ selection devices are turned off. When the source line SL(1) is charged to the voltage level sufficient to turn off the NMOS transistor 124, current flow through the NMOS transistor 124 into the source line SL(1) is prevented because the NMOS transistor 124 is turned off. When the NMOS transistor 124 is turned off the current source 122 drives a voltage Vout of both the parasitic capacitance 125 and the input capacitance of the sense amplifier 126 to a power supply voltage VDD.

Selecting CELL11 from the plurality of resistive change element cells CELL00-CELLxy concludes by discontinuing driving the word line WL(1) to a voltage level sufficient to turn off the in situ selections devices electrically connected to the word line WL(1), driving the word line WL(1) to a voltage level sufficient to turn on the in situ selection device Q11 for CELL11, driving the bit line BL(1) to 0 volts or ground, driving bit lines BL(0), BL(2), and BL(x) to a voltage level sufficient to prevent current flow into the bit lines BL(0), BL(2), and BL(x) or alternatively holding bit lines BL(0), BL(2), and BL(x) in a high impedance state to prevent current flow into the bit lines BL(0), BL(2), and BL(x), and driving the gate of the NMOS transistor 124 to the reference voltage Vref. The bit lines BL(0)-BL(x) and the gate of the NMOS transistor 124 can be driven to the desired voltages by driver circuits or voltage sources.

When the word line WL(1) is driven to a voltage level sufficient to turn on the in situ selection device Q11 and the bit line BL(1) is driven to 0 volts or ground, current flows from the source line SL(1) into the bit line BL(1) through the resistive change element SW11 and the in situ selection device Q11. The current flowing through CELL11, for a given voltage VSL1 on the source line SL(1) and ignoring the resistance of the in situ selection device Q11, can be approximated using Ohm's Law as ICELL11=VSL1/RCELL11, where RCELL11 is the resistance of the resistive change element SW11 within CELL11. It is noted that no leakage current flows between the source line SL(1) and the bit line BL(1) because the in situ selection devices are turned off for the other cells, CELL10 and CELL1y, electrically connected to the source line SL(1) and the bit line BL(1). When the current ICELL11 flows through CELL11 the voltage on the source line SL(1) drops from the voltage level sufficient to turn off the NMOS transistor 124.

The voltage drop on the source line SL(1) causes the gate to source voltage VGS of the NMOS transistor 124 to increase because the voltage on the source line SL(1) corresponds with the source voltage VS and the voltage on the source line SL(1) drops while the gate voltage VG remains at the reference voltage Vref. The gate to source voltage VGS can be approximately determined by using Equation No. 1: VGS=VG−VS, with the gate voltage VG being the reference voltage Vref and the source voltage VS being the voltage on the source line SL(1). For example, as shown by the above Equation No. 1, when the voltage on the source line SL(1) drops 1 millivolt while the reference voltage Vref remains constant the gate to source voltage VGS of the NMOS transistor 124 will increase by 1 millivolt, the amount of the voltage drop on the source line SL(1). When the gate to source voltage VGS is greater than the threshold voltage VT, the NMOS transistor 124 is turned on and current can flow through the NMOS transistor 124 into the source line SL(1).

The current flow through the NMOS transistor 124 and the current flow on source line SL(1) during the READ operation of CELL11 are explained in further detail below with reference to the simplified schematic diagram of FIG. 1D. The simplified schematic diagram of FIG. 1D shows the current source 122, the NMOS transistor 124, the parasitic capacitance 125, the sense amplifier 126, the parasitic capacitance 129, and the resistive change element SW11. The simplified schematic of FIG. 1D does not show the rest of the architecture of FIG. 1C so that the current flow can be shown with greater clarity. The current Iref illustrates current supplied by the current source 122, the current Isensed illustrates current flowing through the NMOS transistor 124, and the current ICELL11 illustrates current flowing through CELL11. The amount of each of the current Iref, the current Isensed, and the current ICELL11, can each vary based on the resistive state of the resistive change element SW11 within CELL11. The amount of each of the current Iref, the current Isensed, and the current ICELL11, also can each vary during the READ operation of CELL11.

The flow of the current ICELL11 through CELL11 causes the voltage on the source line SL(1) to drop. When the resistive change element SW11 has a low resistive state, a large current ICELL11 flows through CELL11 and causes the voltage on the source line SL(1) to drop to a first source line voltage less than the reference voltage Vref. When the resistive change element SW11 has a high resistive state, a small current ICELL11 flows through CELL11 and causes the voltage on the source line SL(1) to drop to a second source line voltage greater than the first source line voltage. The large current ICELL11 is greater than the small current ICELL11. The amount of the current ICELL11, for a given voltage VSL1 on the source line SL(1) and ignoring the resistance of the in situ selection device Q11, can be approximated using Ohm's Law as ICELL11=VSL1/RCELL11, where RCELL11 is the resistance of the resistive change element SW11 within CELL11. As shown by the above equation, for a given voltage VSL1 on the source line SL(1), the amount of the current ICELL11 will be larger when the resistive change element SW11 has a low resistive state, for example a resistance on the order of 100 k$\Omega$ (corresponding, typically, to a logic '1,' a SET state), and the amount of the current ICELL11 will be smaller when the resistive change element SW11 has a high resistive state, for example a resistance on the order of 10 M$\Omega$ (corresponding, typically, to a logic '0,' a RESET state).

The current Isensed flows into the source line SL(1) when the voltage on the source line SL(1) drops to a voltage level where the gate to source voltage VGS of the NMOS transistor 124 is greater than the threshold voltage VT. A potential amount of current Isensed that can flow through the NMOS transistor 124 into the source line SL(1) is based on the difference between the reference voltage Vref and the voltage on the source line SL(1), which as discussed above, corresponds with the gate to source voltage VGS. The potential amount of current that can flow through the NMOS transistor 124 generally increases as the gate to source voltage VGS increases beyond the threshold voltage VT and generally decreases as the gate to source voltage VGS decreases toward the threshold voltage VT.

When the resistive change element SW11 has a low resistive state, the gate to source voltage VGS of the NMOS transistor 124 will increase to a first gate to source voltage VGS because the voltage on the source line SL(1) drops to the first source line voltage due to the large current ICELL11. The gate to source voltage VGS increasing to the first gate to source voltage VGS causes the potential amount of current Isensed that can flow through the NMOS transistor 124 into the source line SL(1) to increase to a first large potential amount of current. When the resistive change element SW11 has a high resistive state, the gate to source voltage VGS of the NMOS transistor 124 increases a smaller amount to a second gate to source voltage VGS because the voltage on the source line SL(1) drops to the second source line voltage due to the small current ICELL11. The gate to source voltage VGS increasing to the second gate to source voltage VGS causes the potential amount of current Isensed that can flow through the NMOS transistor 124 into the source line SL(1) to increase a second small potential amount of current. Thus, when the resistive change element SW11 has low resistive state the potential amount of current Isensed will increase to the first large potential amount of current and when the resistive change element SW11 has a high resistive state the potential amount of current Isensed will increase to the second small potential amount of current. It is noted that the first gate to source voltage VGS is greater than the second gate to source voltage VGS and the first large potential amount of current is greater than the second small potential amount of current.

The current source 122 supplies an amount of current for determining the resistive state of the resistive change element SW11. The amount of current supplied by the current source 122 is limited to a set amount of current. The set amount of current that can be supplied by the current source 122 is set such that the large current ICELL11 is greater than the set amount of current that can be supplied by the current source 122 and the small current ICELL11 is less than the set amount of current that can be supplied by the current source 122. Additionally, the first large potential amount of current Isensed is greater than the set amount of current that can be supplied by the current source 122 and the second small potential amount of current Isensed is less than the set amount of current that can be supplied by the current source 122.

The resistive state of the resistive change element SW11 is determined based on the potential amount of current Isensed that can flow through the NMOS transistor 124 and the set amount of current that can be supplied by the current source 122. The resistive state of the resistive change element SW11 is determined to be a low resistive state when the potential amount of current Isensed that can flow through the NMOS transistor 124 is greater than the set amount of current that can be supplied by the current source 122. The resistive state of resistive change element SW11 is determined to be a high resistive state when the potential amount of current Isensed that can flow through the NMOS transistor 124 is less than the set amount of current that can be supplied by the current source 122.

When the potential amount of current Isensed increases to the first large potential amount of current, the set amount of current supplied by the current source 122 and a discharge current sufficient to discharge the voltage Vout of both the parasitic capacitance 125 and the input capacitance of the sense amplifier 126 from the voltage VDD to approximately the voltage on the source line SL(1) flow through the NMOS transistor 124 into the source line SL(1). The voltage Vout of both the parasitic capacitance 125 and the input capacitance of the sense amplifier 126 drops from the voltage VDD to approximately the voltage on the source line SL(1) because the discharge current flows through the NMOS transistor 124 into the source line SL(1). When the potential amount of current Isensed increases to the second small potential amount of current, the set amount of current supplied by the current source 122 and a discharge current sufficient to discharge the voltage Vout of both the parasitic capacitance 125 and the input capacitance of the sense amplifier 126 from the voltage VDD to approximately the voltage on the source line SL(1) do not flow through the NMOS transistor 124 into the source line SL(1). The voltage Vout of both the parasitic capacitance 125 and the input capacitance of the sense amplifier 126 remains at approximately the voltage VDD because the discharge current does not flow through the NMOS transistor 124 into the source line SL(1). Thus, the voltage level of the voltage Vout is determined by the relationship between the potential amount of current that can flow through the NMOS transistor 124 and the set amount of current that can be supplied by the current source 122 and the voltage Vout having a voltage level of approximately the voltage on the source line SL(1) indicates that the resistive change element SW11 has a low resistive state and the voltage Vout having a voltage level of approximately VDD indicates the resistive change element SW11 has a high resistive state.

The sense amplifier 126 receives the voltage Vout as an input voltage and after at least a first amount of time for discharge the sense amplifier 126 outputs a voltage based on the voltage level of the voltage Vout. When the sense amplifier 126 receives the voltage Vout having a voltage level of approximately the voltage on the source line SL(1), after at least the first amount of time for discharge the sense amplifier 126 outputs a voltage that corresponds with a logic 1. When the sense amplifier 126 receives the voltage Vout having a voltage level of approximately VDD, after at least the first amount of time for discharge the sense amplifier 126 outputs a voltage that corresponds with a logic 0.

The first amount of time for discharge refers to the amount of time from the start of a read operation of CELL11 with the resistive change element SW11 in a low resistive state until the voltage Vout of both the parasitic capacitance 125 and the input capacitance of the sense amplifier 126 drops from the voltage VDD to approximately the voltage on the source line SL(1). READ operations performed when the resistive change element SW11 has a low resistive state and when the resistive change element SW11 has a high resistive state both wait the first amount of time for discharge before outputting a voltage based on the voltage level of the voltage Vout, even though a discharge current sufficient to discharge the voltage Vout of both the parasitic capacitance 125 and the input capacitance of the sense amplifier 126 does not flow through the NMOS transistor 124 when the resistive change element SW11 has a high resistive state. The first amount of time for discharge is part of the total amount of time to perform a READ operation of CELL11. It is noted that the first amount of time for discharge is affected by the size of the parasitic capacitance 125 and the of size input capacitance of the sense amplifier 126 and that a circuit designer can adjust the size of the parasitic capacitance 125 and the size of the input capacitance of the sense amplifier 126 through circuit design.

As described above, determining the resistive states of the resistive change elements in the resistive change element cells in the resistive change element array 100 of FIGS. 1A-1C requires each cell be responsive to three separate control lines. Further, the resistive change element array 100 of FIGS. 1A-1C requires each cell include a FET as an in situ selection device, and the FET be power rated high enough to withstand the programming voltages required by the resistive change elements being used within the array. This can, in certain applications, result in an in situ selection device that is significantly large as compared to the physical size of the resistive change element being used or even as compared to the desired physical dimension boundaries of an array cell. As resistive change element arrays are scaled down and cell densities increased, these and other design requirements of the resistive change element array architecture 100 of FIGS. 1A-1C can represent, within certain applications, significant limitations with respect to the both circuit design and scaling.

Figure 2:
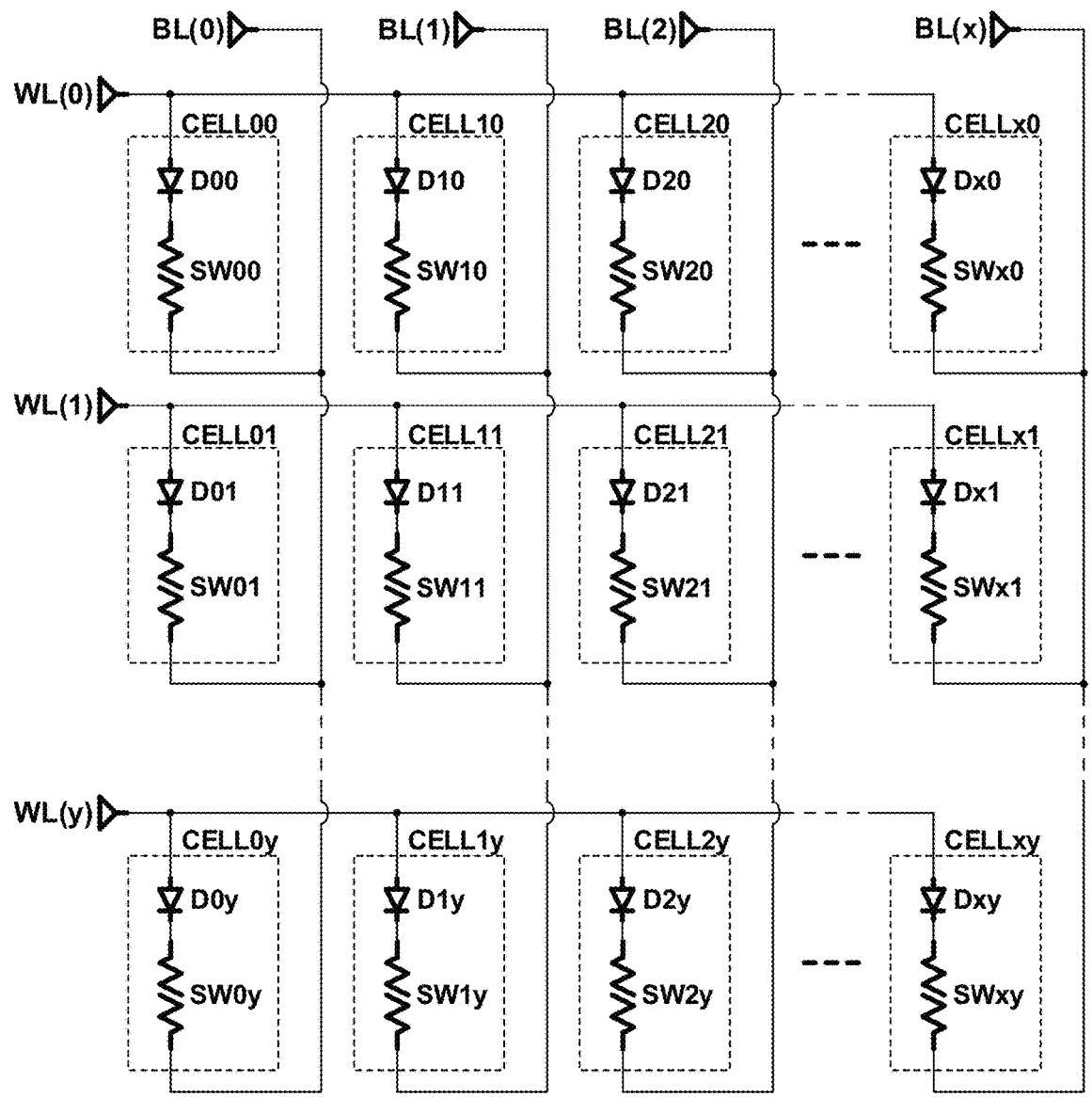
FIG. 2 illustrates a simplified schematic diagram of an exemplary architecture for an array of resistive change element cells where diode selection devices are used as in situ selection devices within the resistive change element cells of the array.

Referring now to FIG. 2, an exemplary architecture for a resistive change element array 200 is illustrated in a simplified schematic diagram. The resistive change element array 200 comprises a plurality of resistive change element cells CELL00-CELLxy, each cell resistive change element including a resistive change element SW00-SWxy and an in situ selection device Q00-Qxy.

The in situ selection devices Q00-Qxy are diodes used within each resistive change element cell to provide a selectability function for that cell. That is, the diode devices D00-Dxy provide a means to access a desired resistive change element while isolating unselected elements. Each diode device has an anode terminal and a cathode terminal. Each resistive change element SW00-SWxy has a first terminal and a second terminal. An anode terminal of each diode device D00-Dxy is respectively electrically connected to a word line WL(0)-WL(y) and a cathode terminal of each diode device D00-Dxy is respectively electrically connected to a first terminal of a resistive change element SW00-SWxy. A second terminal of each resistive change element SW00-SWxy is respectively electrically connected to a bit line BL(0)-BL(x). The individual array cells CELL00-CELLxy within resistive change element array 200 are selected for reading and programming operations using word lines WL(0)-WL(y) and bit lines BL(0)-BL(x) as will be described below.

By driving the words lines WL(0)-WL(y) and the bit lines BL(0)-BL(x) with a specific bias, the resistive change element array architecture 200 of FIG. 2 can enable a selected cell by forward biasing that cell's selection diode while either reverse biasing or simply providing no voltage drop across the selection diodes of the remaining unselected cells. For example, to access CELL00 a sufficient READ, SET, or RESET voltage (or current) is applied to WL(0) while BL(0) is driven to 0 volts or ground. The remaining word lines WL(1)-WL(y) are driven to 0 volts or ground, and the remaining bit lines BL(1)-BL(x) are driven at the same voltage supplied to WL(0). In this way, the selection diodes within the remaining cells on the selected bit line BL(0), CELL01 and CELL0y, remain unbiased, each of the cells seeing 0 volts or ground on both its associated word line and its associated bit line. Similarly, the selection diodes within the remaining cells on the selected word line WL(0), CELL10, CELL20, and CELLx0, also remain unbiased, each of those cells seeing the applied programming or READ voltage on both its associated word line and its associated bit line. And finally, the selection diodes within the remaining cells in the array, CELL11, CELL21, CELLx1, CELL1y, CELL2y, and CELLxy, are reversed biased, each of those cells seeing 0V or ground on its associated word line and the applied programming voltage or READ voltage on its associated bit line. In this way, only diode device D00 is forward biased, and the applied programming or READ voltage (or current) is applied only over the selected resistive change element SW00.

As described above, the resistive change element array architecture 200 of FIG. 2 provides an addressing scheme that requires each cell be responsive to only two separate control lines as compared with the three control lines required by the resistive change element array architecture 100 of FIG. 1. While this represents a significant simplification in architecture and layout, the resistive change element array architecture 200 of FIG. 2 still requires that each cell include an in situ selection device (a diode in this case). As with the FET selection device of array architecture 100 of FIG. 1, this selection diode must be power rated high enough to withstand the programming voltages required by the resistive change elements being used within the array—this includes a reverse bias rating greater than the programming voltage and current required by the resistive change element being used. As with the FET selection devices of FIG. 1, this can, in certain applications, result in a diode selection device that is significantly large as compared to the physical size of the resistive change element being used or even as compared to the desired physical dimension boundaries of an array cell. Additionally, the array architecture 200 of FIG. 2 does not permit bipolar operation of the resistive change elements. That is, programming (SET and RESET) currents and READ currents can only be applied in only one direction: the polarity associated with the forward bias direction of the selection diodes. In certain applications, bipolar operation—for example, wherein a SET operation would be performed with an electric current flowing through a resistive change element from a bit line to word line, and a RESET operation would be performed with a current flowing from a word line to a bit line—is desirable within a programming scheme for a particular resistive change element technology or configuration. As resistive change element arrays are scaled down and cell densities increased, these and other design requirements of the resistive change element array architecture 200 of FIG. 2 can represent, within certain applications, significant limitations with respect to the both circuit design and scaling.

Figure 3:
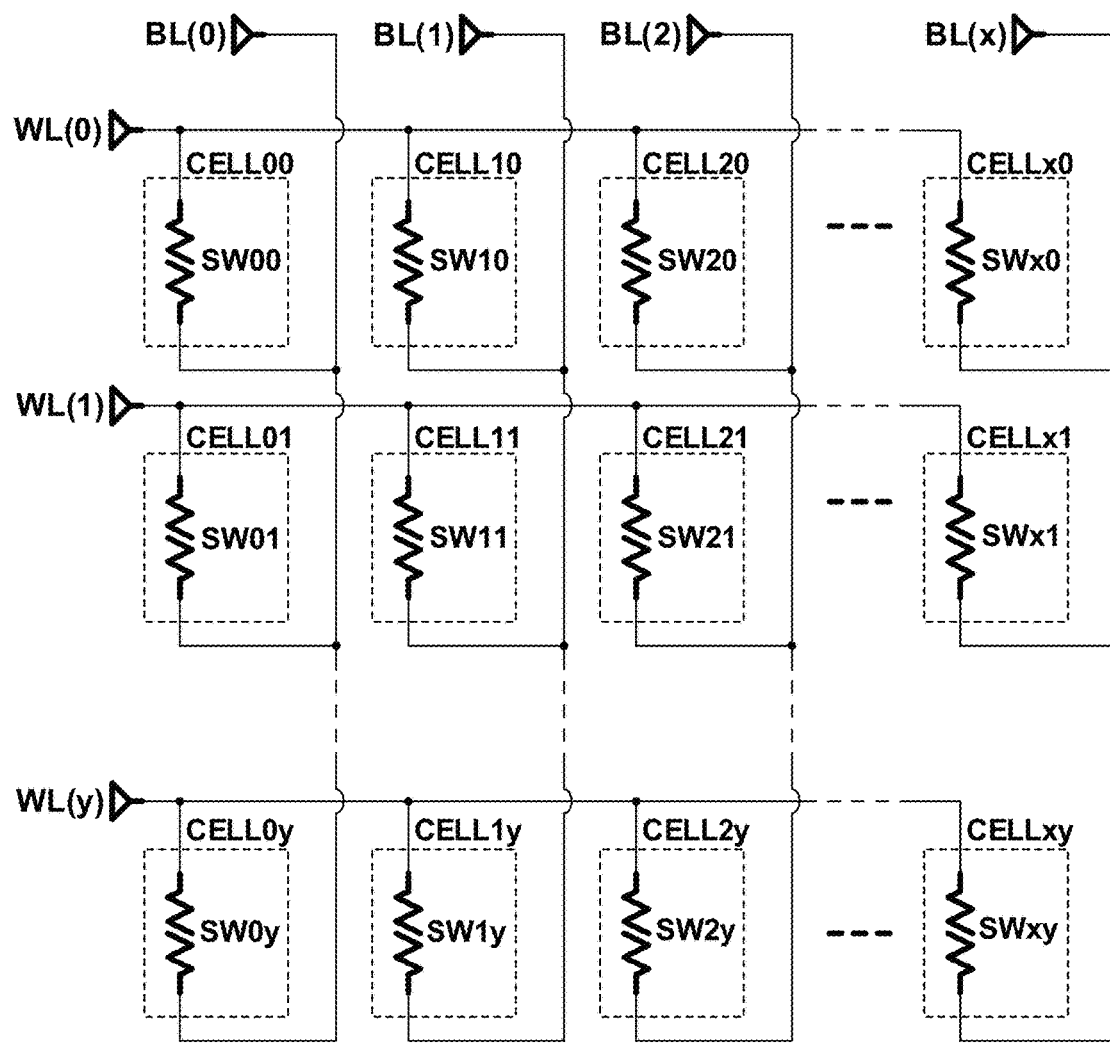
FIG. 3 illustrates a simplified schematic diagram of an exemplary architecture for an array of 1-R resistive change element cells where no in situ selection devices or other current limiting devices are included within the 1-R resistive change element cells of the array.

Referring now to FIG. 3, an exemplary architecture for a 1-R resistive change element array 300 is illustrated in a simplified schematic diagram. The 1-R resistive change element array 300 comprises a plurality of resistive change element cells CELL00-CELLxy, and each resistive change element cell includes a resistive change element SW00-SWxy that is accessed via two control lines (a word line and a bit line) and does not include an in situ selection device or other current limiting element. The resistive change element cells CELL00-CELLxy are referred to as 1-R resistive change element cells because the resistive change element cells include a resistive change element and do not include an in situ selection device or other current limiting element. Additionally, the 1-R resistive change element array 300 is referred to as a 1-R resistive change element array because the resistive change element array 300 includes 1-R resistive change element cells.

Each resistive change element SW00-SWxy has a first terminal respectively electrically connected to a word line WL(0)-WL(y) and a second terminal respectively electrically connected to a bit line BL(0)-BL(y). The resistive change elements can be two-terminal nanotube switching elements, phase change memory elements, metal oxide memory elements, or conductive bridge memory elements as well as other materials and designs.

The 1-R resistive change element array 300 can address individual resistive change element cells within the array by driving the word lines WL(0)-WL(y) and the bit lines BL(0)-BL(x) with a specific bias. In the absence of any in situ selection devices within the individual array cells CELL00-CELLxy, an access operation to array architecture 300 must provide a sufficient electrical stimulus—as required for a programming (SET or RESET) or READ operation—to a selected array cell and, at the same time, prevent the other cells in the array from experiencing any electrical stimuli that would alter their stored resistive state.

For example, to access CELL11 within the 1-R resistive change element array 300, a sufficient READ, SET, or RESET voltage (or current) is applied to the word line WL(1) while the bit line BL(1) is driven to 0 volts or ground. The remaining word lines WL(0) and WL(y) and the remaining bit lines BL(0), BL(2), and BL(x) are driven at half the voltage (or current) supplied to the word line WL(1). In this way, only half of an applied programming or READ voltage (or current) is applied to the resistive change elements within the remaining cells on the selected bit line BL(1), CELL10 and CELL1y, and is applied to the resistive change elements within the remaining cells on the selected word line WL(1), CELL01, CELL21, and CELLx1. That is, CELL10 and CELL1y each see half of the applied programming or READ voltage on their associated word line and 0V or ground on their associated bit lines, and CELL01, CELL21, and CELLx1 see the full programming or READ voltage on their associated word lines but only half the programming or READ voltage on their associated bit line. The remaining cells in the array are unbiased, each of those cells seeing half of the applied programming or READ voltage (or current) on both its associated word line and on its associated bit line, resulting in no voltage drop or current flow across/through the resistive change elements in those cells. In this way, the applied programming or READ voltage is applied only over the selected resistive change element SW11 within CELL11, and while some of the unselected cells within the array are partially biased during the access and addressing operation, the electrical stimuli applied to those cells is not sufficient to alter the resistive state of those cells or disturb the programming or READ operation being performed on the selected cell.

Figure 4:
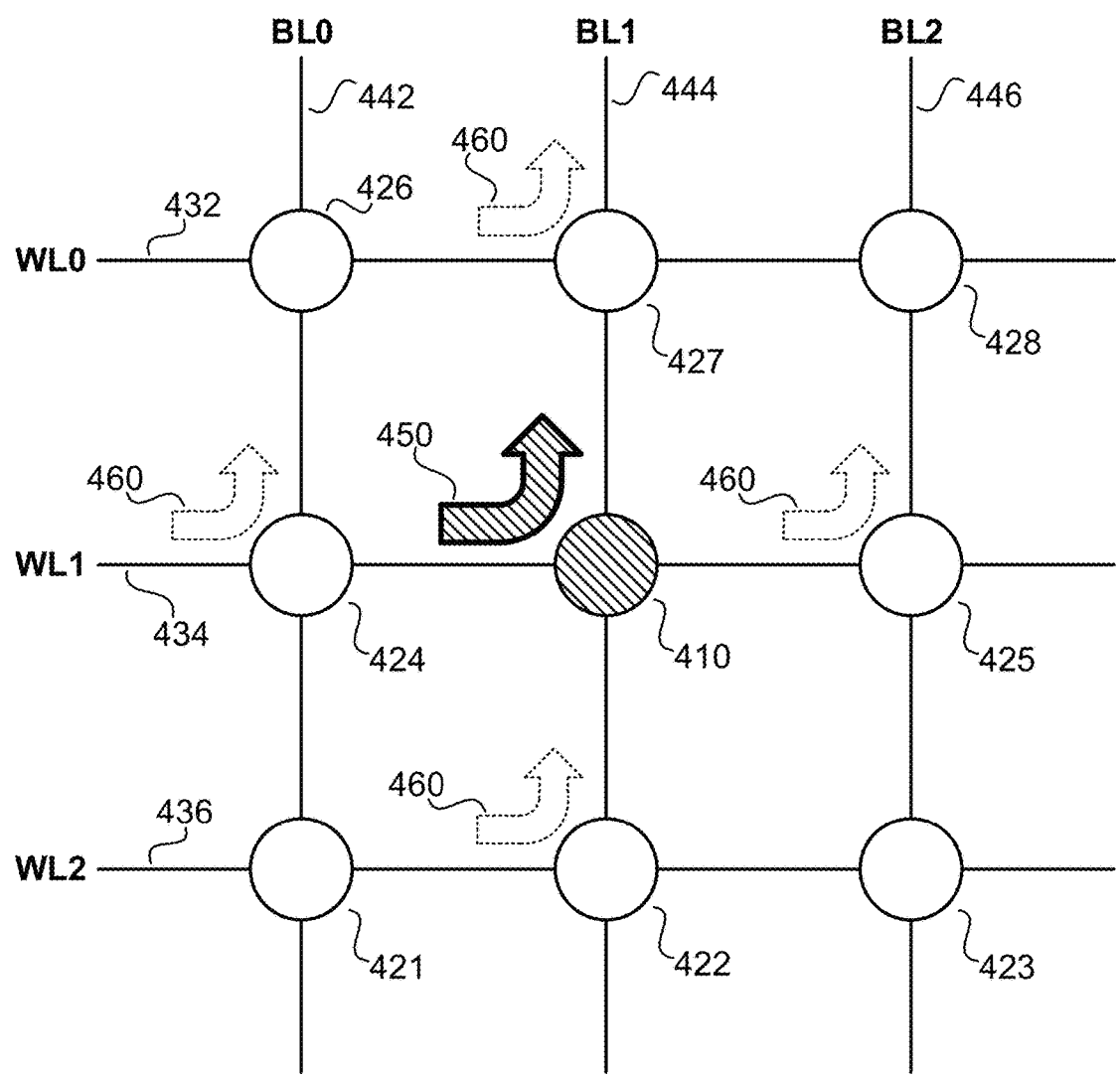
FIG. 4 illustrates a diagram showing leakage current flows present within a 1-R resistive change element array architecture (as shown in FIG. 3, for example) during a static DC programming or read operation.

FIG. 4 is a diagram 400 illustrating the electric currents through a selected cell and also the cells adjacent to a selected cell during a static DC programming or READ operation performed on the 1-R resistive change element array of FIG. 3 (as is described with respect to FIG. 3 above). Within the diagram 400, the selected cell 410 is accessed by driving a sufficient programming (SET or RESET) or READ voltage (such voltage requirements determined by the specific needs of a particular application or type of resistive change element being used) onto the word line WL1 and pulling the bit line BL1 down to 0 volts or ground. Responsive to this applied electrical stimuli, a programming or READ current 450 is generated from the word line WL1 to the bit line BL1 through the selected resistive change cell 410. Additionally, (as described in detail above with respect to FIG. 3), a voltage at half the level of the voltage applied to WL1 is applied to the unselected word lines WL0 and WL2 and the unselected bit lines BL0 and BL2. In this way, unselected cells 421, 423, 426, and 428 remain unbiased (each of these cells seeing half of the applied programming or READ voltage on both its associated bit line and its associated word line). And unselected cells 422, 424, 425, and 427 become biased at half the voltage applied to WL1, generating a leakage current 460 through those cells. As described above, with careful selection of programming voltages, currents, and design parameters of the resistive change elements themselves, these leakage currents 460 remain insufficient to alter the resistive state of unselected cells 422, 424, 425, and 427 or to disturb the programming or READ operation on selected cell 410.

As discussed above, the array architecture 300 detailed in FIG. 3 provides a circuit structure that, as with the array architecture 200 of FIG. 2, requires each cell be responsive to only two separate control lines as compared with the three control lines required by the array architecture 100 of FIGS. 1A-1C. Further, the array architecture 300 as detailed in FIG. 3 does not require an in situ selection device or other current limiting device with each resistive change element, and array architecture 300 allows for bipolar operation (that is, programming or READ currents can flow from word line to bit line or bit line to word line, as befits the needs of a specific application or a specific resistive change element technology). U.S. Patent Application Publication No. 2014/0166959 to Bertin et al. incorporated by reference herein in its entirety, teaches this type of architecture for a resistive change element array and describes some methods (as discussed above) for programming and reading cells within such an array.

This 1-R cell array architecture 300 detailed in FIG. 3 (and discussed within US 2014/0166959 to Bertin et al.) represents a further significant improvement and simplification with respect to circuit architecture and layout (as compared with array architectures 100 and 200 of FIGS. 1 and 2) for certain applications. For example, scaling of cell size within array architecture 300 is limited only by the physical dimension requirements of the resistive change elements themselves. Further, as each resistive change element cell only includes one device (the resistive change element itself) and two interconnections (a bit line electrically coupled to the first terminal of the resistive change element and a word line electrical coupled to the second terminal of the resistive change element), the complexity of the resistive change element array is significantly reduced, providing—within certain applications—numerous benefits with respect to ease of fabrication, cost, increased ability for scaling, and circuit integration. As such, the simplified array architecture 300 as detailed in FIG. 3 (or a similar variation, such as, for example, the array structure shown in FIG. 5, 6A-6C, or 9A-9C) is highly desirable as the state of the art continues to demand higher density resistive change element arrays.

However, while array architecture 300 (and similar variations) are highly desirable within certain applications, the static DC programming and reading methods as described above and detailed with respect to FIGS. 3 and 4 (and those methods discussed in US 2014/0166959 to Bertin et al.) can represent, within certain applications, limitations with respect to the layout and design of a resistive change element array. The leakage currents 460 inherent within static DC programming and READ operations as described with respect to FIG. 4, for example, can, within certain applications, introduce certain design restrictions within a resistive change element array. For example, such a programming method can require, in certain applications, that the nominal SET and RESET resistance values used within a specific resistive change element be significantly far apart as compared with a resistive change element used within other architectures (the resistive change element arrays 100 and 200 in FIGS. 1 and 2, for example). Such a wide range in nominal resistance values could, for example, introduce physical dimension requirements within a nanotube fabric or a chalcogenide block used with the resistive change element making up the cells of the arrays.

In another example, the length of the bit lines and the word lines used within the resistive change element array can be, in certain applications, limited due, in part, to the leakage currents 460 detailed in FIG. 4. With respect to a READ operation, for example, as the number of cells (or bits) per bit line increases, the READ signal to the sense amplifier is reduced, thereby limiting the number of cells (or bits) per bit line to ensure sufficient signal voltage to the sense amplifier. Also, the capacitance inherent in very long array lines can—again, in certain applications—allow these small currents to flow through unselected cells as the lines themselves charge up to their required voltages. While these leakage current values might be small in amount as compared to a required programming current, for example, the prolonged current flow can, if not carefully considered within the array design, be enough to alter the resistance value stored in an unselected cell or inhibit or otherwise adversely affect a programming or READ operation. Such a limitation can, in certain applications, require bit lines and words lines to be limited to a certain length to reduce the number of cells and line capacitance.

Further, in another example, the access and addressing method detailed in FIG. 4 can, in certain applications, require higher SET, RESET, and READ currents as compared to other resistive change element array architectures (the resistive change element arrays 100 and 200 in FIGS. 1 and 2, for example). Many of the leakage currents 460 shown in FIG. 4, for example, are driven by the same driver circuit, i.e.: the external circuit driving the READ voltage or the programming voltage on the word line WL1. Within an array architecture such as is shown in FIG. 2, for example, only the selected cell would be biased and enabled, and the entire supplied current would flow through the selected resistive change element. However, as is shown in FIG. 4, using a static DC programming or READ method within an array structure such as is shown in FIG. 3 (wherein the array cells contain no selection element) a supplied READ or programming current is driven through not only the selected cell, but also many of the unselected cells on the selected bit line and the selected word line. As such, the effective current through a selected cell can be, in these certain applications, significantly reduced as compared with other architectures. That is, for example, in order to provide a sufficient READ current as required by a certain application and resistive change element technology using the access and addressing method detailed in FIG. 4, a significantly higher READ current (or voltage) would need to be supplied on the word line WL1 to account for the leakage currents inherent in the access and addressing method. Such increased power requirements can be, in certain applications, undesirable.

Additionally, the devices and methods discussed above with respect to FIGS. 1B-1C for determining resistive states of resistive change elements in the resistive change element array 100 are not suitable for use with the 1-R resistive change element array 300 of FIG. 3 because the flow of leakage current through unselected 1-R resistive change element cells during READ operations adversely affects sensing current flow by the devices and methods discussed above with respect to FIGS. 1B-1C. For example, if the current sources 112, 122, 132, 142, the NMOS transistors 114, 124, 134, 144, and the sense amplifiers 116, 126, 136, 146, are respectively electrically connected to the bit lines BL(0)-BL(x) of the 1-R resistive change element array 300 of FIG. 3, the flow of leakage current through unselected 1-R resistive change element cells into a bit line electrically connected to a selected 1-R resistive change element cell can prevent a NMOS transistor electrically connected to the bit line from turning on because the flow of leakage current into the bit line prevents the voltage on the bit line from dropping to a voltage level sufficient to turn on the NMOS transistor.

As described in detail above, while the 1-R resistive change element array architecture 300 of FIG. 3 (and similar variations) provides numerous benefits with respect to ease of design and fabrication as well as cost and scaling considerations, the programming and reading methods as developed for other types of array architectures (such as, but not limited to array architectures 100 and 200 in FIGS. 1 and 2, respectively) can introduce undesirable limitations which can limit the effectiveness of a 1-R array structure in certain applications. Further, devices and methods developed for reading resistive states of resistive change elements in other types of array architectures (such as, but not limited to the array architecture 100 in FIG. 1) may not be suitable for use with a 1-R array architecture. To this end, the present disclosure provides devices and methods for reading resistive states of resistive change elements that are well suited for use with a 1-R resistive change element array architecture wherein no selection devices (or other current limiting elements) are used within the array cells (as is detailed in FIG. 3, for example).

Figure 5:
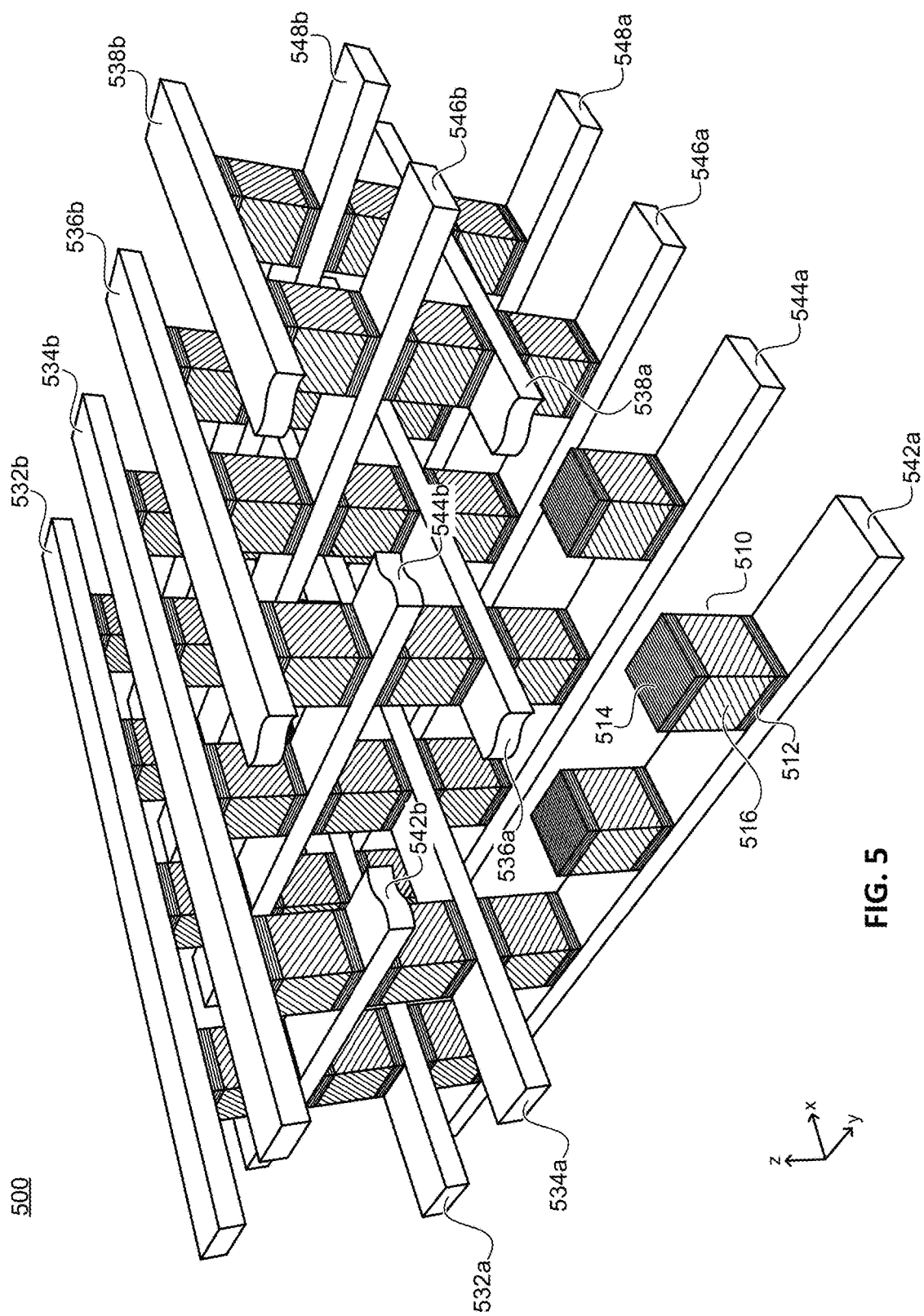
FIG. 5 illustrates a perspective drawing illustrating the layout of a 3D array of 1-R resistive change element cells.

FIG. 5 is a perspective drawing of a 3D resistive change element array 500. Resistive change element array 500 is comprised of 1-R resistive change cells arranged in three dimensions (along the x-, y-, and z-axes). A first layer of bit lines (542a, 544a, 546a, and 548a) are disposed along the y-axis, and a first layer of word lines (532a, 534a, 536a, and 538a) are disposed along the x-axis and above this first layer of bit lines. Between these first two layers of bit lines (542a, 544a, 546a, and 548a) and words lines (532a, 534a, 536a, and 538a), a first layer of resistive change elements 510 is disposed, one resistive change element at each word line and bit line crossing. The resistive change elements are each comprised of a resistive change material 516 (such as, but not limited to, a nanotube fabric layer or a block of phase change material) disposed between a first conductive element 512 and a second conductive element 514. It is desirable, in certain applications, to use these first and second conductive elements (512 and 514, respectively) to provide a conductive path between an array line (a word or bit line) and the actual resistive change material 516. However, these conductive elements (512 and 514) are not required in every application. For example, depending on the material used for the array lines, the particular material selected for the resistive change element 516, and the layout and fabrication methods being used, in certain applications it could be more favorable for the resistive change material block to connect directly to the array lines themselves. As such, the inclusion of first and second conductive elements (512 and 514, respectively) should not be seen as limiting with respect to the architecture of 1-R resistive change element arrays.

A second layer of bit lines (542b, 544b, 546b, and 548b) is disposed along the y-axis above the first layer of word lines. Between this second layer of bit lines (542b, 544b, 546b, and 548b) and the first layer of words lines (532a, 534a, 536a, and 538a), a second layer of resistive change elements 510 is disposed, one resistive change element at each word line and bit line crossing. A second layer of word lines (532b, 534b, 536b, and 538b) is disposed along the x-axis above the second layer of bit lines (542b, 544b, 546b, and 548b), and a third layer of resistive change elements 510 is disposed, one resistive change element at each word line and bit line crossing. In this way, an array of forty-eight 1-R resistive change element cells is arranged within essentially the same cross sectional area that would be used for an array of only sixteen array cells within a traditional 2D array structure. It is noted that the 3D resistive change element array 500 is not limited to forty-eight 1-R resistive change element cells and that the 3D resistive change element array 500 can include a plurality of 1-R resistive change element cells.

A 3D array structure, as detailed in FIG. 5, is highly desirable in terms of scaling and array cell density. And the relatively simplicity of the 1-R cell architecture (as described in detail with respect to FIGS. 3 and 4) is well suited for such a 3D structure, and provides numerous manufacturing and functional benefits. Further, the devices and methods of the present disclosure are especially well suited to such a complex array structure.

Figure 6A:
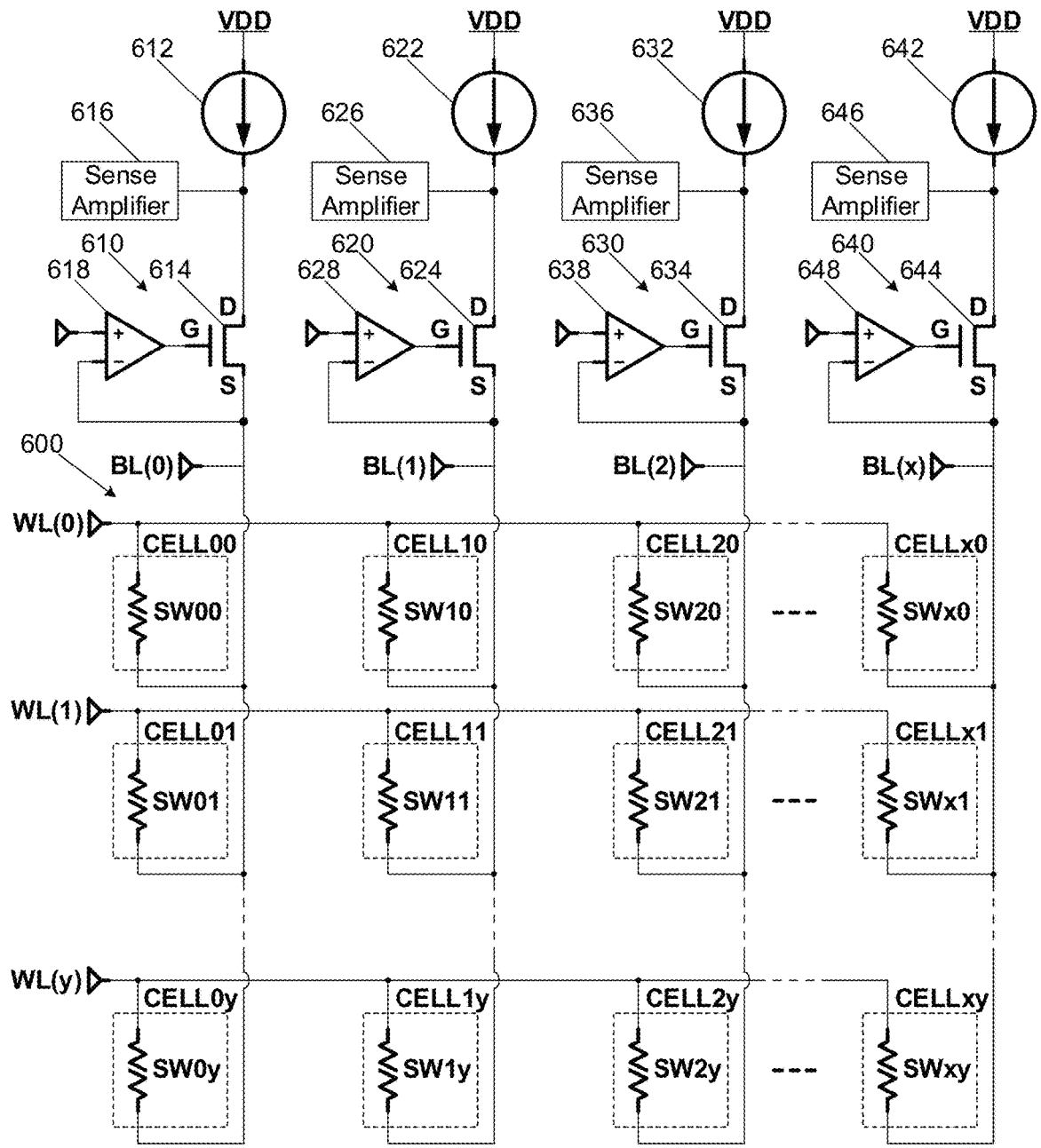
FIG. 6A illustrates a simplified schematic diagram of a first exemplary architecture for determining resistive states of resistive change elements in an array of 1-R resistive change element cells.

Referring now to FIG. 6A, a first exemplary architecture for determining resistive states of resistive change elements in a 1-R resistive change element array 600 by sensing current flow during READ operations is illustrated in a simplified schematic diagram. The 1-R resistive change element array 600 shown in FIG. 6A has a similar structure to the 1-R resistive change element array 300 discussed above with respect to FIG. 3. The 1-R resistive change element array 600 comprises a plurality of resistive change element cells CELL00-CELLxy, and each resistive change element cell includes a resistive change element SW00-SWxy that is accessed via two control lines (a word line and a bit line) and does not include an in situ selection device or other current limiting element. The resistive change element cells CELL00-CELLxy are referred to as 1-R resistive change element cells because the resistive change element cells include a resistive change element and do not include an in situ selection device or other current limiting element. Additionally, the 1-R resistive change element array 600 is referred to as a 1-R resistive change element array because the 1-R resistive change element array 600 includes 1-R resistive change element cells.

Each resistive change element SW00-SWxy has a first terminal respectively electrically connected to a word line WL(0)-WL(y) and a second terminal respectively electrically connected to a bit line BL(0)-BL(y). The resistive change elements can be two-terminal nanotube switching elements, phase change memory elements, metal oxide memory elements, or conductive bridge memory elements as well as other materials and designs.

The 1-R resistive change element array 600 is electrically connected to sense circuits 610, 620, 630, 640. Each sense circuit 610, 620, 630, 640, includes an n-channel metal oxide semiconductor field effect transistor (MOSFET) 614, 624, 634, 644, and a differential amplifier 618, 628, 638, 648. Each n-channel MOSFET 614, 624, 634, 644, also referred to as an NMOS transistor, has a gate terminal, a source terminal, and a drain terminal. Each differential amplifier 618, 628, 638, 648, has a non-inverting input terminal, an inverting input terminal, and an output terminal. A gate terminal of each NMOS transistor 614, 624, 634, 644, is respectively electrically connected to an output terminal of a differential amplifier 618, 628, 638, 648, a source terminal of each NMOS transistor 614, 624, 634, 644, is respectively electrically connected to a bit line BL(0)-BL(x) of the resistive change element array 600, and a drain terminal of each NMOS transistor 614, 624, 634, 644, is respectively electrically connected to both an output terminal of a current source 612, 622, 632, 642, and an input terminal of a sense amplifier 616, 626, 636, 646. A non-inverting input terminal of each differential amplifier 618, 628, 638, 648, can be respectively electrically connected to a voltage source or a driver circuit, an inverting input terminal of each differential amplifier 618, 628, 638, 648, is respectively electrically connected to a source terminal of a NMOS transistor 614, 624, 634, 644, forming a feedback loop. The sense circuits 610, 620, 630, 640, are shown in FIG. 6A electrically connected to the bit lines BL(0)-BL(x) of the 1-R resistive change element array 600, alternatively, the sense circuits 610, 620, 630, 640 can be electrically connected to the word lines WL(0)-WL(y) instead of the bit lines BL(0)-BL(x). Further, for bipolar operation a sense circuit can be electrically connected to each of the bit lines BL(0)-BL(x) and a sense circuit can be electrically connected to each of the word lines WL(0)-WL(y).

The NMOS transistors 614, 624, 634, 644, are dimensioned for determining a resistive state of a resistive change element. The threshold voltage VT and the current carrying capacity of the NMOS transistors 614, 624, 634, 644, are based on the construction and geometry of the NMOS transistors 614, 624, 634, 644. The NMOS transistors 614, 624, 634, 644, have a threshold voltage VT greater than 0 volts. Alternatively, the NMOS transistors can have a threshold voltage VT less than or equal to 0 volts. The threshold voltage refers to the gate to source voltage level required to turn on the NMOS transistors. Alternatively, the sense circuits can include MOSFETs having p-type polarity such as p-channel MOSFETs, also referred to as PMOS transistors. Alternatively, the sense circuits can include other types of field effect transistors such as carbon nanotube field effect transistors (CNTFETs), SiGe FETs, fully-depleted silicon-on-insulator FETs, or multiple gate field effect transistors, such as FinFETs.

It is noted that when the sense circuits 610, 620, 630, 640, include p-type polarity transistors such as PMOS transistors in place of the NMOS transistors 614, 624, 634, 644, a gate terminal of each PMOS transistor is respectively electrically connected to an output terminal of a differential amplifier 618, 628, 638, 648, a source terminal of each PMOS transistor is respectively electrically connected to both an output terminal of a current source 612, 622, 632, 642, and an input terminal of a sense amplifier 616, 626, 636, 646, and a drain terminal of each PMOS transistor is respectively electrically connected to a bit line BL(0)-BL(x) of the resistive change element array 600. It is also noted that when the sense circuits 610, 620, 630, 640, include p-type polarity transistors such as PMOS transistors in place of the NMOS transistors 614, 624, 634, 644, a non-inverting input terminal of each differential amplifier 618, 628, 638, 648, is respectively electrically connected to a drain terminal of a PMOS transistor forming a feedback loop and an inverting input terminal of each differential amplifier 618, 628, 638, 648, can be respectively electrically connected to a voltage source or a driver circuit. It is further noted that when the sense circuits 610, 620, 630, 640, include p-type polarity transistors such as PMOS transistors in place of the NMOS transistors 614, 624, 634, 644, the sense circuits including the PMOS transistors operate similarly to the sense circuits 610, 620, 630, 640, including the NMOS transistors 614, 624, 634, 644, and thus, the discussion below with the sense circuits 610, 620, 630, 640, including NMOS transistors 614, 624, 634, 644, also generally applies to sense circuits including PMOS transistors.

The differential amplifiers 618, 628, 638, 648, can be amplifiers that generate an output voltage based on the difference between two input voltages, such as operational amplifiers. The current sources 612, 622, 632, 642, can be components that supply an amount of current limited to a set amount of current, such as two transistor current sources, three transistor current sources, four transistor current sources, switch capacitor resistors, resistors, carbon nanotubes, and other types of current sources or current mirrors. The sense amplifiers 616, 626, 636, 646, can be components that receive an input voltage and generate an output voltage that corresponds with a logic value.

Figure 6B:
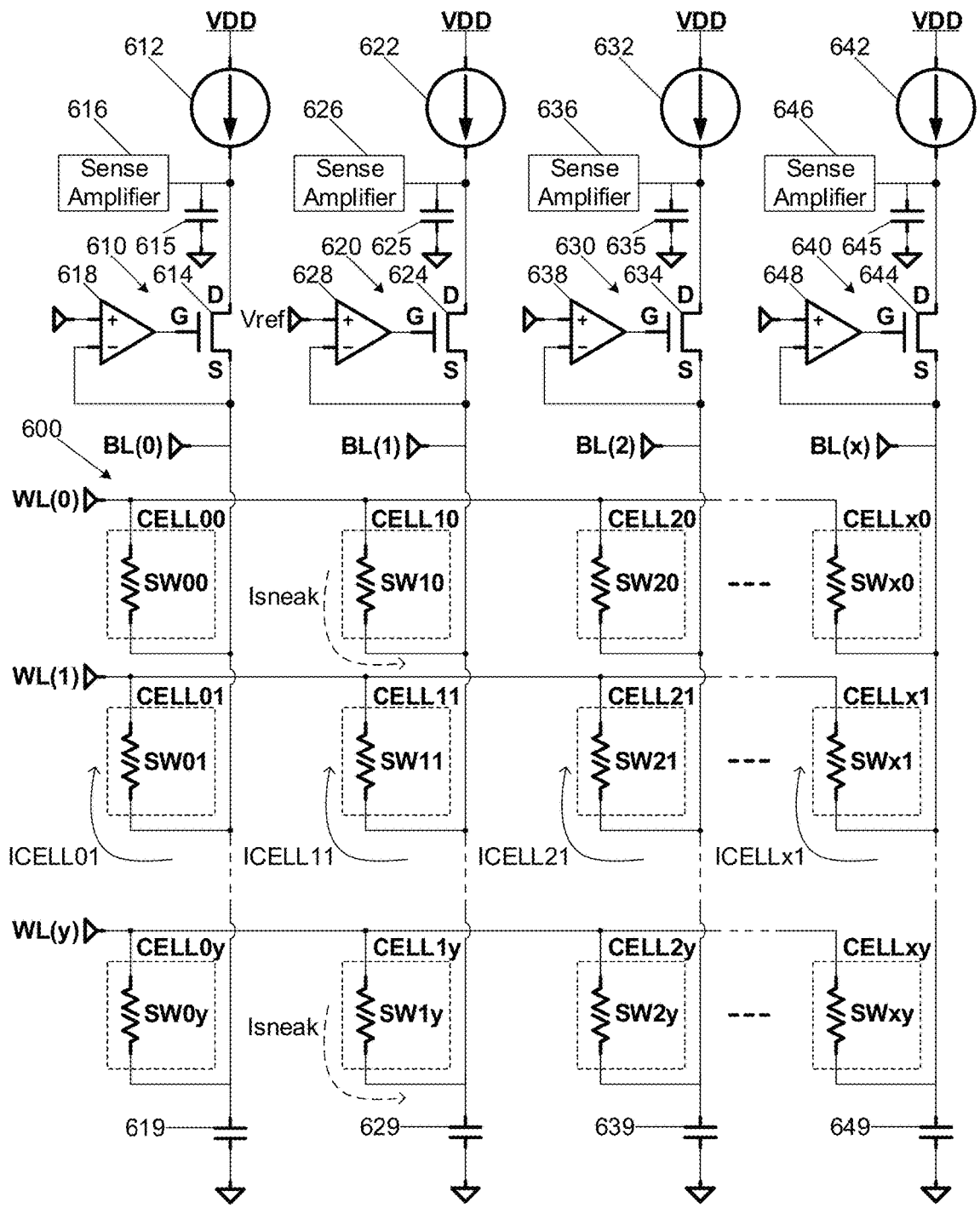
FIG. 6B illustrates a simplified schematic diagram showing current flow through 1-R resistive change element cells during a read operation of a 1-R resistive change element cell in a first exemplary architecture for determining resistive states of resistive change elements in an array of 1-R resistive change element cells.
Figure 6C:
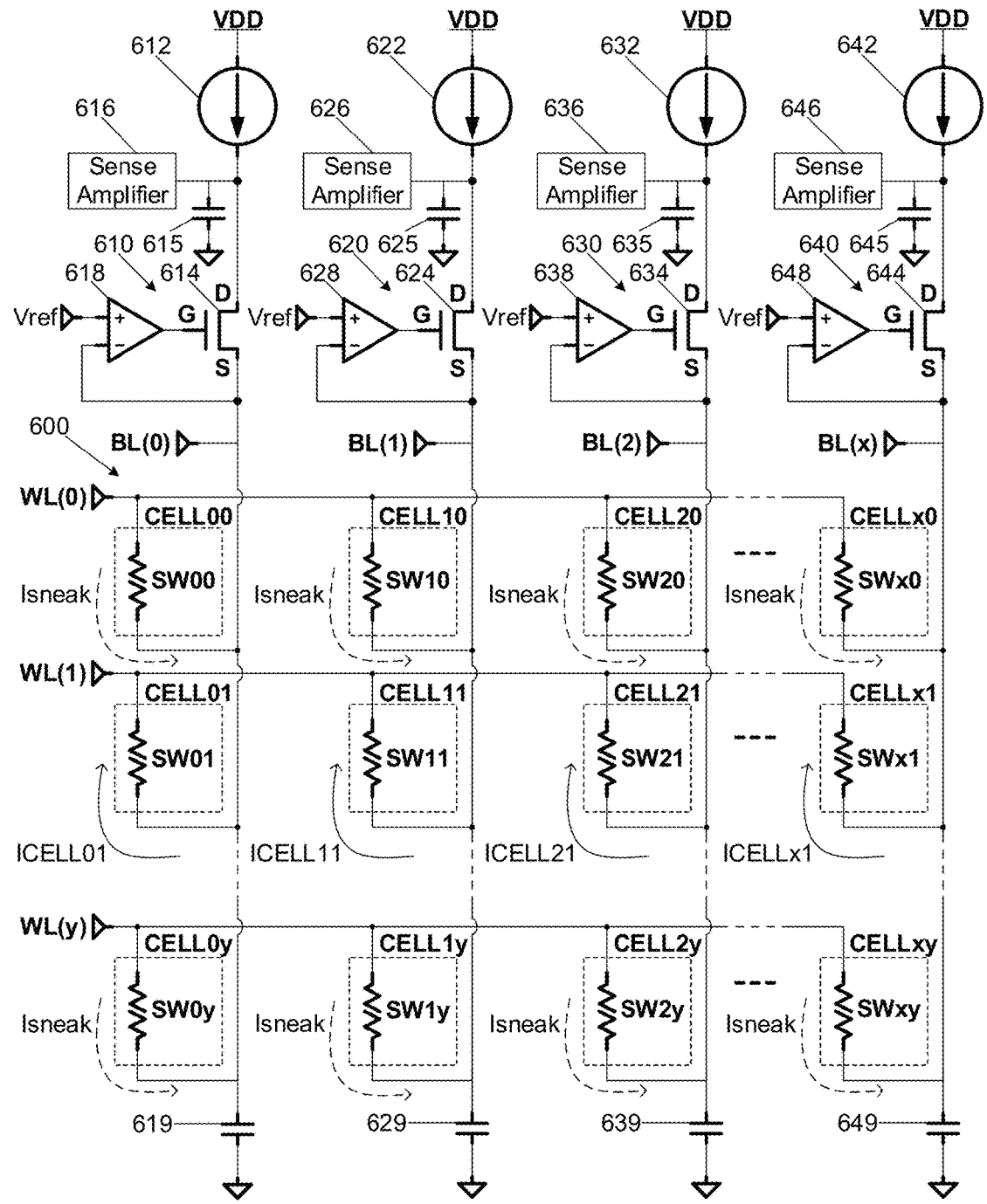
FIG. 6C illustrates a simplified schematic diagram showing current flow through 1-R resistive change element cells during a simultaneous read operation of each 1-R resistive change element cell on a word line in a first exemplary architecture for determining resistive states of resistive change elements in an array of 1-R resistive change element cells.

FIG. 6B illustrates a simplified schematic diagram showing current flow through resistive change element cells during a READ operation of CELL11 in the first exemplary architecture for determining resistive states of resistive change elements in the 1-R resistive change element array 600 by sensing current flow during READ operations. FIG. 6C illustrates a simplified schematic diagram showing current flow through resistive change element cells during simultaneous READ operations of each cell on the word line WL(1) in the exemplary architecture for determining resistive states of resistive change elements in the 1-R resistive change element array 600 by sensing current flow during READ operations. Performing READ operations of each cell on a word line at the same time can be highly desirable in certain applications where rapid data READ operations or page mode READ operations are required. The READ operation of CELL11 will be explained in detail further below, and READ operations of each cell in the 1-R resistive change element array 600 can be performed in a similar manner to the READ operation of CELL11. It is noted that the READ operations of CELL11 explained in further detail below generally describe current flowing through CELL11 as flowing from the bit line BL(1) to the word line WL(1), however, the devices and methods of the present disclosure are not limited in this regard. For example, when the sense circuits 610, 620, 630, 640, are electrically connected to the word lines WL(0)-WL(y), current will flow through CELL11 from the word line WL(1) to the bit line BL(1) during READ operations of CELL11.

Figure 6D:
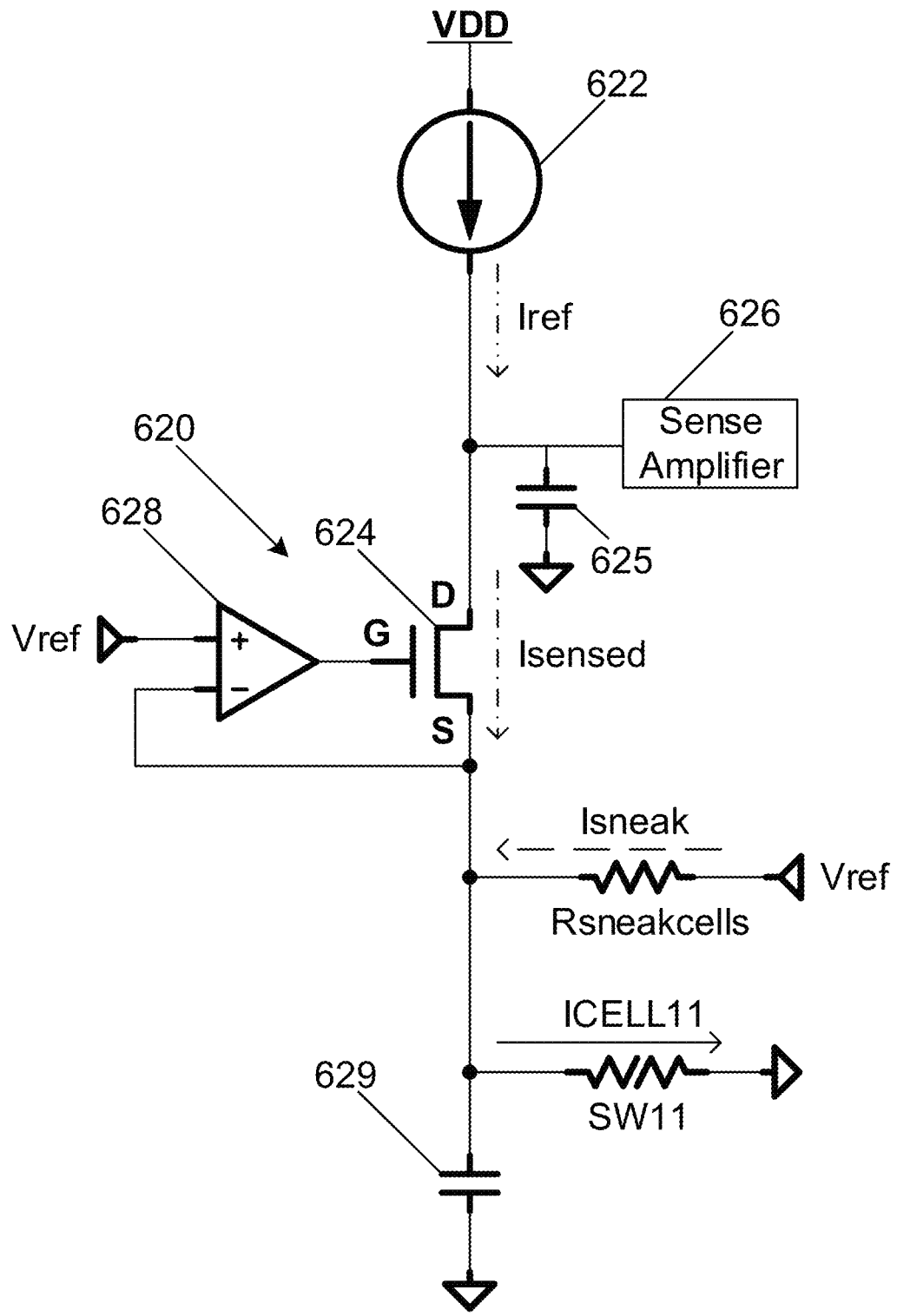
FIG. 6D illustrates a simplified schematic diagram showing current flow through a NMOS transistor and current flow on a bit line during a read operation of a 1-R resistive change element cell in a first exemplary architecture for determining resistive states of resistive change elements in an array of 1-R resistive change element cells.

FIGS. 6B-6D additionally show parasitic capacitances that visually illustrate capacitances of other connections and components. FIGS. 6B-6D show the parasitic capacitances 615, 625, 635, 645, of lines electrically connecting the sense amplifiers 616, 626, 636, 646, to the current sources 612, 622, 632, 642, and the NMOS transistors 614, 624, 634, 644, and the parasitic capacitances 619, 629, 639, 649, of the bit lines BL(0)-BL(x). The parasitic capacitances 615, 619, 625, 629, 635, 639, 645, 649, are not separate circuit components but rather the parasitic capacitances 615, 619, 625, 629, 635, 639, 645, 649, visually illustrate capacitances of other connections and components. It is noted that the parasitic capacitances 615, 619, 625, 629, 635, 639, 645, 649, are not shown in FIG. 6A and that the parasitic capacitances are shown in FIGS. 6B-6D for the purpose of referring to the parasitic capacitances during the READ operations.

FIG. 7 illustrates a flow chart 700 showing a first method for determining a resistive state of a resistive change element in a resistive change element array, where the resistive change element array includes a plurality of resistive change elements and each resistive change element is electrically connected to a bit line of a plurality of bit lines in the resistive change element array and a word line of a plurality of word lines in the resistive change element array. The method starts in step 702 with selecting a resistive change element from a plurality of resistive change elements in a resistive change element array, where each resistive change element is electrically connected to a bit line of a plurality of bit lines in the resistive change element array and a word line of a plurality of word lines in the resistive change element array. The method proceeds in step 704 with setting a potential amount of current permitted to be supplied for determining a resistive state of the resistive change element. The method proceeds in step 706 with supplying an amount of current for determining the resistive state of the resistive change element, where the amount of current is limited to a set amount of current. The method continues in step 708 with determining the resistive state of the resistive change element based on the potential amount of current permitted to be supplied and the set amount of current. The resistive state of the resistive change element is determined to be a low resistive state (which may correspond to a logic 1) when the potential amount of current is greater than the set amount of current and the resistive state of resistive change element is determined to be a high resistive state when (which may correspond to a logic 0) the potential amount of current is less than the set amount of current. It is noted that the steps of the method shown in FIG. 7 are not limited to being performed in the order shown in FIG. 7.

The first method for determining a resistive state of a resistive change element in a resistive change element array as discussed above with respect to FIG. 7, will be discussed below with respect to the READ operation of CELL11 in the resistive change element array 600 of FIG. 6B. However, the first method for determining a resistive state of a resistive change element in a resistive change element array is not limited to the first exemplary architecture shown in FIG. 6B. The first method for determining a resistive state of a resistive change element in a resistive change element array can be performed by other architectures and circuit elements.

The READ operation of CELL11 starts, as similarly discussed above in step 702 of the flow chart 700, by selecting CELL11 from the plurality of resistive change element cells CELL00-CELLxy in the 1-R resistive change element array 600. Selecting CELL11 from the plurality of resistive change element cells CELL00-CELLxy begins by driving each of the bit lines BL(0)-BL(x) to a reference voltage Vref, driving each of the word lines WL(0)-WL(y) to the reference voltage Vref, and driving the non-inverting input of the differential amplifier 628 to the reference voltage Vref. The bit lines BL(0)-BL(x) can be driven to the reference voltage Vref by the current sources 612, 622, 632, 642 and sense circuits 610, 620, 630, 640, driver circuits, or voltage sources. The word lines WL(0)-WL(y) and the non-inverting input of the differential amplifier 628 can be driven to the reference voltage Vref by driver circuits or voltage sources.

Additionally, the inverting input of the differential amplifier 628 is driven to the reference voltage Vref, the gate voltage of the NMOS transistor 624 is driven to a voltage level sufficient to turn off the NMOS transistor 624, the source voltage VS of the NMOS transistor 624 is driven to the reference voltage Vref, the drain voltage VD of the NMOS transistor 624 is driven to a power supply voltage VDD, a voltage Vout of the parasitic capacitance 625 is driven to the power supply voltage VDD, and the voltage of the input capacitance of the sense amplifier 626 is driven to the power supply voltage VDD. The voltage on the inverting input of the differential amplifier 628 and the source voltage VS of the NMOS transistor 624 are driven to the reference voltage Vref because the voltage on the bit line BL(1) corresponds with the source voltage VS of the NMOS transistor 624 and the inverting input terminal of the differential amplifier 628 is electrically connected to the source terminal of the NMOS transistor 624 through the feedback loop. The gate voltage VG of the NMOS transistor 624 is driven to a voltage level sufficient to turn off the NMOS transistor 624 because the differential amplifier 628 outputs a signal VAMP to the gate terminal of the NMOS transistor 624 with the signal VAMP having a voltage such that the gate to source VGS of the NMOS transistor 624 is less than the threshold voltage VT. The drain voltage VD of the NMOS transistor 624, the voltage Vout of the parasitic capacitance 625, and the voltage of the input capacitance of the sense amplifier 626 are driven to the power supply voltage VDD by the current source 622 because the gate to source voltage VGS of the NMOS transistor 624 is less than the threshold voltage VT and the NMOS transistor 624 is turned off.

When each of the bit lines BL(0)-BL(x) and each of the word lines WL(0)-WL(y) are driven to the reference voltage Vref, current does not flow through the cells CELL00-CELLxy because both sides of each cell are at the reference voltage Vref. When the differential amplifier 628 outputs the signal VAMP having a voltage such that the gate to source voltage VGS of the NMOS transistor 624 is less than the threshold voltage VT, current does not flow through the NMOS transistor 624 because the NMOS transistor 624 is turned off. It is noted that the voltage on the bit line BL(1) may differ from the reference voltage Vref due to the limited gain of the differential amplifier 628, process variations, voltage variations, and temperature variations. It is further noted that current flow caused by the voltage on the bit line BL(1) differing from the reference voltage Vref does not prevent the READ operation of CELL11 when the current flow is much less than a set amount of current that can be supplied by the current source 622.

Selecting CELL11 from the plurality of resistive change element cells CELL00-CELLxy concludes by discontinuing driving of the bit line BL(1) to the reference voltage Vref, discontinuing driving the word line WL(1) to the reference voltage Vref, and driving the word line WL(1) to a voltage less than the reference voltage Vref. After driving of the bit line BL(1) to the reference voltage Vref is discontinued, the bit line BL(1) is left initially charged to the reference voltage Vref due to the parasitic capacitance 629 of the bit line BL(1). The current flow during the READ operation of CELL11 will be described below with the word line WL(1) driven to 0 volts or ground, however, the READ operation of CELL11 can alternatively include driving the word line WL(1) to other voltages less than the reference voltage Vref, such as a positive voltage less than the reference voltage Vref or a negative voltage less than the reference voltage Vref.

When the word line WL(1) is driven to 0 volts or ground, current begins to flow through the cells CELL01, CELL11, CELL21, CELLx1 because the voltage on the sides of these cells respectively connected to bit lines BL(0)-BL(x) is the reference voltage Vref and the voltage on the sides of these cells connected to the word line WL(1) is 0 volts or ground. The current flowing through each of the cells CELL01, CELL21, and CELLx1 can be approximated using Ohm's Law, as Icell=Vref/Rcell for each cell, where Rcell is the resistance of the resistive change element within the cell. The current flowing through CELL11 can only initially be approximated using Ohm's Law as, ICELL11=Vref/RCELL11, where RCELL11 is the resistance of the resistive change element SW11 within CELL11, because the voltage on the bit line BL(1) drops below the reference voltage Vref when the current ICELL11 flows through CELL11. The current flowing through the cells CELL01, CELL11, CELL21, and CELLx1 is shown in FIGS. 6B-6C as ICELL01, ICELL11, ICELL21, and ICELLx1. It is noted that for read operations performed on each cell on the word line WL(1) at the same time, as shown in FIG. 6C, the currents ICELL01, ICELL11, ICELL21, and ICELLx1 can only initially be approximated using Ohm's Law as, Icell=Vref/Rcell, where Rcell is the resistance of the resistive change element within the cell, because the voltage on each of the bit lines BL(1)-BL(x) drops below the reference voltage Vref when the current flows through the cells.

The voltage drop on the bit line BL(1) causes the gate to source voltage VGS of the NMOS transistor 624 to increase because the voltage drop on the bit line BL(1) causes the source voltage VS of the NMOS transistor 624 to decrease and the gate voltage VG of the NMOS transistor 624 to increase. The voltage on the bit line BL(1) corresponds with the source voltage VS, and thus, the voltage drop on the bit line BL(1) corresponds with a voltage drop in the source voltage VS. The voltage on the bit line BL(1) also corresponds with the voltage of the inverting input of the differential amplifier 628, and thus, the voltage drop on the bit line BL(1), while the voltage of the non-inverting input of the differential amplifier 628 remains at the reference voltage Vref, causes the voltage of the signal VAMP supplied to the gate terminal of the NMOS transistor 624 to increase which causes the gate voltage VG to increase. The voltage of the signal VAMP is determined by multiplying the gain of the differential amplifier 628 with the difference between the voltage of the non-inverting input and the voltage of the inverting input. Thus, the gate to source voltage VGS can be approximately determined by Equation No. 2:

$$VGS = \text{Gain}(\text{Voltage of the Non-Inverting Input} - \text{Voltage of the Inverting Input}) - VS$$

with the voltage of the non-inverting input being the reference voltage Vref and both of the voltage of the inverting input and the source voltage VS being the voltage on the bit line BL(1). The differential amplifier 628 has a large gain so that a small increase in the difference between the voltage of the non-inverting input and the voltage of the inverting input causes a large increase in the voltage of the signal VAMP. For example, as shown by the above Equation No. 2, when the differential amplifier 628 has a gain of approximately 1000.5, the voltage of the non-inverting input remains constant at the reference voltage Vref, and the voltage on the bit line BL(1) drops by a 1 microvolt, the gate to source voltage VGS of the NMOS transistor 624 will increase by 1001.5 microvolts. The voltage drop on the bit line BL(1) also causes a sneak current Isneak, also referred to as leakage current, to flow into the bit line BL(1) through each of CELL10 and CELL1y because the voltage on the sides of these cells respectively electrically connected to word lines WL(0) and WL(y) is the reference voltage Vref and the voltage on the sides of these cells electrically connected to the bit line BL(1) is less than the reference voltage Vref.

The current flow through the NMOS transistor 624 and the current flow on the bit line BL(1) during the READ operation of CELL11 are explained in further detail below with reference to the simplified schematic diagram of FIG. 6D. The simplified schematic of FIG. 6D shows the sense circuit 620, the current source 622, the parasitic capacitance 625, the sense amplifier 626, the parasitic capacitance 629, the resistive change element SW11, and a resistor Rsneakcells representing the resistive change element cells electrically connected to the bit line BL(1) other than CELL11. The simplified schematic of FIG. 6D does not show the rest of the first exemplary architecture of FIG. 6B so that the current flow can be shown with greater clarity. The current Iref illustrates current supplied by the current source 622, the current Isensed illustrates current flowing through the NMOS transistor 624, the current Isneak illustrates a sum of individual Isneak currents flowing through the cells electrically connected to the bit line BL(1) other than CELL11, and the current ICELL11 illustrates current flowing through CELL11. The amount of each of the current Iref, the current Isensed, the current Isneak, and the current ICELL11, can each vary based on the resistive state of the resistive change element SW11 within CELL11. The amount of each of the current Iref, the current Isensed, the current Isneak, and the current ICELL11, can also each vary during the READ operation of CELL11.

The flow of the current ICELL11 through CELL11 causes the voltage on the bit line BL(1) to drop. When the resistive change element SW11 has a low resistive state, a large current ICELL11 flows through CELL11 and causes the voltage on the bit line BL(1) to drop to a third bit line voltage less than the reference voltage Vref. When the resistive change element SW11 has a high resistive state, a small current ICELL11 flows through CELL11 and causes the voltage on the bit line BL(1) to drop to a fourth bit line voltage greater than the third bit line voltage. The large current ICELL11 is greater than the small current ICELL11. The amount of the current ICELL11, for a given voltage VBL(1) on the bit line BL(1), can be approximated using Ohm's Law as ICELL11=VBL(1)/RCELL11, where RCELL11 is the resistance of the resistive change element SW11 within CELL11. As shown by the above equation, for a given voltage VBL(1) on the bit line BL(1), the amount of the current ICELL11 will be larger when the resistive change element SW11 has a low resistive state, for example a resistance on the order of 100 kΩ (corresponding, typically, to a logic '1,' a SET state), and the amount of the current ICELL11 will be smaller when the resistive change element SW11 has a high resistive state, for example a resistance on the order of 10 MΩ (corresponding, typically, to a logic '0,' a RESET state).

The current Isneak flows into the bit line BL(1) when the voltage on the bit line BL(1) drops below the reference voltage Vref. The current Isensed flows into the bit line BL(1) when the voltage on the bit line BL(1) drops a voltage level where the gate to source voltage VGS of the NMOS transistor 624 is greater than the threshold voltage VT. The current Isneak, for a given voltage VBL(1) on the bit line BL(1), can be approximated using Ohm's Law as Isneak=(Vref−VBL(1))/Rsneak, where Rsneak is the sneak resistance. The sneak resistance is a sum of the parallel resistances of the cells electrically connected to the bit line BL(1) other than CELL11. As shown by the above equation, when the voltage on the bit line BL(1) drops to the third bit line voltage the current Isneak is greater than the current Isneak when the voltage on the bit line BL(1) drops to the fourth bit line voltage because the difference between the reference voltage Vref and the third bit line voltage is greater than the difference between the reference voltage Vref and the fourth bit line voltage.

Setting a potential amount of current permitted to be supplied for determining the resistive state of the resistive change element SW11 within CELL11, as similarly discussed above in step 704 of flow chart 700, during the READ operation of CELL11 is carried out by setting a potential amount of current Isensed that can flow through the NMOS transistor 624. The potential amount of current Isensed that can flow through the NMOS transistor 624 is based on the difference between the voltage of the signal VAMP and the voltage on the bit line BL(1), which as discussed above, corresponds with the gate to source voltage VGS. The potential amount of current Isensed that can flow through the NMOS transistor 624 generally increases as the gate to source voltage VGS increases beyond the threshold voltage VT and generally decreases as the gate to source voltage VGS decreases toward the threshold voltage VT.

When the resistive change element SW11 has a low resistive state, the gate to source voltage VGS of the NMOS transistor 624 increases to a third gate to source voltage VGS because the voltage on the bit line BL(1) drops to the third bit line voltage due to the large current ICELL11. The gate to source voltage VGS increasing to the third gate to source voltage VGS causes the potential amount of current Isensed that can flow through the NMOS transistor 624 into the bit line BL(1) to increase to a third large potential amount of current. When the resistive change element SW11 has a high resistive state, the gate to source voltage VGS of the NMOS transistor 624 increases a smaller amount to the fourth gate to source voltage VGS because the voltage on the bit line BL(1) drops to the fourth bit line voltage due to the small current ICELL11. The gate to source voltage VGS increasing to the fourth gate to source voltage VGS causes the potential amount of current Isensed that can flow through the NMOS transistor 624 into the bit line BL(1) to increase to a fourth small potential amount of current. Thus, when the resistive change element SW11 has a low resistive state the potential amount of current Isensed will increase to the third large potential amount of current and when the resistive change element SW11 has a high resistive state the potential amount of current Isensed will increase to the fourth small potential amount of current. It is noted that the third gate to source voltage VGS is greater than the fourth gate to source voltage VGS and the third large potential amount of current is greater than the fourth small potential amount of current. It is also noted that the fourth small potential amount of current that can flow through the NMOS transistor 624 into the bit line BL(1) can be 0 amps because the fourth small gate to source VGS can be less than the threshold voltage VT of the NMOS transistor 624.

Supplying an amount of current for determining the resistive state of resistive change element SW11 within CELL11, where the amount of current is limited to a set amount of current, as similarly discussed above in step 706 of flow chart 700, during the READ operation of CELL11 is carried out by the current source 622 supplying an amount of current Iref for determining the resistive state of the resistive change element SW11 through the NMOS transistor 624. The amount of current Iref for determining the resistive state of the resistive change element SW11 is limited to a set amount of current that can be supplied by the current source 622 and is regulated by the potential amount of current Isensed that can flow through NMOS transistor 624 until the potential amount of current Isensed exceeds the set amount of current that can be supplied by the current source 622. It is noted that the amount of the current Iref supplied for determining the resistive state of the resistive change element SW11 can be 0 amps, when the potential amount of current Isensed that can flow through the NMOS transistor 624 is 0 amps.

The set amount of current that can be supplied by the current source 622 is set such that the large current ICELL11 is greater than the set amount of current that can be supplied by the current source 622 and the small current ICELL11 is less than the set amount of current that can be supplied by the current source 622. For example, when the large current ICELL11 is 1 microamp and the small current ICELL11 is 350 nanoamps, the set amount of current that can be supplied by the current source 622 can be the average of the two currents, 675 nanoamps. The set amount of current that can be supplied by the current source 622 can be the same set amount of current for each READ operation. Alternatively, the set amount of current that can be supplied by the current source 622 can be set to different amounts of current for READ operations. For example, the same set amount of current can be supplied for READ operations of CELL10 and CELL11 and a different set amount of current can be supplied for READ operations of CELL1$y$, the same set amount of current can be supplied for READ operations of CELL11 and CELL1$y$ and a different set amount of current can be supplied for READ operations of CELL10, the same set amount of current can be supplied for READ operations of CELL10 and CELL1$y$ and a different set amount of current can be supplied for the READ operations of CELL11, and a different set amount of current can be supplied for the READ operations of each of CELL10, CELL11, and CELL1$y$. Further, the third large potential amount of current Isensed is greater than the set amount of current that can be supplied by the current source 622 and the fourth small potential amount of current Isensed is less than the set amount of current that can be supplied by the current source 622.

As similarly discussed above in step 708 of flow chart 700, during a READ operation of CELL11 determining the resistive state of the resistive change element SW11 within CELL11 is based on the potential amount of current that can flow through the NMOS transistor 624 and the set amount of current supplied by the current source 622. The resistive state of the resistive change element SW11 is determined to be a low resistive state when the potential amount of current Isensed that can flow through the NMOS transistor 624 is greater than the set amount of current that can be supplied by the current source 622. The resistive state of resistive change element SW11 is determined to be a high resistive state when the potential amount of current Isensed that can flow through the NMOS transistor 624 is less than the set amount of current that can be supplied by the current source 622.

When the potential amount of current Isensed increases to the third large potential amount of current, the set amount of current supplied by the current source 622 and a discharge current sufficient to discharge the voltage Vout of both the parasitic capacitance 625 and the input capacitance of the sense amplifier 626 from the voltage VDD to approximately the voltage on the bit line BL(1) flow through the NMOS transistor 624 into the bit line BL(1). The voltage Vout of both the parasitic capacitance 625 and the input capacitance of the sense amplifier 626 drops from the voltage VDD to approximately the voltage on the bit line BL(1) because the discharge current flows through the NMOS transistor 624 into the bit line BL(1). When the potential amount of current Isensed increases to the fourth small potential amount of current, the set amount of current supplied by the current source 622 and a discharge current sufficient to discharge the voltage Vout of both the parasitic capacitance 625 and the input capacitance of the sense amplifier 626 from the voltage VDD to approximately the voltage on the bit line BL(1) do not flow through the NMOS transistor 624 into the bit line BL(1). The voltage Vout of both the parasitic capacitance 625 and the input capacitance of the sense amplifier 626 remains at approximately the voltage VDD because the discharge current does not flow through the NMOS transistor 624 into the bit line BL(1). Thus, the voltage level of the voltage Vout is determined by the relationship between the potential amount of current that can flow through the NMOS transistor 624 and the set amount of current that can be supplied by the current source 622 and the voltage Vout having a voltage level of approximately the voltage on the bit line BL(1) indicates that the resistive change element SW11 has a low resistive state and the voltage Vout having a voltage level of approximately the voltage VDD indicates the resistive change element SW11 has a high resistive state.

The sense amplifier 626 receives the voltage Vout as an input voltage and after at least a second amount of time for discharge the sense amplifier 626 outputs a voltage based on the voltage level of the voltage Vout. When the sense amplifier 626 receives the voltage Vout having a voltage level of approximately the voltage on the bit line BL(1), after at least the second amount of time for discharge the sense amplifier 626 outputs a voltage that corresponds with a logic 1. When the sense amplifier 626 receives the voltage Vout having a voltage level of approximately VDD, after at least the second amount of time for discharge the sense amplifier 626 outputs a voltage that corresponds with a logic 0. Alternatively, the sense amplifiers 616, 626, 636, 646, are omitted from the architecture shown in FIGS. 6A-6D and a logic circuit or a control circuit, such as a processor, a controller, or a FGPA, is electrically connected to the line electrically connecting the current source 622 to the NMOS transistor 624 so that the logic circuit or the control circuit receives the voltage Vout as an input voltage.

The second amount of time for discharge refers to the amount of time from the start of a read operation of CELL11 when the resistive change element SW11 has a low resistive state until the voltage Vout of both the parasitic capacitance 625 and the input capacitance of the sense amplifier 626 drops from the voltage VDD to approximately the voltage on the bit line BL(1). READ operations performed when the resistive change element SW11 has a low resistive state and when the resistive change element SW11 has a high resistive state both wait the second amount of time for discharge before determining an input voltage even though a discharge current sufficient to discharge the voltage Vout of both the parasitic capacitance 625 and the input capacitance of the sense amplifier 626 does not flow through the NMOS transistor 624 when the resistive change element SW11 has a high resistive state.

The second amount of time for discharge of the voltage Vout of both the parasitic capacitance 625 and the input capacitance of the sense amplifier 626 is part of the total amount of time to perform a READ operation of CELL11. The second amount of time for discharge during a READ operation of CELL11 using sense circuit 620 can be reduced by permitting a discharge current sufficient to discharge the voltage Vout of both the parasitic capacitance 625 and the input capacitance of the sense amplifier 626 to flow through the NMOS transistor 624 at an earlier time. The discharge current can flow through the NMOS transistor 624 at an earlier time by increasing the rate of change of the gate to source voltage VGS of the NMOS transistor 624 in response to a change in the voltage on the bit line BL(1). The rate change of the gate to source voltage VGS of the NMOS transistor 624 depends on the gain of the differential amplifier 628 and the change of the voltage on the bit line BL(1). For example, when the gain of the differential amplifier 628 is 10 and the voltage on the bit line BL(1) drops 1 microvolt below the reference voltage Vref the gate to source voltage VGS of the NMOS transistor 624 will increase by approximately 11 microvolts and when the gain of the differential amplifier 628 is 1000 and the voltage on the bit line BL(1) drops 1 microvolt below the reference voltage Vref the gate to source voltage VGS of the NMOS transistor 624 will increase by approximately 1,001 microvolts. Increasing the rate of change of the gate to source voltage VGS of the NMOS transistor 624 in response to a change in the voltage on the bit line BL(1) allows the discharge current to flow through the NMOS transistor 624 when the voltage on the bit line BL(1) is higher, and thus, reduces the amount of time for the voltage on the bit line BL(1) to drop to a voltage level that causes the NMOS transistor 624 to be turned on. Additionally, it is noted that READ operations performed when voltages on the bit line are higher can reduce the impact of the current Isneak because the current Isneak, as discussed above with respect to Ohm's law, depends on the voltage on the bit line.

Further, the increasing rate of change of the gate to source voltage VGS of the NMOS transistor 624 in response to a change in the voltage on the bit line BL(1) causes the potential amount of current Isensed that can flow through the NMOS transistor 624 to steeply increase as the voltage on the bit line BL(1) decreases. Thus, a large discharge current that can rapidly discharge the parasitic capacitance 625 and the input capacitance of the sense amplifier 626 can flow through the NMOS transistor 624 shortly after the potential amount of current Isensed that can flow through the NMOS transistor 624 exceeds the set amount of current supplied by the current source 622. Therefore, during a READ operation of CELL11 when the resistive change element SW11 has a low resistive state, the sense circuit 620 can discharge the parasitic capacitance 625 and the input capacitance of the sense amplifier 626 a small amount of time after a discharge current begins flow through the NMOS transistor 624. It is also noted that the second amount of time for discharge is affected by the size of the parasitic capacitance 625 and the size input capacitance of the sense amplifier 626 and that a circuit designer can adjust the size of the parasitic capacitance 625 and the size of the input capacitance of the sense amplifier 626 through circuit design.

Figure 8A:
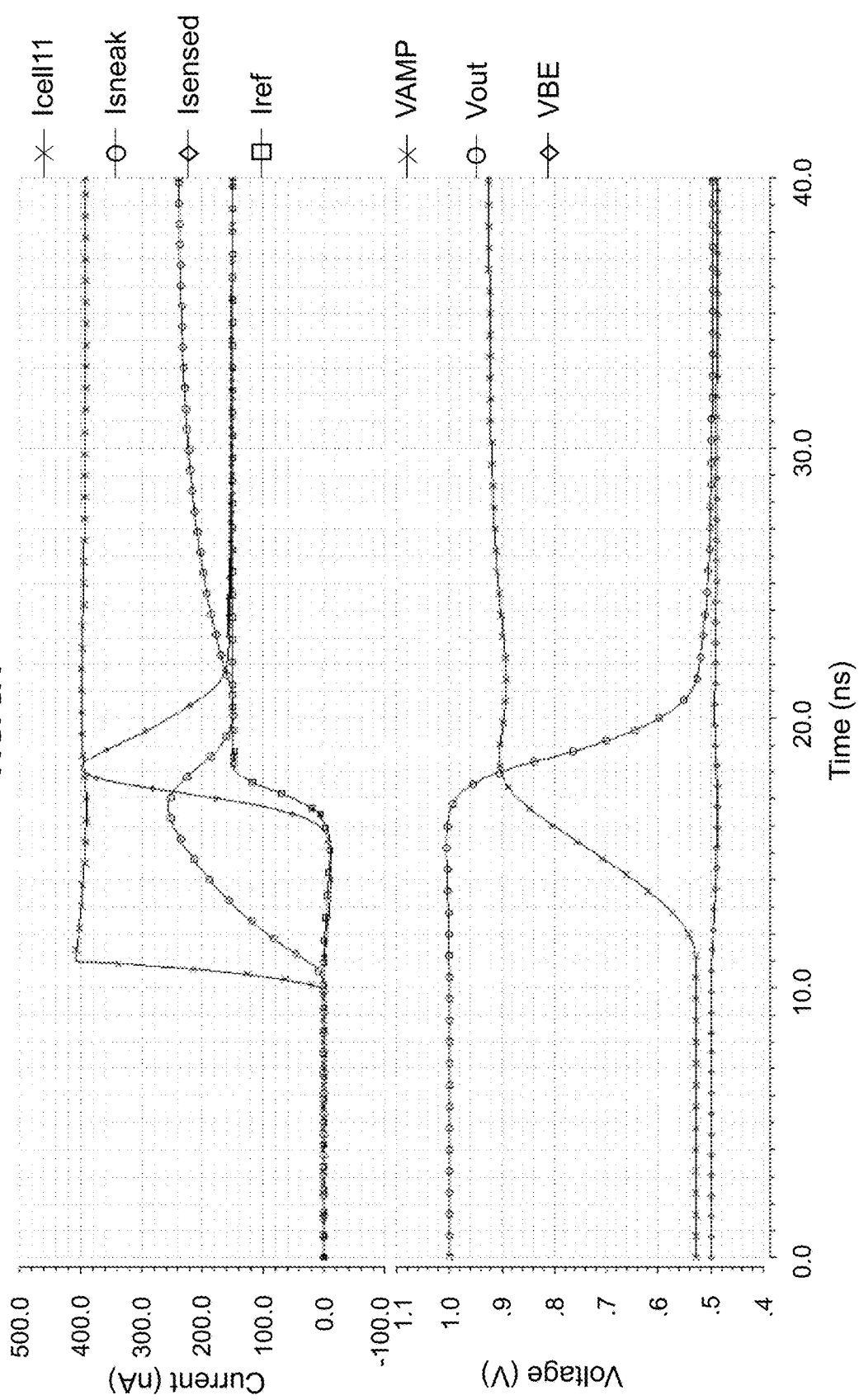
FIG. 8A illustrates current waveforms and voltage waveforms for a simulated READ operation of CELL11 in the first exemplary architecture of FIG. 6B, when CELL11 has a low resistive state.

Waveforms for the current Iref, the current Isensed, the current Isneak, the current ICELL11, and waveforms for the voltage VBE on the bit line BL(1), the voltage of the signal VAMP, and the voltage Vout for a simulated READ operation of CELL11 in the first exemplary architecture of FIG. 6B when the resistive change element SW11 has a low resistive state are shown in FIG. 8A. The word line WL(1) is driven to 0 volts or ground at approximately 10 nanoseconds during the simulated READ operation of CELL11 shown in FIG. 8A. The waveform for the current ICELL11 increases shortly after the word line WL(1) is driven to 0 volts or ground and the waveform for the current ICELL11 generally corresponds with ICELL11=VBE/RCELL11, where RCELL11 is the resistance of the resistive change element SW11 within CELL11. When the current ICELL11 flows through CELL11 the voltage VBE on the bit line BL(1) drops below approximately 0.5 volts as shown in FIG. 8A.

When the resistive change element SW11 has a low resistive state, the current ICELL11 increases to a large current ICELL11 as shown in FIG. 8A and the potential amount of current Isensed increases to a third large potential amount of current. The voltage VBE on the bit line BL(1) drops to a third bit line voltage less than approximately 0.5 volts and causes the waveform for the voltage of the signal VAMP to increase from approximately 0.53 volts to approximately 0.92 volts. When the potential amount of current Isensed increases beyond a set amount of current that can be supplied by the current source 622, the amount of current Iref supplied by the current source 622 increases to the set amount of current and the set amount of current and a discharge current sufficient to discharge a voltage Vout of both the parasitic capacitance 625 and the input capacitance of the sense amplifier 626 from the voltage VDD to approximately the voltage on the bit line BL(1) flow through the NMOS transistor 624 into the bit line BL(1). The set amount of current that can be supplied by the current source 622 is 150 nanoamps and the set amount of current that can be supplied by the current source 622 is reflected in FIG. 8A by the waveform for the current Iref supplied by the current source 622 plateauing at 150 nanoamps after the potential amount of current Isensed increases beyond 150 nanoamps. The flow of the set amount of current and the discharge current through the NMOS transistor 624 into the bit line BL(1) is shown in FIG. 8A by the waveform for the current Isensed increasing above the waveform for the current Iref.

When the potential amount of current Isensed increases beyond the set amount of current by a large amount, the amount of the discharge current rapidly increases as shown by a spike in the waveform for the current Isensed at approximately 18 nanoseconds. The rapid increase of the discharge current can reduce the impact of the sneak current Isneak by pulling up the voltage VBE on the bit line BL(1) and decreasing the sneak current Isneak. The waveform for the current Isneak generally corresponds with Isneak=(Vref−VBE)/Rsneak, where Rsneak is a sum of the parallel resistances of the cells on the bit line BL(1) other than CELL11. Also, as shown in FIG. 8A, the waveform for the voltage of the signal VAMP decreases when the discharge current pulls up the voltage VBE on the bit line BL(1). The waveform for the voltage Vout drops from the voltage VDD to approximately the voltage on the bit line BL(1) when the discharge current flows through the NMOS transistor 624 into the bit line BL(1). The waveform for the current Isensed generally corresponds with the waveform for the current Iref after the discharge current has finished flowing through the NMOS transistor 624.

Figure 8B:
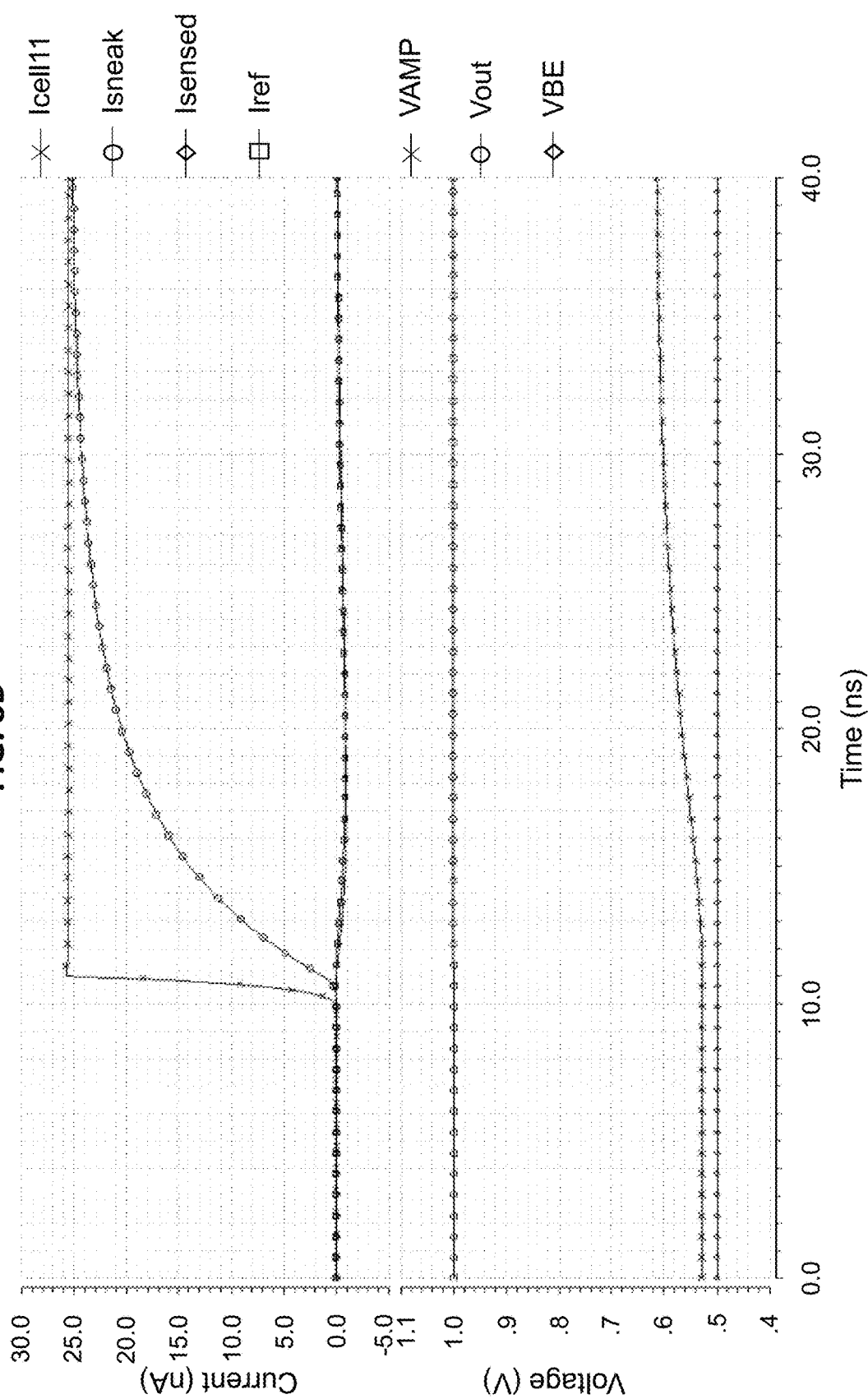
FIG. 8B illustrates current waveforms and voltage waveforms for a simulated READ operation of CELL11 in the first exemplary architecture of FIG. 6B, when CELL11 has a high resistive state.

Waveforms for the current Iref, the current Isensed, the current Isneak, the current ICELL11, and waveforms for the voltage VBE on the bit line BL(1), the voltage of the signal VAMP, and the voltage Vout for a simulated READ operation of CELL11 in the first exemplary architecture of FIG. 6B when the resistive change element SW11 has a high resistive state are shown in FIG. 8B. The word line WL(1) is driven to 0 volts or ground at approximately 10 nanoseconds during the simulated READ operation of CELL11 shown in FIG. 8B. The waveform for the current ICELL11 increases shortly after the word line WL(1) is driven to 0 volts or ground and the waveform for the current ICELL11 generally corresponds with ICELL11=VBE/RCELL11, where RCELL11 is the resistance of the resistive change element SW11 within CELL11. When current ICELL11 flows through CELL11 the voltage VBE on the bit line BL(1) drops below approximately 0.5 volts. It is noted that the drop in the voltage VBE on the bit line BL(1) is small enough that the waveform for the voltage VBE on the bit line BL(1) shown in FIG. 8B appears to remain constant at 0.5 volts.

When the resistive change element SW11 has a high resistive state, the current ICELL11 increases to a small current ICELL11 as shown in FIG. 8B and the potential amount of current Isensed increases to a fourth small potential amount of current. The voltage VBE on the bit line BL(1) drops to a fourth bit line voltage less than approximately 0.5 volts and causes the waveform for the voltage of the signal VAMP to increase from approximately 0.53 volts to approximately 0.61 volts. The potential amount of current Isensed does not increase beyond a set amount of current that can be supplied by the current source 622, and thus, the set amount of current that can be supplied by the current source 622 and a discharge current sufficient to discharge a voltage Vout of both the parasitic capacitance 625 and the input capacitance of the sense amplifier 626 from the voltage VDD to approximately the voltage on the bit line BL(1) do not flow through the NMOS transistor 624 into the bit line BL(1). The set amount of current that can be supplied by the current source 622 is 150 nanoamps and the set amount of current that can be supplied by the current source 622 is not reflected in FIG. 8B because the waveform for the current Iref supplied by the current source 622 does not increase to 150 nanoamps because the potential amount of current of the current Isensed does not increase to 150 nanoamps.

The waveform for the current Isensed generally corresponds with the waveform for the current Iref because a discharge current sufficient to discharge the voltage Vout of both the parasitic capacitance 625 and the input capacitance of the sense amplifier 626 from the voltage VDD to approximately the voltage VBE on the bit line BL(1) does not flow through the NMOS transistor 624 into the bit line BL(1). The waveform for the voltage Vout remains at approximately VDD because the discharge current sufficient to discharge the voltage Vout of both the parasitic capacitance 625 and the input capacitance of the sense amplifier 626 from the voltage VDD to approximately the voltage VBE on the bit line BL(1) does not flow through the NMOS transistor 624 into the bit line BL(1). The waveform for the current Isneak generally corresponds with Isneak=(Vref−VBE)/Rsneak, where Rsneak is a sum of the parallel resistances of the cells on the bit line BL(1) other than CELL11.

Figure 9A:
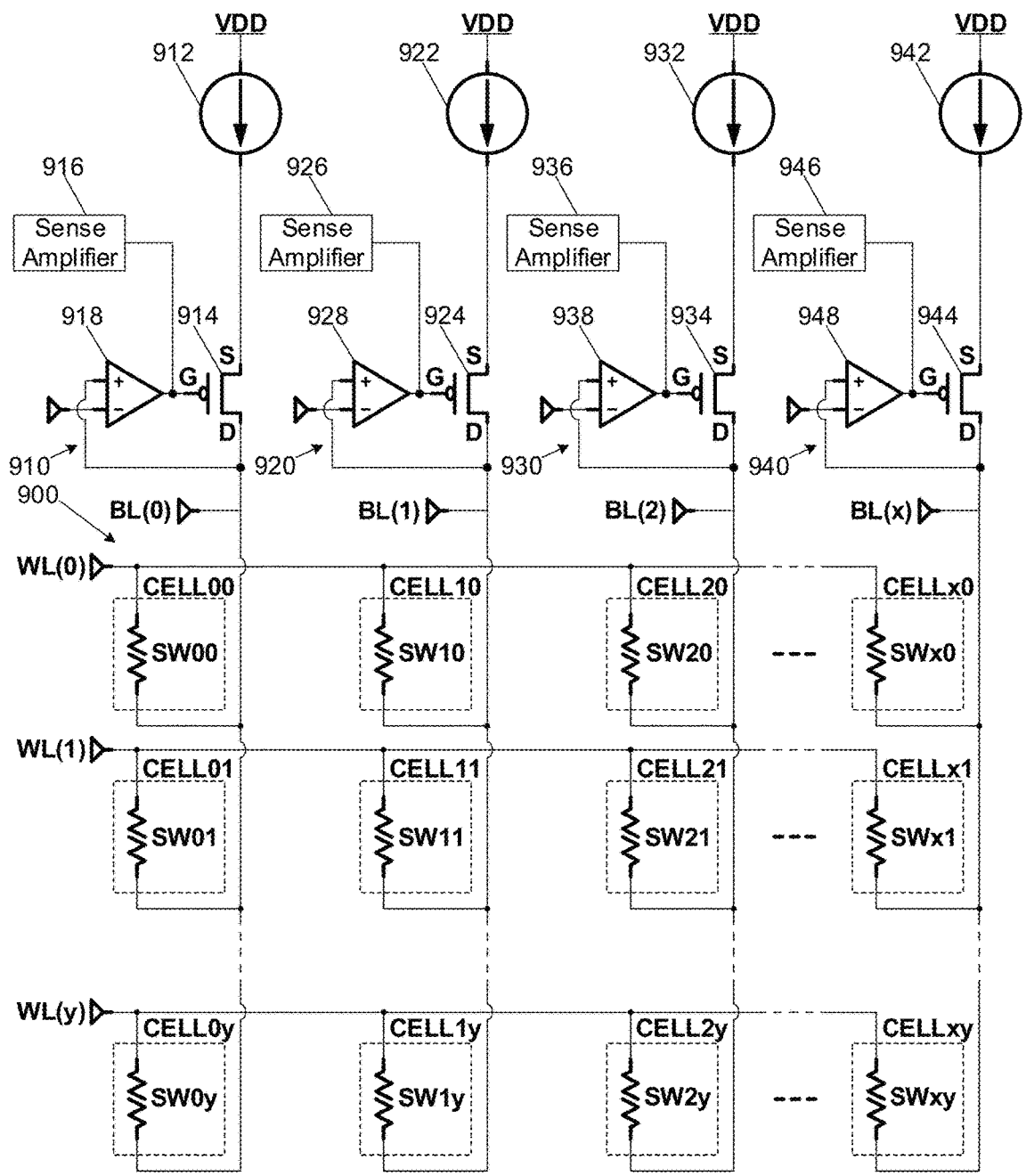
FIG. 9A illustrates a simplified schematic diagram of a second exemplary architecture for determining resistive states of resistive change elements in an array of 1-R resistive change element cells.

Referring now to FIG. 9A, a second exemplary architecture for determining resistive states of resistive change elements in a 1-R resistive change element array 900 by sensing current flow during READ operations is illustrated in a simplified schematic diagram. The 1-R resistive change element array 900 shown in FIG. 9A has a similar structure to the 1-R resistive change element array 300 discussed above with respect to FIG. 3. The 1-R resistive change element array 900 comprises a plurality of resistive change element cells CELL00-CELLxy, and each resistive change element cell includes a resistive change element SW00-SWxy that is accessed via two control lines (a word line and a bit line) and does not include an in situ selection device or other current limiting element. The resistive change element cells CELL00-CELLxy are referred to as 1-R resistive change element cells because the resistive change element cells include a resistive change element and do not include an in situ selection device or other current limiting element. Additionally, the 1-R resistive change element array 900 is referred to as a 1-R resistive change element array because the 1-R resistive change element array 900 includes 1-R resistive change element cells.

Each resistive change element SW00-SWxy has a first terminal respectively electrically connected to a word line WL(0)-WL(y) and a second terminal respectively electrically connected to a bit line BL(0)-BL(y). The resistive change elements can be two-terminal nanotube switching elements, phase change memory elements, metal oxide memory elements, or conductive bridge memory elements as well as other materials and designs.

The 1-R resistive change element array 900 is electrically connected to sense circuits 910, 920, 930, 940. Each sense circuit 910, 920, 930, 940, includes an p-channel metal oxide semiconductor field effect transistor (MOSFET) 914, 924, 934, 944, and a differential amplifier 918, 928, 938, 948. Each p-channel MOSFET 914, 924, 934, 944, also referred to as a PMOS transistor, has a gate terminal, a source terminal, and a drain terminal. Each differential amplifier 918, 928, 938, 948, has a non-inverting input terminal, an inverting input terminal, and an output terminal. A gate terminal of each PMOS transistor 914, 924, 934, 944, is respectively electrically connected to both an output terminal of a differential amplifier 918, 928, 938, 948, and an input terminal of a sense amplifier 916, 926, 936, 946, a source terminal of each PMOS transistor 914, 924, 934, 944, is respectively electrically connected to an output terminal of a current source 912, 922, 932, 934, and a drain terminal of each PMOS transistor 914, 924, 934, 944, is respectively electrically connected a bit line BL(0)-BL(x) of the resistive change element array 900. A non-inverting input terminal of each differential amplifier 918, 928, 938, 948, is respectively electrically connected to a drain terminal of a PMOS transistor 914, 924, 934, 944, forming a feedback loop, an inverting input of each differential amplifier 918, 928, 938, 948, can be respectively electrically connected to a voltage source or a driver circuit, and an output terminal of each differential amplifier 918, 928, 938, 948 is respectively electrically connected to both an input terminal of a sense amplifier 916, 926, 936, 946 and a gate terminal of a PMOS transistor 914, 924, 934, 944. The sense circuits 910, 920, 930, 940, are shown in FIG. 9A electrically connected to the bit lines BL(0)-BL(x) of the 1-R resistive change element array 900, alternatively, the sense circuits 910, 920, 930, 940 can be electrically connected to the word lines WL(0)-WL(y) instead of the bit lines BL(0)-BL(x). Further, for bipolar operation a sense circuit can be electrically connected to each of the bit lines BL(0)-BL(x) and a sense circuit can be electrically connected to each of the word lines WL(0)-WL(y).

The PMOS transistors 914, 924, 934, 944, are dimensioned for determining a resistive state of a resistive change element. The threshold voltage VT and the current carrying capacity of the PMOS transistors 914, 924, 934, 944, is based on the construction and geometry of the PMOS transistors 914, 924, 934, 944. The PMOS transistors 914, 924, 934, 944, have a threshold voltage VT less than 0 volts. Alternatively, the PMOS transistors can have a threshold voltage VT greater than or equal to 0 volts. The threshold voltage refers to the gate to source voltage level required to turn on the PMOS transistors. Alternatively, the sense circuits can include MOSFETs having n-type polarity such as n-channel MOSFETs, also referred to as NMOS transistors. Alternatively, the sense circuits can include other types of field effect transistors such as carbon nanotube field effect transistors (CNTFETs), SiGe FETs, fully-depleted silicon-on-insulator FETs, or multiple gate field effect transistors, such as FinFETs.

It is noted that when the sense circuits 910, 920, 930, 940, include n-type polarity transistors such as NMOS transistors in place of the PMOS transistors 914, 924, 934, 944, a gate terminal of each NMOS transistor is respectively electrically connected to both an output terminal of a differential amplifier 918, 928, 938, 948, and an input terminal of a sense amplifier 916, 926, 936, 946, a source terminal of each NMOS transistor is respectively electrically connected to a bit line BL(0)-BL(x) of the resistive change element array 900, and a drain terminal of each NMOS transistor is respectively electrically connected to an output terminal of a current source 912, 922, 932, 942. It is also noted that when the sense circuits 910, 920, 930, 940, include n-type polarity transistors such as NMOS transistors in place of the PMOS transistors 914, 924, 934, 944, a non-inverting input terminal of each differential amplifier 918, 928, 938, 948, can be respectively electrically connected to a voltage source or a driver circuit (not shown) and an inverting input terminal of each differential amplifier 918, 928, 938, 948, is respectively electrically connected to a source terminal of a NMOS transistor forming a feedback loop. It is further noted that when the sense circuits 910, 920, 930, 940, include n-type polarity transistors such as NMOS transistors in place of the PMOS transistors 914, 924, 934, 944, the sense circuits including the NMOS transistors operate similarly to the sense circuits 910, 920, 930, 940, including the PMOS transistors 914, 924, 934, 944, and thus, the discussion below with the sense circuits 910, 920, 930, 940, including PMOS transistors 914, 924, 934, 944, also generally applies to sense circuits including NMOS transistors.

The differential amplifiers 918, 928, 938, 948, can be amplifiers that generate an output voltage based on the difference between two input voltages, such as operational amplifiers. The current sources 912, 922, 932, 942, can be components that supply an amount of current limited to a set amount of current, such as two transistor current sources, three transistor current sources, four transistor current sources, switch capacitor resistors, resistors, carbon nanotubes, and other types of current sources or current mirrors. The sense amplifiers 916, 926, 936, 946, can be components that receive an input voltage and generate an output voltage that corresponds with a logic value.

Figure 9B:
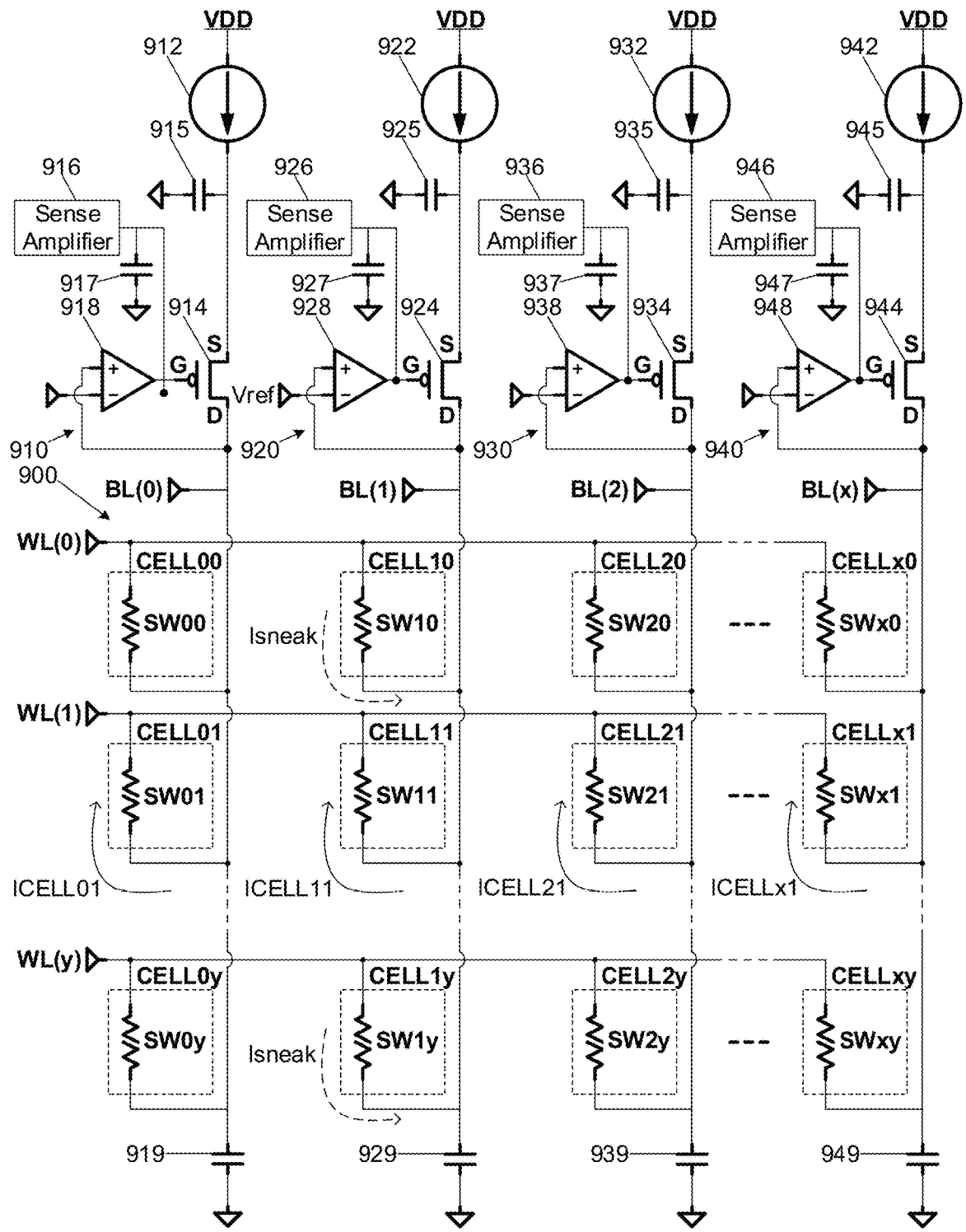
FIG. 9B illustrates a simplified schematic diagram showing current flow through 1-R resistive change element cells during a read operation of a 1-R resistive change element cell in a second exemplary architecture for determining resistive states of resistive change elements in an array of 1-R resistive change element cells.
Figure 9C:
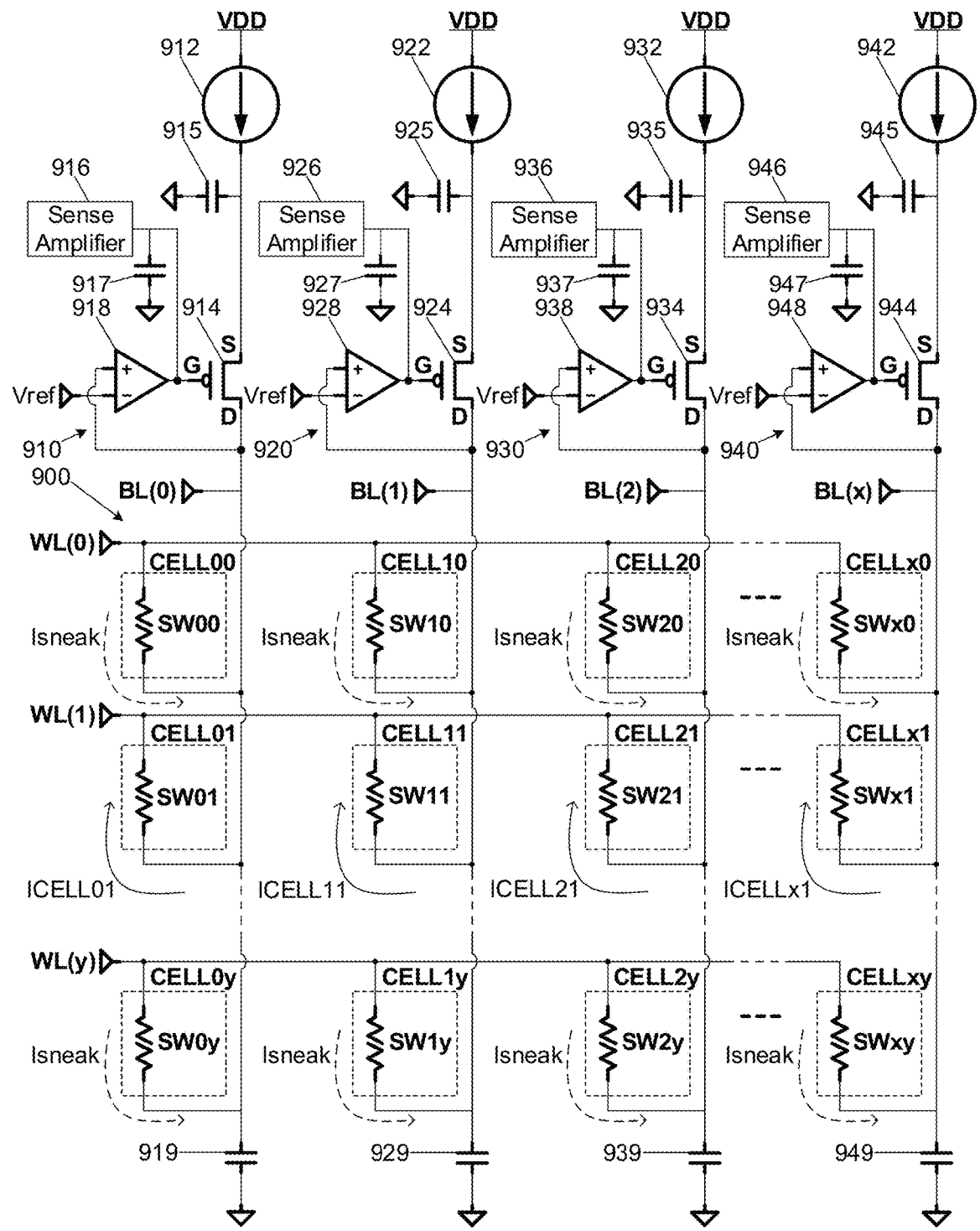
FIG. 9C illustrates a simplified schematic diagram showing current flow through 1-R resistive change element cells during a simultaneous read operation of each 1-R resistive change element cell on a word line in a second exemplary architecture for determining resistive states of resistive change elements in an array of 1-R resistive change element cells.

FIG. 9B illustrates a simplified schematic diagram showing current flow through resistive change element cells during a READ operation of CELL11 in the second exemplary architecture for determining resistive states of resistive change elements in the 1-R resistive change element array 900 by sensing current flow during READ operations. FIG. 9C illustrates a simplified schematic diagram showing current flow through resistive change element cells during simultaneous READ operations of each cell on the word line WL(1) in the exemplary architecture for determining resistive states of resistive change elements in the 1-R resistive change element array 900 by sensing current flow during READ operations. Performing READ operations of each cell on a word line at the same time can be highly desirable in certain applications where rapid data READ operations or page mode READ operations are required. The READ operation of CELL11 will be explained in detail further below, and READ operations of each cell in the 1-R resistive change element array 900 can be performed in a similar manner to the READ operation of CELL11. It is noted that the READ operations of CELL11 explained in further detail below generally describe current flowing through CELL11 as flowing from the bit line BL(1) to the word line WL(1), however, the devices and methods of the present disclosure are not limited in this regard. For example, when the sense circuits 910, 920, 930, 940, are electrically connected to the word lines WL(0)-WL(y), current will flow through CELL11 from the word line WL(1) to the bit line BL(1) during READ operations of CELL11.

Figure 9D:
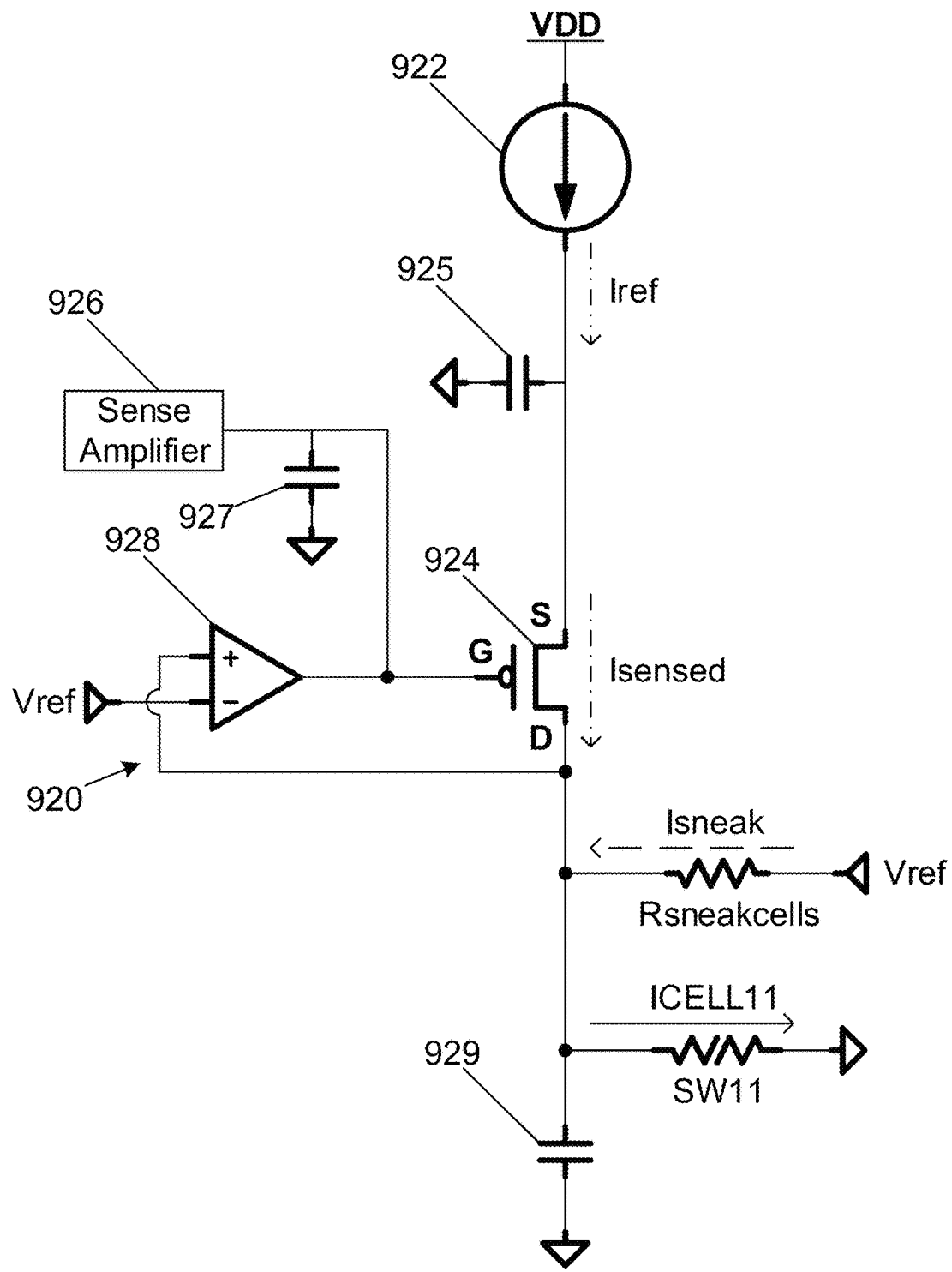
FIG. 9D illustrates a simplified schematic diagram showing current flow through a PMOS transistor and current flow on a bit line during a read operation of a 1-R resistive change element cell in a second exemplary architecture for determining resistive states of resistive change elements in an array of 1-R resistive change element cells.

FIGS. 9B-9D additionally show parasitic capacitances that visually illustrate capacitances of other connections and components. FIGS. 9B-9D show the parasitic capacitances 915, 925, 935, 945, of lines electrically connecting the current source 912, 922, 932, 942 to the PMOS transistors 914, 924, 934, 944, the parasitic capacitances 917, 927, 937, 947, of the lines electrically connecting the sense amplifiers 916, 926, 936, 946, to the PMOS transistors 914, 924, 934, 944, and the differential amplifiers 918, 928, 938, 948, and the parasitic capacitances 919, 929, 939, 949, of the bit lines BL(0)-BL(x). The parasitic capacitances 915, 917, 919, 925, 927, 929, 935, 937, 939, 945, 947, 949, are not separate circuit components but rather the parasitic capacitances 915, 917, 919, 925, 927, 929, 935, 937, 939, 945, 947, 949, visually illustrate capacitances of other connections and components. It is noted that the parasitic capacitances 915, 917, 919, 925, 927, 929, 935, 937, 939, 945, 947, 949, are not shown in FIG. 9A and that the parasitic capacitances are shown in FIGS. 9B-9D for the purpose of referring to the parasitic capacitances during the READ operations.

FIG. 10 illustrates a flow chart 1000 showing a second method for determining a resistive state of a resistive change element in a resistive change element array, where the resistive change element array includes a plurality of resistive change elements and each resistive change element is electrically connected to a bit line of a plurality of bit lines in the resistive change element array and a word line of a plurality of word lines in the resistive change element array. The method starts in step 1002 with selecting a resistive change element from a plurality of resistive change elements in a resistive change element array, where each resistive change element is electrically connected to a bit line of a plurality of bit lines in the resistive change element array and a word line of a plurality of word lines in the resistive change element array. The method proceeds in step 1004 with setting a potential amount of current permitted to be supplied for determining a resistive state of the resistive change element. The method proceeds in step 1006 with supplying an amount of current for determining the resistive state of the resistive change element, where the amount of current is limited to a set amount of current. The method continues in step 1008 with determining the resistive state of the resistive change element based on an amount of current flowing through the resistive change element and the amount of current for determining the resistive state of the resistive change element. The resistive state of the resistive change element is determined to be a low resistive state (which may correspond to a logic 1) when the amount of current flowing through the resistive change element is greater than the amount of current for determining the resistive state of the resistive change element and the resistive state of resistive change element is determined to be a high resistive state (which may correspond to a logic 0) when the amount of current flowing through the resistive change element is less than or equal to the amount of current for determining the resistive state of the resistive change element. It is noted that the steps of the method shown in FIG. 10 are not limited to being performed in the order shown in FIG. 10.

The second method for determining a resistive state of a resistive change element in a resistive change element array as discussed above with respect to FIG. 10, will be discussed below with respect to the READ operation of CELL11 in the resistive change element array 900 of FIG. 9B. However, the second method for determining a resistive state of a resistive change element in a resistive change element array is not limited to the second exemplary architecture shown in FIG. 9B. The second method for determining a resistive state of a resistive change element in a resistive change element array can be performed by other architectures and circuit elements.

The READ operation of CELL11 starts, as similarly discussed above in step 1002 of the flow chart 1000, by selecting CELL11 from the plurality of resistive change element cells CELL00-CELLxy in the 1-R resistive change element array 900. Selecting CELL11 from the plurality of resistive change element cells CELL00-CELLxy begins by driving each of the bit lines BL(0)-BL(x) to a reference voltage Vref, driving each of the word lines WL(0)-WL(y) to the reference voltage Vref, and driving the inverting input of the differential amplifier 928 to a reference voltage Vref. The bit lines BL(0)-BL(x) can be driven to the reference voltage Vref by the current sources 912, 922, 932, 942, and sense circuits 910, 920, 930, 940, driver circuits, or voltage sources. The word lines WL(0)-WL(y) can be driven to the reference voltage Vref by driver circuits or voltage sources. The inverting input of the differential amplifier 928 can be driven to the reference voltage Vref by driver circuits or voltage sources.

Additionally, the non-inverting input of the differential amplifier 928 is driven to the reference voltage Vref, the gate voltage VG of the PMOS transistor 924 is driven to a voltage level sufficient to turn off the PMOS transistor 924, the source voltage VS of the PMOS transistor 924 is driven to a power supply voltage VDD, the drain voltage VD of the PMOS transistor 924 is driven to the reference voltage Vref, and a voltage Vout1 of the parasitic capacitance 925 is driven to the power supply voltage VDD. The non-inverting input of the differential amplifier 928 and the drain voltage VD of the PMOS transistor 924 are driven to the reference voltage Vref because the voltage on the bit line BL(1) corresponds with the drain voltage VD of the PMOS transistor 924 and the non-inverting input terminal of the differential amplifier 928 is electrically connected to the drain terminal of the PMOS transistor 924 through the feedback loop. The gate voltage VG of the PMOS transistor 924 is driven to a voltage level sufficient to turn off the PMOS transistor 924 because the differential amplifier 928 outputs a signal VAMP to the gate terminal of the PMOS transistor 924 with the signal VAMP having a voltage such that the gate to source VGS of the PMOS transistor 924 is greater than the threshold voltage VT. The source voltage VS of the PMOS transistor and the voltage Vout1 of the parasitic capacitance 925 are driven to the power supply voltage VDD by the current source 922 because the gate to source voltage VGS of the PMOS transistor 924 is greater than threshold voltage VT and the PMOS transistor 924 is turned off.

When each of the bit lines BL(0)-BL(x) and each of the word lines WL(0)-WL(y) are driven to the reference voltage Vref, current does not flow through the cells CELL00-CELLxy because both sides of each cell are at the reference voltage Vref. When the differential amplifier 928 outputs the signal VAMP having a voltage such that the gate to source voltage VGS of the PMOS transistor 924 is greater than the threshold voltage VT, current does not flow through the PMOS transistor 924 because the PMOS transistor 924 is turned off. It is noted that the voltage on the bit line BL(1) may differ from the reference voltage Vref due to the limited gain of the differential amplifier 928, process variations, voltage variations, and temperature variations. It is further noted that current flow caused by the voltage on the bit line BL(1) differing from the reference voltage Vref does not prevent the READ operation of CELL11 when the current flow is much less than a set amount of current that can be supplied by a current source 922.

Selecting CELL11 from the plurality of resistive change element cells CELL00-CELLxy concludes by discontinuing driving of the bit line BL(1) to the reference voltage Vref, discontinuing driving the word line WL(1) to the reference voltage Vref, and driving the word line WL(1) to a voltage less than the reference voltage Vref. After driving of the bit line BL(1) to the reference voltage Vref is discontinued, the bit line BL(1) is left initially charged to the reference voltage Vref due to the parasitic capacitance 929 of the bit line BL(1). The current flow during the READ operation of CELL11 will be described below with the word line WL(1) driven to 0 volts or ground, however, the READ operation of CELL11 can alternatively include driving the word line WL(1) to other voltages less than the reference voltage Vref, such as a positive voltage less than the reference voltage Vref or a negative voltage less than the reference voltage Vref.

When the word line WL(1) is driven to 0 volts or ground, current begins to flow through the cells CELL01, CELL11, CELL21, CELLx1 because the voltage on the sides of these cells respectively connected to bit lines BL(0)-BL(x) is the reference voltage Vref and the voltage on the sides of these cells connected to the word line WL(1) is 0 volts or ground. The current flowing through each of the cells CELL01, CELL21, and CELLx1 can be approximated using Ohm's Law, as Icell=Vref/Rcell for each cell, where Rcell is the resistance of the resistive change element within the cell. The current flowing through CELL11 can only initially be approximated using Ohm's Law as, ICELL11=Vref/

RCELL11, where RCELL11 is the resistance of the resistive change element SW11 within CELL11, because the voltage on the bit line BL(1) drops below the reference voltage Vref when the current ICELL11 flows through CELL11. The current flowing through the cells CELL01, CELL11, CELL21, and CELLx1 is shown in FIGS. 9B-9C as ICELL01, ICELL11, ICELL21, and ICELLx1. It is noted that for read operations performed on each cell on the word line WL(1) at the same time, as shown in FIG. 9C, the currents ICELL01, ICELL11, ICELL21, and ICELLx1 can only initially be approximated using Ohm's Law as, Icell=Vref/Rcell, where Rcell is the resistance of the resistive change element within the cell, because the voltage on each of the bit lines BL(1)-BL(x) drops below the reference voltage Vref when the current flows through the cells.

The voltage drop on the bit line BL(1) causes the gate to source voltage VGS of the PMOS transistor 924 to decrease because the voltage drop on the bit line BL(1) causes the gate voltage VG of the PMOS transistor 924 to decrease. The voltage on the bit line BL(1) corresponds with the voltage of the non-inverting input of the differential amplifier 928, and thus, the voltage drop on the bit line BL(1), while the voltage of the inverting input of the differential amplifier 928 remains at the reference voltage Vref, causes the voltage of the signal VAMP supplied to the gate terminal of the PMOS transistor 924 to decrease which causes the gate voltage VG to decrease. The voltage of the signal VAMP is determined by multiplying the gain of the differential amplifier 928 with the difference between the voltage of the non-inverting input and the voltage of the inverting input. Thus, the gate to source voltage VGS can be approximately determined by Equation No. 2:

$$VGS=\text{Gain}(\text{Voltage of the Non-Inverting Input}-\text{Voltage of the Inverting Input})-VS$$

with the voltage on the non-inverting input being the voltage on the bit line BL(1), the voltage on the inverting input being the reference voltage Vref, and the source voltage VS being the voltage Vout1 of the parasitic capacitance 925. The differential amplifier 928 has a large gain so that a small increase in the difference between the voltage on the non-inverting input and the voltage on the inverting input causes a large decrease in the voltage of the signal VAMP. For example, as shown by the above Equation No. 2, when the differential amplifier 928 has a gain of approximately 10.5, the voltage on the bit line BL(1) drops by a 1 microvolt, the voltage of the inverting input remains constant at the reference voltage Vref, and the voltage Vout1 of the parasitic capacitance 925 remains constant, the gate to source voltage VGS of the NMOS transistor 924 will decrease by 10.5 microvolts. The voltage drop on the bit line BL(1) also causes a sneak current Isneak, also referred to as leakage current, to flow into the bit line BL(1) through each of CELL10 and CELL1y because the voltage on the sides of these cells respectively electrically connected to word lines WL(0) and WL(y) is the reference voltage Vref and the voltage on the sides of these cells electrically connected to the bit line BL(1) is less than the reference voltage Vref.

The current flow through the PMOS transistor 924 and the current flow on the bit line BL(1) during the READ operation of CELL11 are explained in further detail below with reference to the simplified schematic diagram of FIG. 9D. The simplified schematic of FIG. 9D shows the sense circuit 920, the current source 922, the parasitic capacitance 925, the sense amplifier 926, the parasitic capacitance 927, the parasitic capacitance 929, the resistive change element SW11, and a resistor Rsneakcells representing the resistive change element cells electrically connected to the bit line BL(1) other than CELL11. The simplified schematic of FIG. 9D does not show the rest of the second exemplary architecture of FIG. 9B so that the current flow can be shown with greater clarity. The current Iref illustrates current supplied by the current source 922, the current Isensed illustrates current flowing through the PMOS transistor 924, the current Isneak illustrates a sum of individual Isneak currents flowing through the cells electrically connected to the bit line BL(1) other than CELL11, and the current ICELL11 illustrates current flowing through CELL11. The amount of each of the current Iref, the current Isensed, the current Isneak, and the current ICELL11, can each vary based on the resistive state of the resistive change element SW11 within CELL11. The amount of each of the current Iref, the current Isensed, the current Isneak, and the current ICELL11, can also each vary during the READ operation of CELL11.

The flow of the current ICELL11 through CELL11 causes the voltage on the bit line BL(1) to drop. When the resistive change element SW11 has a low resistive state, a large current ICELL11 flows through CELL11 and causes the voltage on the bit line BL(1) to drop to a fifth bit line voltage less than the reference voltage Vref. When the resistive change element SW11 has a high resistive state, a small current ICELL11 flows through CELL11 and causes the voltage on the bit line BL(1) to drop to a sixth bit line voltage greater than the fifth bit line voltage. The large current ICELL11 is greater than the small current ICELL11. The amount of the current ICELL11, for a given voltage VBL(1) on the bit line BL(1), can be approximated using Ohm's Law as ICELL11=VBL(1)/RCELL11, where RCELL11 is the resistance of the resistive change element SW11 within CELL11. As shown by the above equation, for a given voltage VBL(1) on the bit line BL(1), the amount of the current ICELL11 will be larger when the resistive change element SW11 has a low resistive state, for example a resistance on the order of 100 kΩ (corresponding, typically, to a logic '1,' a SET state), and the amount of the current ICELL11 will be smaller when the resistive change element SW11 has a high resistive state, for example a resistance on the order of 10 MΩ (corresponding, typically, to a logic '0,' a RESET state).

The current Isneak flows into the bit line BL(1) when the voltage on the bit line BL(1) drops below the reference voltage Vref. The current Isensed flows into the bit line BL(1) when the voltage on the bit line BL(1) drops a voltage level where the gate to source voltage VGS of the PMOS transistor 924 is less than the threshold voltage VT. The current Isneak, for a given voltage VBL(1) on the bit line BL(1), can be approximated using Ohm's Law as Isneak= (Vref-VBL(1))/Rsneak, where Rsneak is the sneak resistance. The sneak resistance is a sum of the parallel resistances of the cells electrically connected to the bit line BL(1) other than CELL11. As shown by the above equation, when the voltage on the bit line BL(1) drops to the fifth bit line voltage the current Isneak is greater than the current Isneak when the voltage on the bit line BL(1) drops to the sixth bit line voltage because the difference between the reference voltage Vref and the fifth bit line voltage is greater than the difference between the reference voltage Vref and the sixth bit line voltage.

Setting a potential amount of current permitted to be supplied for determining the resistive state of the resistive change element SW11 within CELL11, as similarly discussed above in step 1004 of flow chart 1000, during the READ operation of CELL11 is carried out by setting a potential amount of current Isensed that can flow through the PMOS transistor 924. The potential amount of current Isensed that can flow through the PMOS transistor 924 is based on the difference between the voltage of the signal VAMP and the voltage Vout1 of the parasitic capacitance 925, which as discussed above, corresponds with the gate to source voltage VGS. The potential amount of current Isensed that can flow through the PMOS transistor 924 generally increases as the gate to source voltage VGS decreases below the threshold voltage VT and generally decreases as the gate to source voltage VGS increases toward the threshold voltage VT.

When the resistive change element SW11 has a low resistive state, the gate to source voltage VGS of the PMOS transistor 924 decreases to a fifth gate to source voltage VGS because the voltage on the bit line BL(1) drops to the fifth bit line voltage due to the large current ICELL11. The gate to source voltage VGS decreasing to the fifth gate to source voltage VGS causes the potential amount of current Isensed that can flow through the PMOS transistor 924 into the bit line BL(1) to increase to a fifth large potential amount of current. When the resistive change element SW11 has a high resistive state, the gate to source voltage VGS of the PMOS transistor 924 decreases a smaller amount to a sixth gate to source voltage VGS because the voltage on the bit line BL(1) drops to the sixth bit line voltage due to the small current ICELL11. The gate to source voltage VGS decreasing to the sixth gate to source voltage VGS causes the potential amount of current Isensed that can flow through the PMOS transistor 924 into the bit line BL(1) to increase to a sixth small potential amount of current. Thus, when the resistive change element SW11 has a low resistive state the potential amount of current Isensed will increase to the fifth large potential amount of current and when the resistive change element SW11 has a high resistive state the potential amount of current Isensed will increase to the sixth small potential amount of current. It is noted that the fifth gate to source voltage VGS is less than the sixth gate to source voltage VGS and the fifth large potential amount of current is greater than the sixth small potential amount of current. It is also noted that the sixth small potential amount of current that can flow through the PMOS transistor 924 into the bit line BL(1) can be 0 amps because the sixth small gate to source VGS can be greater than the threshold voltage VT of the PMOS transistor 924.

Supplying an amount of current for determining the resistive state of the resistive change element SW11 within CELL11, where the amount of current is limited to a set amount of current, as similarly discussed above in step 1006 of flow chart 1000, during the READ operation of CELL11 is carried out by the current source 922 supplying an amount of current Iref for determining the resistive state of the resistive change element SW11 through the PMOS transistor 924. The amount of the current Iref supplied for determining the resistive state of the resistive change element SW11 is limited to a set amount of current that can be supplied by the current source 922 and is regulated by the potential amount of current Isensed that can flow through PMOS transistor 924 until the potential amount of current Isensed that can flow through the PMOS transistor 924 exceeds the set amount of current that can be supplied by the current source 922. It is noted that the amount of the current Iref supplied for determining the resistive state of the resistive change element SW11 can be 0 amps, when the potential amount of current Isensed that can flow through the PMOS transistor 924 is 0 amps.

The set amount of current that can be supplied by the current source 922 is set such that the large current ICELL11 is greater than the set amount of current that can be supplied by the current source 922 and the small current ICELL11 is less than the set amount of current that can be supplied by the current source 922. For example, when the large current ICELL11 is 1 microamp and the small current ICELL11 is 350 nanoamps, the set amount of current that can be supplied by the current source 922 can be the average of the two currents, 675 nanoamps. The set amount of current that can be supplied by the current source 922 can be the same set amount of current for each READ operation. Alternatively, the set amount of current that can be supplied by the current source 922 can be set to different amounts of current for READ operations. For example, the same set amount of current can be supplied for READ operations of CELL10 and CELL11 and a different set amount of current can be supplied for READ operations of CELL1y, the same set amount of current can be supplied for READ operations of CELL11 and CELL1y and a different set amount of current can be supplied for READ operations of CELL10, the same set amount of current can be supplied for READ operations of CELL10 and CELL1y and a different set amount of current can be supplied for the READ operations of CELL11, and a different set amount of current can be supplied for the READ operations of each of CELL10, CELL11, and CELL1y. Further, the fifth large potential amount of current Isensed is greater than the set amount of current that can be supplied by the current source 922 and the sixth small potential amount of current Isensed is less than the set amount of current that can be supplied by the current source 922.

As similarly discussed above in step 1008 of flow chart 1000, during a READ operation of CELL11 determining the resistive state of the resistive change element SW11 within CELL11 is based on the amount of current flowing through the resistive change element SW11 and the amount of current Iref for determining the resistive state of the resistive change element SW11. The resistive state of the resistive change element SW11 is determined to be a low resistive state when the amount of current flowing through resistive change element SW11 is greater than the amount of current Iref for determining the resistive state of the resistive change element. The resistive state of resistive change element SW11 is determined to be a high resistive state when the amount of current flowing through the resistive change element SW11 is less than the amount of current Iref for determining the resistive state of the resistive change element. The amount of current flowing through the resistive change element SW11 corresponds with the amount of current ICELL11 flow through CELL11.

When the resistive change element SW11 has a low resistive state, the large current ICELL11 flows through the resistive change element SW11 and the potential amount of current Isensed that can flow through the PMOS transistor 924 increases to the fifth large potential amount of current. The amount of Iref for determining the resistive state of the resistive change element SW11 is not regulated by the potential amount of current Isensed that can flow through the PMOS transistor 924 because the fifth large potential amount of current exceeds the set amount of current, and thus, the amount of Iref for determining the resistive state of the resistive change element SW11 is the set amount of current that can be supplied by the current source 922. The voltage on the bit line BL(1) and the voltage of the non-inverting input of the differential amplifier 928 drop to the fifth bit line voltage because the large current ICELL11 flowing through the resistive change element SW11 is greater than the amount of the current Iref for determining the resistive state of the resistive change element SW11. The differential amplifier 928 outputs the signal VAMP having a low output voltage because the voltage of the non-inverting input drops to the fifth bit line voltage. When the resistive change element SW11 has a high resistive state, the small current ICELL11 flows through the resistive change element SW11 and the potential amount of current Isensed that can flow through the PMOS transistor 924 increases to the sixth small potential amount of current. The amount of Iref for determining the resistive state of the resistive change element SW11 is regulated by the potential amount of current Isensed that can flow through the PMOS transistor 924 because the sixth small potential amount of current is less than the set amount of current that can be supplied by the current source 922. The small current ICELL11 is less than or equal to the amount of Iref for determining the resistive state of the resistive change element SW11 regulated by the potential amount of current Isensed that can flow through the PMOS transistor 924. The voltage on the bit line BL(1) and the voltage of the non-inverting input of the differential amplifier 928 drop to the sixth bit line voltage because the small current ICELL11 is less than or equal to the amount of the current Iref for determining the resistive state of the resistive change element SW11. The differential amplifier 928 outputs the signal VAMP having a high output voltage because the voltage of the non-inverting input drops the sixth bit line voltage. It is noted that the low output voltage of the signal VAMP is less than the high output voltage of the signal VAMP. Thus, the voltage level of the signal VAMP is determined by the relationship between the amount of current flowing through the resistive change element SW11 and the amount of current Iref for determining the resistive state of the resistive change element SW11 and the low output voltage of the VAMP signal indicates the resistive change element SW11 has a low resistive state and the high output voltage of the signal VAMP indicates the resistive change element SW11 has a high resistive state.

The sense amplifier 926 receives the signal VAMP as an input voltage and after at least a third amount of time the sense amplifier 926 outputs a voltage based on the voltage level of the signal VAMP. When the sense amplifier 926 receives the signal VAMP having a low output voltage, after at least the third amount of time the sense amplifier 926 outputs a voltage that corresponds with a logic 1. When the sense amplifier 926 receives the signal VAMP having a high output voltage, after at least the third amount of time the sense amplifier 926 outputs a voltage that corresponds with a logic 0. Alternatively, the sense amplifiers 916, 926, 936, 946, are omitted from the architecture shown in FIGS. 9A-9D and a logic circuit or a control circuit, such as processor, a controller, or a FGPA, is electrically connected to the output terminal of the differential amplifier 928 so that the logic circuit or the control circuit receives the signal VAMP as an input voltage.

The third amount of time refers to the amount of time from the start of a read operation of CELL11 when the resistive change element SW11 has a low resistive state until the voltage of the input capacitance of the sense amplifier 926 and the voltage Vout2 of the parasitic capacitance 927 swings to the low output voltage of the VAMP signal. READ operations performed when the resistive change element SW11 has a low resistive state and when the resistive change element SW11 has a high resistive state both wait the third amount of time before determining an input voltage even though the input capacitance of the sense amplifier 926 and the parasitic capacitance 927 does not swing to the low output voltage of the VAMP signal when the resistive change element SW11 has a high resistive state.

Figure 11A:
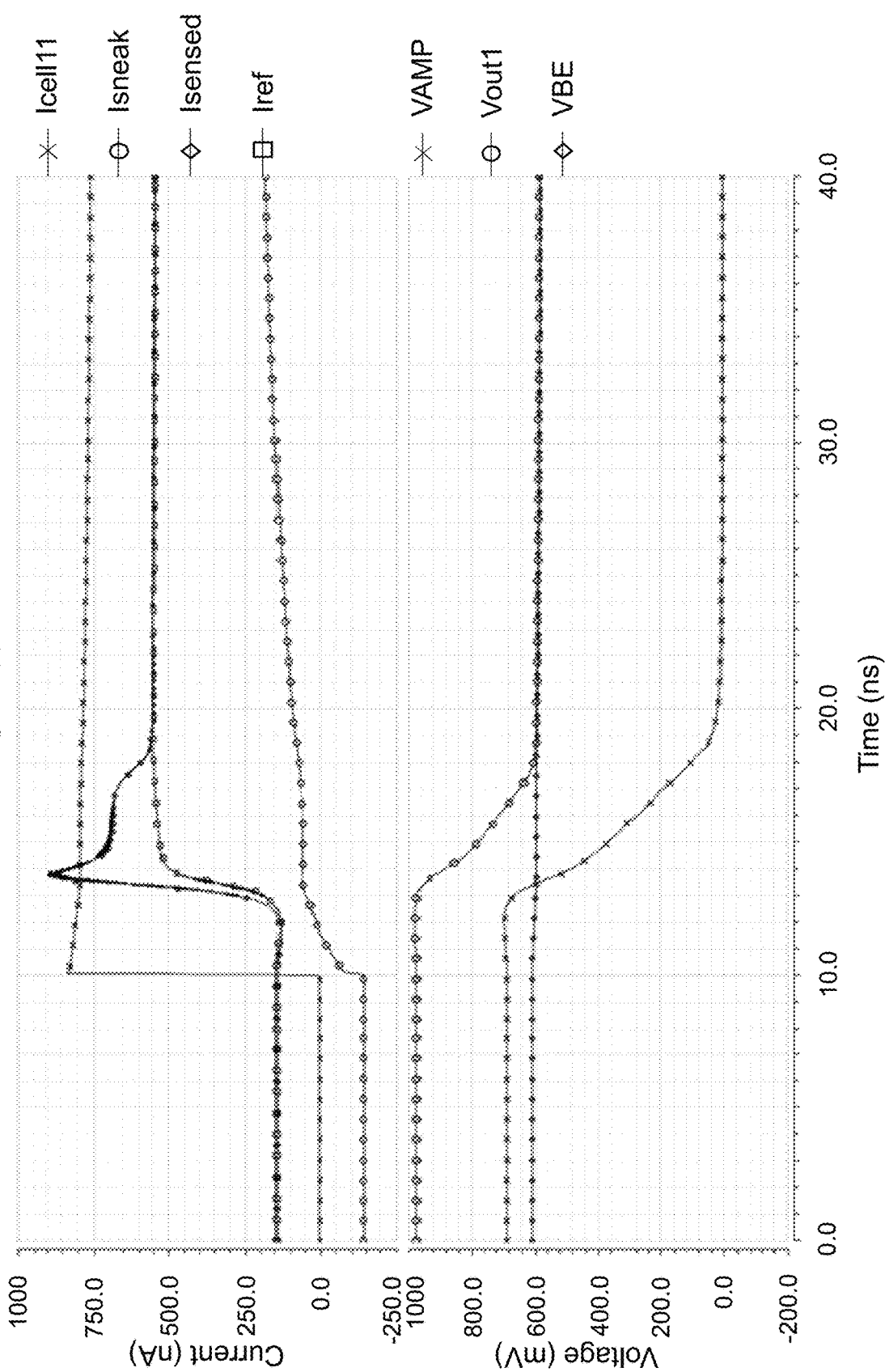
FIG. 11A illustrates current waveforms and voltage waveforms for a simulated READ operation of CELL11 in the second exemplary architecture of FIG. 9B, when CELL11 has a low resistive state.

Waveforms for the current Iref, the current Isensed, the current Isneak, the current ICELL11, and waveforms for the voltage VBE on the bit line BL(1), the voltage of the signal VAMP, and the voltage Vout1 for a simulated READ operation of CELL11 in the second exemplary architecture of FIG. 9B when the resistive change element SW11 has a low resistive state are shown in FIG. 11A. The word line WL(1) is driven to 0 volts or ground at approximately 10 nanoseconds during the simulated READ operation of CELL11 shown in FIG. 11A. It is noted that the waveforms for the current Iref, the current Isensed, and the current Isneak show current flow prior to driving the word line WL(1) to ground at approximately 10 nanoseconds because the current source 922 and the sense circuit 920 drive the voltage VBE on the bit line BL(1) to a voltage that differs from the reference voltage Vref by a small amount. The waveform for the current ICELL11 increases shortly after the word line WL(1) is driven to 0 volts or ground and the waveform for the current ICELL11 generally corresponds with ICELL11=VBE/RCELL11, where RCELL11 is the resistance of the resistive change element SW11 within CELL11. When the current ICELL11 flows through CELL11 the voltage VBE on the bit line BL(1) drops below approximately 0.61 volts as shown in FIG. 11A.

When the resistive change element SW11 has a low resistive state, the current ICELL11 increases to a large current ICELL11 as shown in FIG. 11A and the potential amount of current Isensed increases to a fifth large potential amount of current. The voltage VBE on the bit line BL(1) drops to a fifth bit line voltage less than approximately 0.61 volts and causes the waveform for the voltage of the signal VAMP to decrease from approximately 0.68 volts to approximately 0 volts. When the potential amount of current Isensed increases beyond a set amount of current that can be supplied by the current source 922, the amount of current Iref supplied by the current source 922 increases to the set amount of current and the set amount of current and a discharge current sufficient to discharge the voltage Vout1 of the parasitic capacitance 925 from the voltage VDD to approximately the voltage on the bit line BL(1) flow through the PMOS transistor 924 into the bit line BL(1). The set amount of current that can be supplied by the current source 922 is 550 nanoamps and the set amount of current that can be supplied by the current source 922 is reflected in FIG. 11A by the waveform for the current Iref supplied by the current source 922 plateauing at 550 nanoamps after the potential amount of current Isensed increases beyond 550 nanoamps. The flow of the set amount of current and the discharge current through the PMOS transistor 924 into the bit line BL(1) is shown in FIG. 11A by the waveform for the current Isensed increasing above the waveform for the current Iref.

When the potential amount of current Isensed increases beyond the set amount of current by a large amount, the amount of the discharge current rapidly increases as shown by a spike in the waveform for the current Isensed at approximately 14 nanoseconds. The rapid increase of the discharge current can reduce the impact of the sneak current Isneak by pulling up the voltage VBE on the bit line BL(1) and decreasing the sneak current Isneak. The waveform for the current Isneak generally corresponds with Isneak=(Vref−VBE)/Rsneak, where Rsneak is a sum of the parallel resistances of the cells on the bit line BL(1) other than CELL11. The waveform for the voltage Vout1 drops from the voltage VDD to approximately the voltage on the bit line BL(1) when the discharge current flows through the PMOS transistor 924 into the bit line BL(1). The waveform for the current Isensed generally corresponds with the waveform for the current Iref after the discharge current has finished flowing through the PMOS transistor 924.

The voltage of the input capacitance of the sense amplifier 926 and a voltage Vout2 of the parasitic capacitance 927 correspond with the voltage of the signal VAMP because the signal VAMP is supplied to the sense amplifier 926, as shown in FIGS. 9B and 9D. The voltage of the signal VAMP swings from approximately 0.68 volts to approximately 0 volts, as shown in FIG. 11A, when the resistive change element SW11 has a low resistive state. Thus, the voltage of the input capacitance of the sense amplifier 926 and the voltage Vout2 of the parasitic capacitance 927 also swings from approximately 0.68 volts to approximately 0 volts when the resistive change element SW11 has a low resistive state.

Figure 11B:
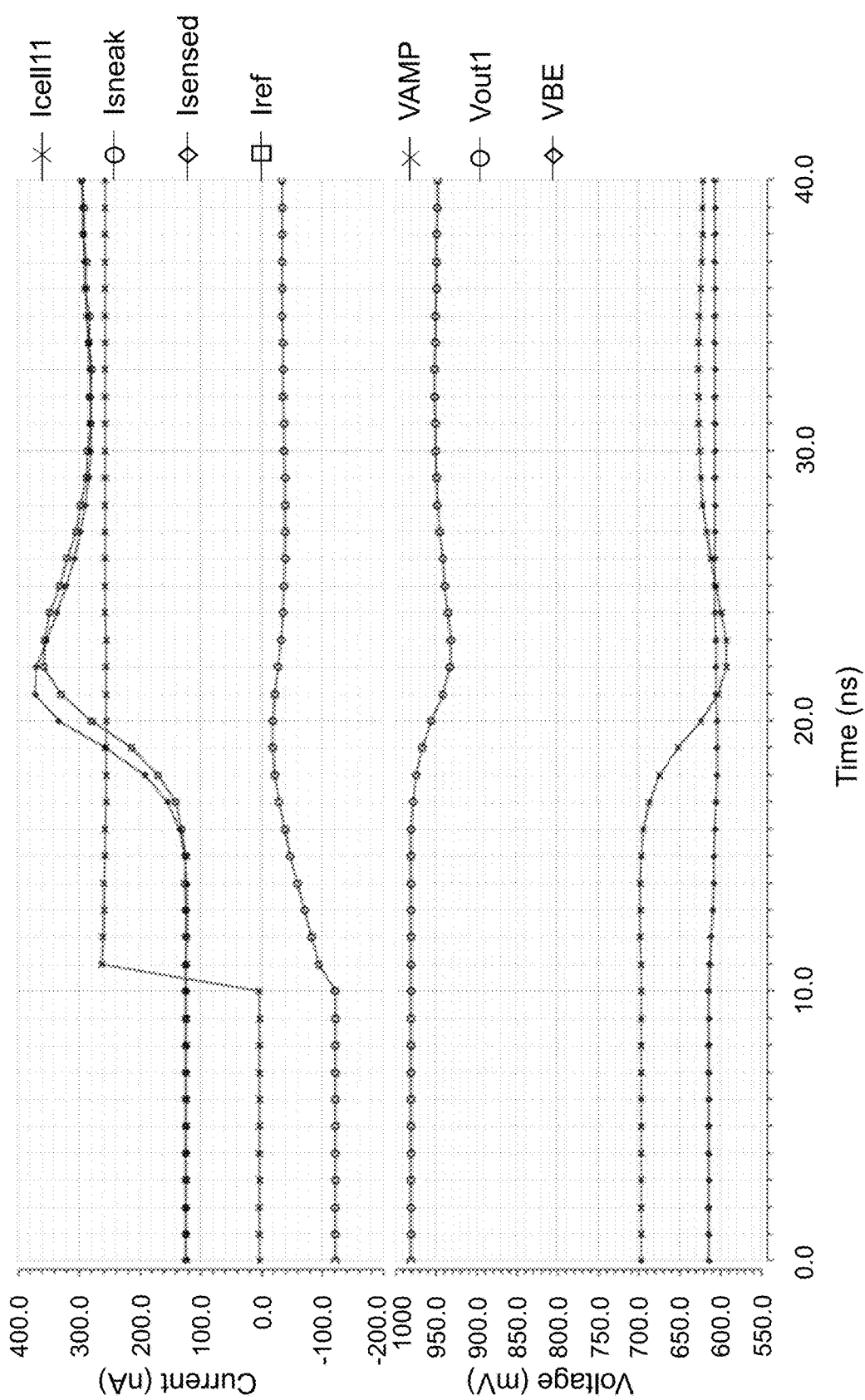
FIG. 11B illustrates current waveforms and voltage waveforms for a simulated READ operation of CELL11 in the second exemplary architecture of FIG. 9B, when CELL11 has a high resistive state.

Waveforms for the current Iref, the current Isensed, the current Isneak, the current ICELL11, and waveforms for the voltage VBE on the bit line BL(1), the voltage of the signal VAMP, and the voltage Vout1 for a simulated READ operation of CELL11 in the second exemplary architecture of FIG. 9B when the resistive change element SW11 has a high resistive state are shown in FIG. 11B. The word line WL(1) is driven to 0 volts or ground at approximately 10 nanoseconds during the simulated READ operation of CELL11 shown in FIG. 11B. It is noted that the waveforms for the current Iref, the current Isensed, and the current Isneak show current flow prior to driving the word line WL(1) to ground at approximately 10 nanoseconds because the current source 922 and the sense circuit 920 drives the voltage on the bit line BL(1) to a voltage differs from the reference voltage Vref by a small amount. The waveform for the current ICELL11 increases shortly after the word line WL(1) is driven to 0 volts or ground and the waveform for the current ICELL11 generally corresponds with ICELL11=VBE/ RCELL11, where RCELL11 is the resistance of the resistive change element SW11 within CELL11. When the current ICELL11 flows through CELL11 the voltage VBE on the bit line BL(1) drops below approximately 0.61 volts as shown in FIG. 11B.

When the resistive change element SW11 has a high resistive state, the current ICELL11 increases to a small current ICELL11 as shown in FIG. 11B and the potential amount of current Isensed increases to a sixth small potential amount of current. The voltage VBE on the bit line BL(1) drops to a sixth bit line voltage less than approximately 0.61 volts and causes the waveform for the voltage of the signal VAMP to decrease from approximately 0.7 volts to approximately 0.6 volts. The potential amount of current Isensed does not increase beyond the set amount of current that can be supplied by the current source 922, and thus, the set amount of current that can be supplied by the current source 922 and a discharge current sufficient to discharge a voltage Vout1 of the parasitic capacitance 925 from the voltage VDD to approximately the voltage VBE on the bit line BL(1) do not flow through the PMOS transistor 924 into the bit line BL(1). The set amount of current that can be supplied by the current source 922 is 550 nanoamps and the set amount of current that can be supplied by the current source 922 is not reflected in FIG. 11B because the waveform for the current Iref supplied by the current source 922 does not increase to 550 nanoamps because the potential amount of the current Isensed does not increase to 550 nanoamps.

The waveform for the current Isensed generally corresponds with the waveform for the current Iref because a discharge current sufficient to discharge the voltage Vout1 of the parasitic capacitance 925 from the voltage VDD to approximately the voltage VBE on the bit line BL(1) does not flow through the PMOS transistor 924 into the bit line BL(1). The waveform for the voltage Vout1 remains at approximately the voltage VDD because the discharge current sufficient to discharge the voltage Vout1 of the parasitic capacitance 925 from the voltage VDD to approximately the voltage VBE on the bit line BL(1) does not flow through the PMOS transistor 924 into the bit line BL(1). The waveform for the current Isneak generally corresponds with Isneak= (Vref−VBE)/Rsneak, where Rsneak is a sum of the parallel resistances of the cells on the bit line BL(1) other than CELL11.

The voltage of the input capacitance of the sense amplifier 926 and the voltage Vout2 of the parasitic capacitance 927 correspond with the voltage of the signal VAMP because the signal VAMP is supplied to the sense amplifier 926, as shown in FIGS. 9B and 9D. The voltage of the signal VAMP swings from approximately 0.7 volts to approximately 0.6 volts, as shown in FIG. 11B, when the resistive change element SW11 has a high resistive state. Thus, the voltage of the input capacitance of the sense amplifier 926 and the voltage Vout2 of the parasitic capacitance 927 also swings from approximately 0.7 volts to approximately 0.6 volts when the resistive change element SW11 has a high resistive state.

The input voltages received by the sense amplifier 926 differ from the input voltages received by the sense amplifier 626 because the sense amplifier 926 receives input voltages that correspond with the voltage of the signal VAMP and the sense amplifier 626 receives input voltages that correspond with the voltage Vout. The voltage of the signal VAMP can differ from the voltage Vout because the voltage of the signal VAMP can fluctuate between the power supply voltages supplied to the differential amplifier, while the voltage Vout can fluctuate between the power supply voltage VDD and the voltage on the bit line. For example, when the power supply voltages supplied to the differential amplifier are 3 volts and 0 volts, the power supply voltage VDD is 1 volt, and the voltage on the bit line BL(1) is 0.5 volts, the voltage of the signal VAMP can fluctuate between 3 volts and 0 volts, while the voltage Vout of the parasitic capacitance 625 can fluctuate between 1 volt and 0.5 volts. In the above example, the voltage swing of the voltage of the signal VAMP when the resistive change element SW11 has a low resistive state can be larger than the voltage swing of the Vout when the resistive change element SW11 has a low resistive.

Although the present invention has been described in relation to particular embodiments thereof, many other variations and modification and other uses will become apparent to those skilled in the art. It is preferred, therefore, that the present invention not be limited by the specific disclosure herein.

What is claimed is:

1. A method for determining a resistive state of a resistive change element in a resistive change element array, said method comprising:
    selecting a resistive change element from a plurality of resistive change elements in a resistive change element array, wherein each resistive change element is electrically connected to a bit line of a plurality of bit lines in said resistive change element array and a word line of a plurality of word lines in said resistive change element array;

setting a potential amount of current permitted to be supplied for determining a resistive state of said resistive change element;

supplying an amount of current for determining said resistive state of said resistive change element to said bit line electrically connected to said resistive change element, wherein said amount of current for determining said resistive state of said resistive change element is limited to a set amount of current, and wherein said amount of current for determining said resistive state of said resistive change element is regulated by said potential amount of current permitted to be supplied until said potential amount of current permitted to be supplied exceeds said set amount of current; and determining said resistive state of said resistive change element based on said potential amount of current permitted to be supplied and said set amount of current.

2. The method of claim 1, wherein said resistive state of said resistive change element is determined to be a low resistive state when said potential amount of current permitted to be supplied is greater than said set amount of current.

3. The method of claim 2, wherein said low resistive state corresponds to a logic 1.

4. The method of claim 1, wherein said resistive state of said resistive change element is determined to be a high resistive state when said potential amount of current permitted to be supplied is less than said set amount of current.

5. The method of claim 4, wherein said high resistive state corresponds to a logic 0.

6. The method of claim 1, wherein said resistive change element array comprises a plurality of resistive change element cells, and wherein each resistive change element cell includes one resistive change element of said plurality of resistive change elements.

7. The method of claim 6, wherein each resistive change element cell in said plurality of resistive change element cells does not include an in situ selection device.

8. The method of claim 1, wherein each resistive change element in said plurality of resistive change elements is connected to a bit line of said plurality of bit lines and a word line of said plurality of word lines without any intervening devices.

9. The method of claim 1, wherein said set amount of current is set based on an amount of current flowing through said resistive change element when said resistive change element has a high resistive state and an amount of current flowing through said resistive change element when said resistive change element has a low resistive state.

10. The method of claim 9, wherein said set amount of current is an average of said amount of current flowing through said resistive change element when said resistive change element has said high resistive state and said amount of current flowing through said resistive change element when said resistive change element has said low resistive state.

11. A method for determining a resistive state of a resistive change element in a resistive change element array, said method comprising:

selecting a resistive change element from a plurality of resistive change elements in a resistive change element array, wherein each resistive change element is electrically connected to a bit line of a plurality of bit lines in said resistive change element array and a word line of a plurality of word lines in said resistive change element array;

setting a potential amount of current permitted to be supplied for determining a resistive state of said resistive change element;

supplying an amount of current for determining said resistive state of said resistive change element to said bit line electrically connected to said resistive change element, wherein said amount of current for determining said resistive state of said resistive change element is limited to a set amount of current, and wherein said amount of current for determining said resistive state of said resistive change element is regulated by said potential amount of current permitted to be supplied until said potential amount of current permitted to be supplied exceeds said set amount of current; and determining said resistive state of said resistive change element based on an amount of current flowing through said resistive change element and said amount of current for determining said resistive state of said resistive change element.

12. The method of claim 11, wherein said resistive state of said resistive change element is determined to be a low resistive state when said amount of current flowing through said resistive change element is greater than said amount of current for determining said resistive state of said resistive change element.

13. The method of claim 12, wherein said low resistive state corresponds to a logic 1.

14. The method of claim 11, wherein said resistive state of said resistive change element is determined to be a high resistive state when said amount of current flowing through said resistive change element is less than or equal to said amount of current for determining said resistive state of said resistive change element.

15. The method of claim 14, wherein said high resistive state corresponds to a logic 0.

16. The method of claim 11, wherein said resistive change element array comprises a plurality of resistive change element cells, and wherein each resistive change element cell includes one resistive change element of said plurality of resistive change elements.

17. The method of claim 16, wherein each resistive change element cell in said plurality of resistive change element cells does not include an in situ selection device.

18. The method of claim 11, wherein each resistive change element in said plurality of resistive change elements is connected to a bit line of said plurality of bit lines and a word line of said plurality of word lines without any intervening devices.

19. The method of claim 11, wherein said set amount of current is set based on an amount of current flowing through said resistive change element when said resistive change element has a high resistive state and an amount of current flowing through said resistive change element when said resistive change element has a low resistive state.

20. The method of claim 19, wherein said set amount of current is an average of said amount of current flowing through said resistive change element when said resistive change element has said high resistive state and said amount of current flowing through said resistive change element when said resistive change element has said low resistive state.

* * * * *